(12) United States Patent
Wang et al.

(10) Patent No.: US 9,461,110 B1
(45) Date of Patent: Oct. 4, 2016

(54) FETS AND METHODS OF FORMING FETS

(71) Applicant: Taiwan Semiconductor Manufacturing Company, Ltd., Hsin-Chu (TW)

(72) Inventors: Chih-Hao Wang, Baoshan Township (TW); Ching-Wei Tsai, Hsin-Chu (TW); Chi-Wen Liu, Hsin-Chu (TW); Kuo-Cheng Ching, Zhubei (TW); Jhon Jhy Liaw, Zhudong Township (TW); Wai-Yi Lien, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/700,202

(22) Filed: Apr. 30, 2015

(51) Int. Cl.
| | |
|---|---|
| *H01L 29/06* | (2006.01) |
| *H01L 29/66* | (2006.01) |
| *H01L 21/02* | (2006.01) |
| *H01L 21/762* | (2006.01) |
| *H01L 21/768* | (2006.01) |
| *H01L 29/78* | (2006.01) |

(52) U.S. Cl.
CPC ..... *H01L 29/0649* (2013.01); *H01L 21/02123* (2013.01); *H01L 21/02236* (2013.01); *H01L 21/02532* (2013.01); *H01L 21/76264* (2013.01); *H01L 21/76895* (2013.01); *H01L 29/0653* (2013.01); *H01L 29/66537* (2013.01); *H01L 29/66795* (2013.01); *H01L 29/785* (2013.01)

(58) Field of Classification Search
CPC ............ H01L 29/0649; H01L 29/66532; H01L 29/785; H01L 21/02123
See application file for complete search history.

(56) References Cited

U.S. PATENT DOCUMENTS

| | | | |
|---|---|---|---|
| 7,425,740 B2 | 9/2008 | Liu et al. | |
| 7,479,421 B2* | 1/2009 | Kavalieros | ...... H01L 21/823431 |
| | | | 257/E21.421 |
| 8,048,723 B2 | 11/2011 | Chang et al. | |
| 8,053,299 B2 | 11/2011 | Xu | |
| 8,106,459 B2* | 1/2012 | Chang | ............. H01L 21/823412 |
| | | | 257/328 |
| 8,124,483 B2* | 2/2012 | Schulz | ............. H01L 29/66795 |
| | | | 438/283 |
| 8,183,627 B2 | 5/2012 | Currie | |
| 8,263,446 B2* | 9/2012 | Cheng | ................. H01L 21/2633 |
| | | | 257/241 |
| 8,415,718 B2 | 4/2013 | Xu | |
| 8,492,235 B2* | 7/2013 | Toh | ................... H01L 29/66795 |
| | | | 257/E29.022 |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,652,932 B2* | 2/2014 | Adam | ............... H01L 29/66545 |
| | | | 438/424 |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |

(Continued)

*Primary Examiner* — William Coleman
(74) *Attorney, Agent, or Firm* — Slater Matsil, LLP

(57) ABSTRACT

An embodiment is a method including forming a fin on a substrate. The fin includes a first crystalline semiconductor material on a substrate and a second crystalline semiconductor material above the first crystalline semiconductor material. The method further includes converting at least a portion of the first crystalline semiconductor material and second crystalline semiconductor material in the fin to a dielectric material and removing at least a portion of the dielectric material. The method further includes forming a gate structure over the fin and forming source/drain regions on opposing sides of the gate structure.

20 Claims, 19 Drawing Sheets

(56) References Cited

U.S. PATENT DOCUMENTS

| | | |
|---|---|---|
| 8,815,712 B2 | 8/2014 | Wan et al. |
| 2009/0001415 A1* | 1/2009 | Lindert ............. H01L 29/66795 257/190 |
| 2013/0075818 A1* | 3/2013 | Lee ................. H01L 21/823431 257/347 |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2015/0162436 A1* | 6/2015 | Toh ....................... H01L 29/785 257/401 |
| 2015/0249153 A1* | 9/2015 | Morin ................... H01L 29/785 257/192 |

\* cited by examiner

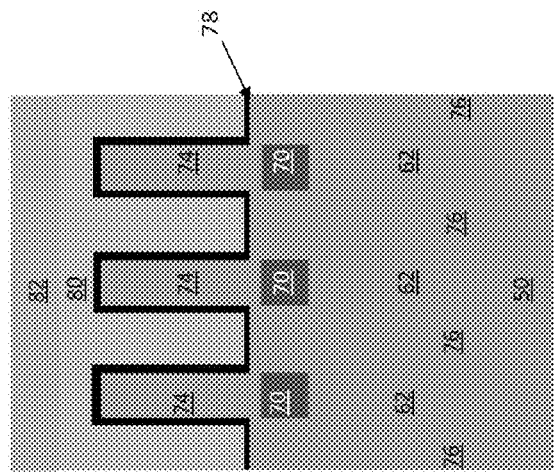
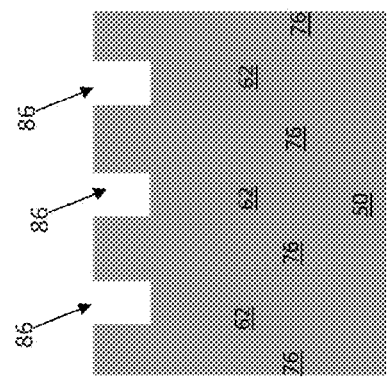
Figure 10B
Figure 10C
Figure 10A

FETS AND METHODS OF FORMING FETS

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides.

However, there are challenges to implementation of such features and processes in semiconductor fabrication. For example, poor isolation between adjacent fins causes high leakage current of the FinFET, thereby degrading the device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A-B, 5A-B, 6A-6B2, 7A-B, 8A-B, 9A-B, 10A-C, and 11A-C are cross-sectional views of intermediate stages in the manufacturing of FinFETs in accordance with some embodiments.

DETAILED DESCRIPTION

Figure 1:
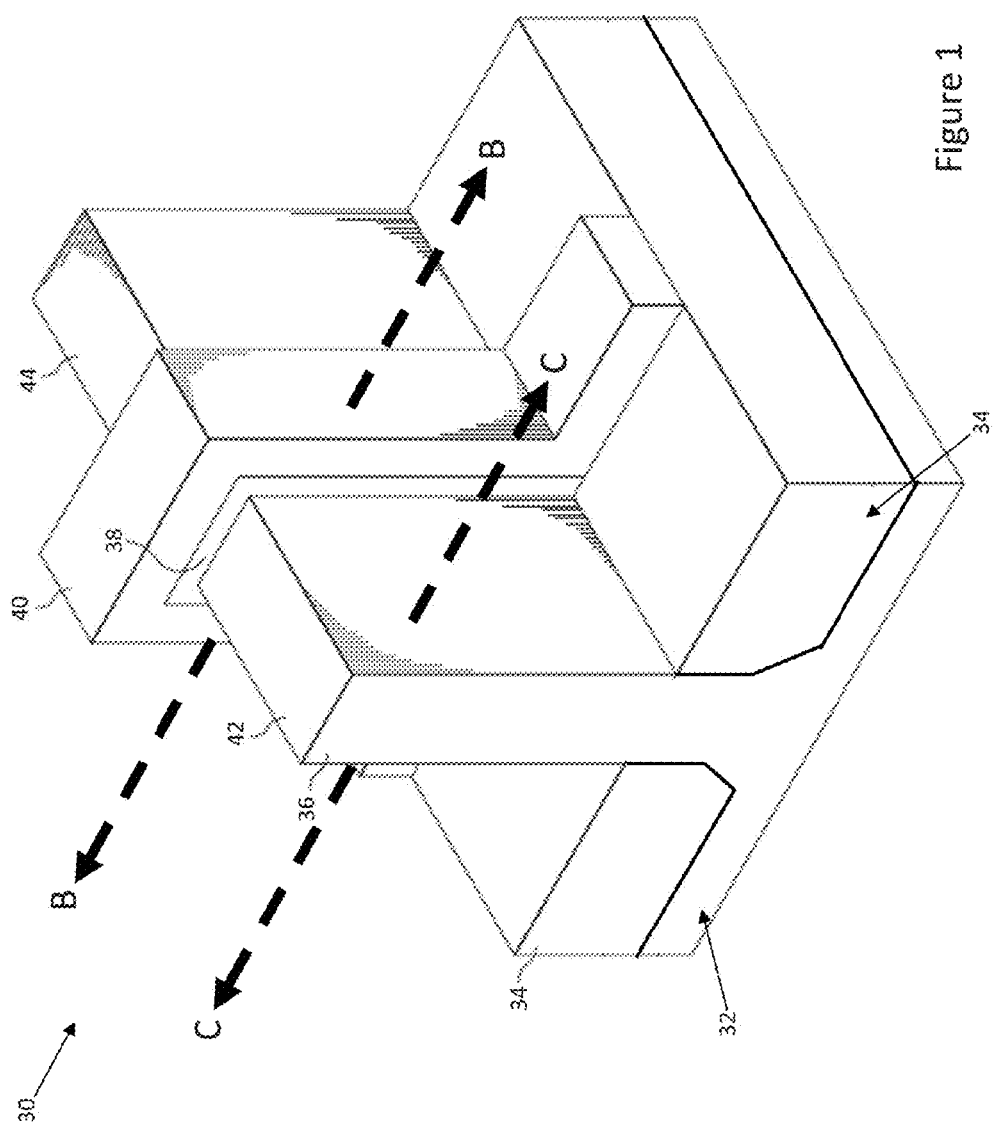
FIG. 1 is an example of a Fin Field-Effect Transistor (finFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last process. In other embodiments, a gate-first process may be used. Also, some embodiments contemplate aspects used in planar devices, such as planar FETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to provide a simple and cost-effective process flow to achieve an undoped channel in a FinFET for device enhancement. In addition, this simple and cost-effective process flow may achieve a channel on insulator scheme (sometimes referred to as a channel on oxide). In particular, embodiments such as those disclosed below include a directional oxidation step of the fins to allow the fins to have sidewalls that are more perpendicular to the major surface of the substrate while also controlling the amount of germanium residue in the insulating layer below the channel. This control of the germanium residue may increase the reliability of the FinFET device as the residual germanium can diffuse into the gate structure which may reduce the reliability of the FinFET device. Further, the epitaxial portions of the fins are epitaxially grown as blanket layers which have fewer defects and are generally a higher quality semiconductor structure than structures epitaxially grown in trenches/recesses.

FIG. 1 illustrates an example of a FinFET 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section B-B is across a channel, gate dielectric 38, and gate electrode 40 of the finFET 30. Cross-section C-C is parallel to cross-section A-A and is across a source/drain region 42. Subsequent figures refer to these reference cross-sections for clarity.

Figure 11B:
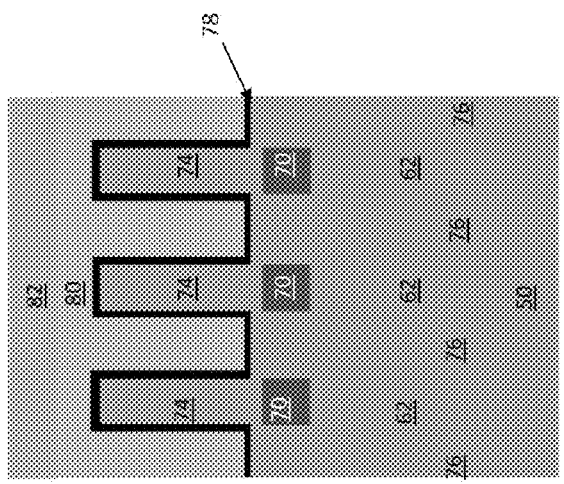
Figure 11C:
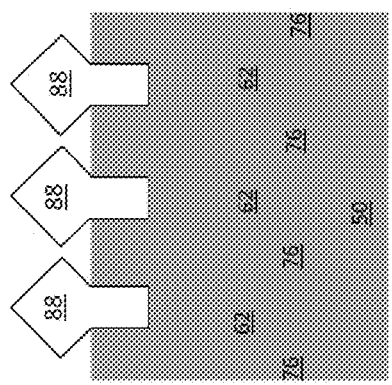
Figure 11A:
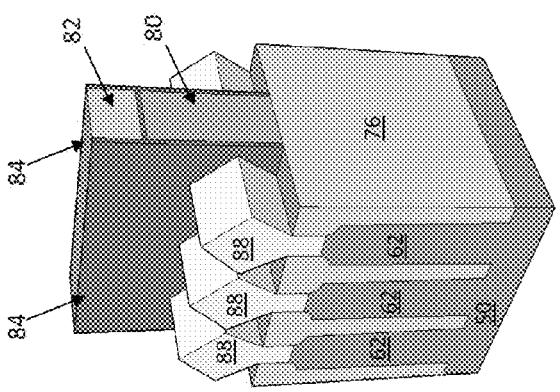
Figure 12:
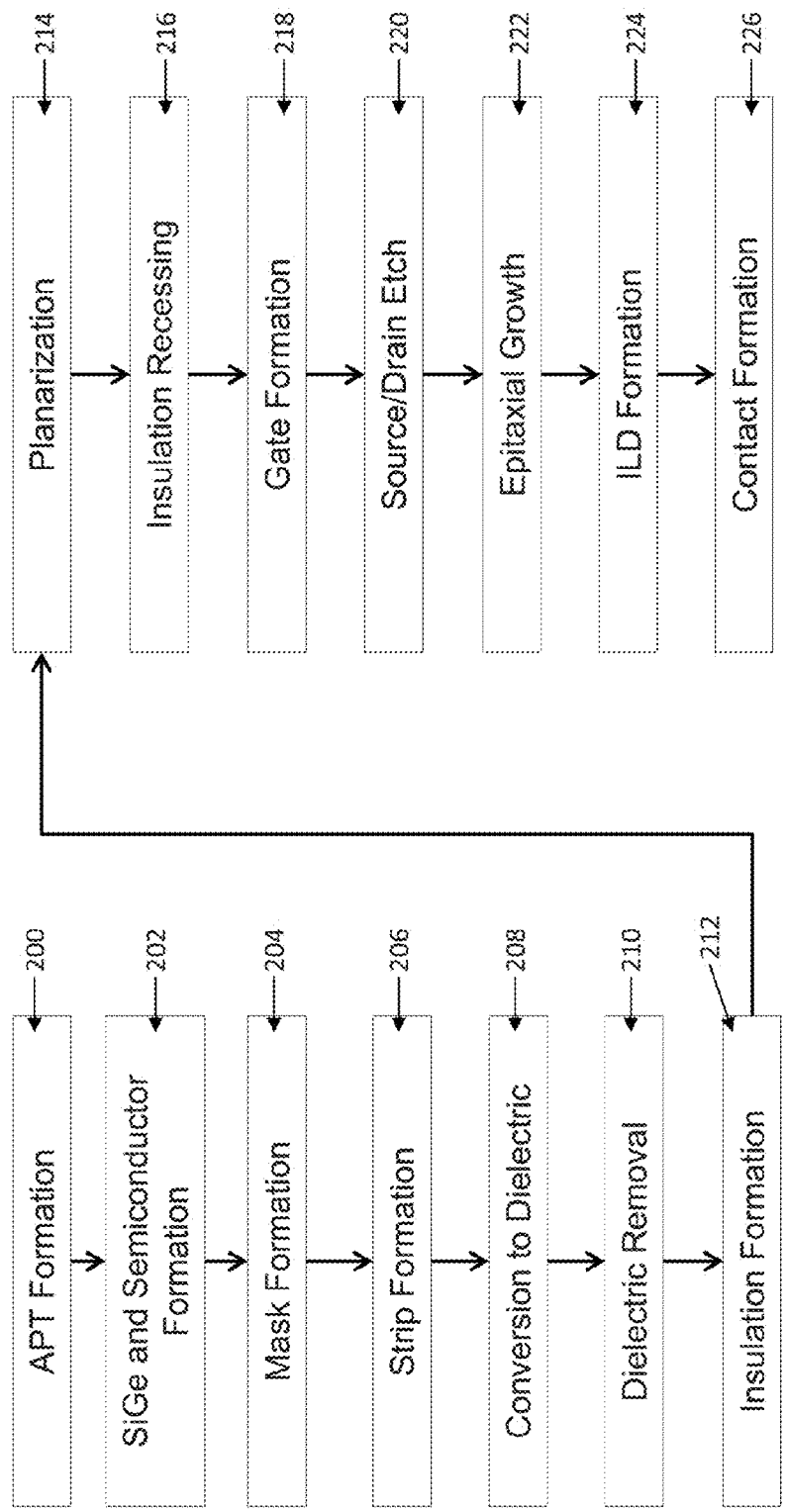
FIG. 12 is a process flow of a process in accordance with some embodiments.

FIGS. 2 through 11C are cross-sectional views of intermediate stages in the manufacturing of FinFETs in accordance with an exemplary embodiment, and FIG. 12 is a process flow of the process shown in FIGS. 2 through 11C. FIGS. 2 through 11C illustrate a FinFET similar to FinFET 30 in FIG. 1, except for multiple FinFETs. In FIGS. 4A through 11C, figures ending with an "A" designation are three-dimensional views; figures ending with a "B" designation illustrate cross-section B-B; and figures ending with a "C" designation illustrate cross-section C-C.

Figure 2:
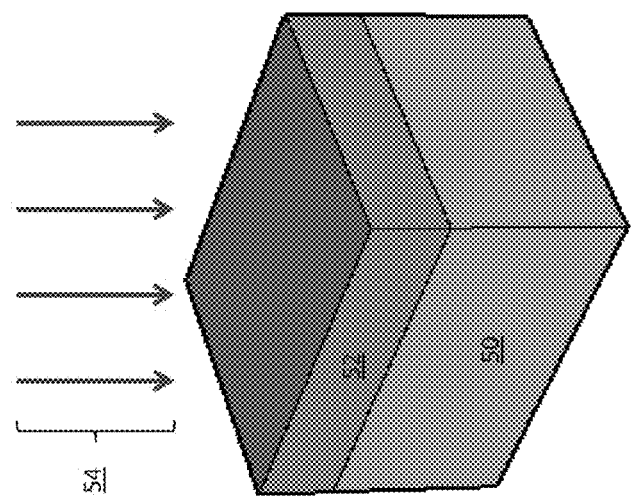

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

FIG. 2 illustrates the formation of an anti-punch through (APT) region 52 in the substrate 50 (step 200). In some embodiments, the APT region 52 is formed with an implantation step 54 performed on a top portion of the substrate 50. The conductivity type of the dopants implanted in the APT is the same as that of the well region (not shown) of the substrate 50. The APT region 52 extends under the subsequently formed source/drain regions 88 (FIGS. 11A and 11C), and is used to reduce the leakage from source/drain regions 88 to substrate 50. The doping concentration in APT region 52 may be in the range from about $1E18/cm^3$ to about $1E19/cm^3$.

Figure 3:
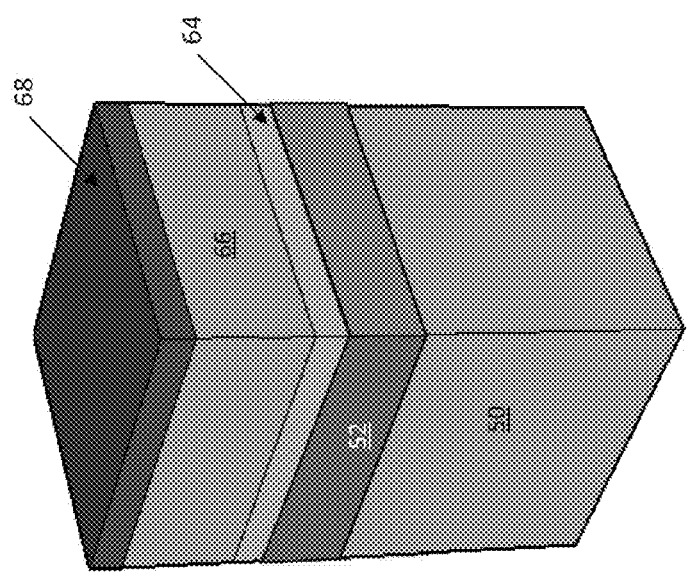

FIG. 3 illustrates the formation of a silicon germanium (SiGe) layer 64 (e.g. a blanket layer) on the substrate 50 and the APT region 52 and a semiconductor layer 66 (e.g. a blanket layer) on the SiGe layer 64 (step 202). In some embodiments, the SiGe layer 64 and the semiconductor layer 66 are formed by epitaxial processes and are crystalline layers. In some embodiments, the SiGe layer 64 is formed to have a thickness in a range from about 5 nm to about 15 nm. The germanium percentage (atomic percentage) of SiGe layer 64 after formation is in the range from about 15 percent to about 35 percent, while higher or lower germanium percentages may be used. It is appreciated, however, that the values recited throughout the description are examples, and may be changed to different values.

The semiconductor layer 66 formed over the SiGe layer 64 may include one or more semiconductor layers. In some embodiments, the semiconductor layer 66 is a pure silicon layer that contains no germanium. In some embodiments, the semiconductor layer 66 may be a substantially pure silicon layer that, for example, contains less than about 1 percent of germanium. The semiconductor layer 66 may be an intrinsic layer and may not be doped with p-type and n-type dopants.

FIG. 3 further illustrates the formation of a mask layer 68 over the semiconductor layer 66 (step 204). In some embodiments, the mask layer 68 is a hard mask and may be referred to as hard mask 68 hereinafter. The hard mask 68 may be formed of silicon nitride, silicon oxynitride, silicon carbide, silicon carbonitride, the like, or a combination thereof. For clarity, in subsequent drawings, the APT region 52 is not illustrated.

Figure 4B:
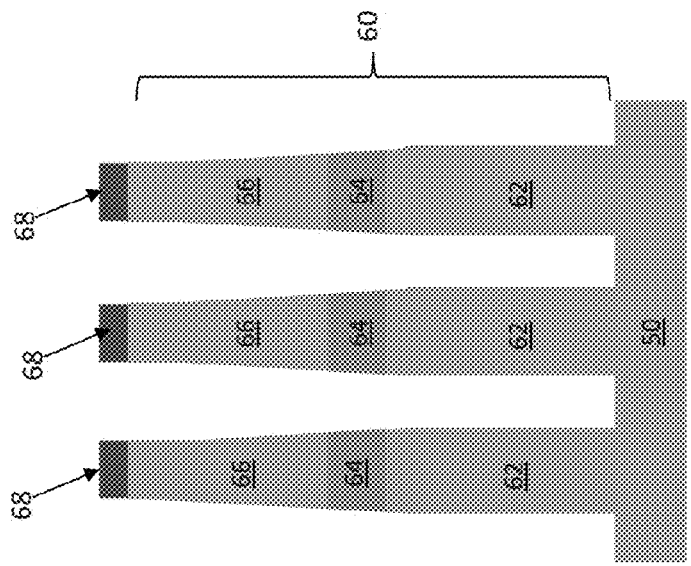
Figure 4A:
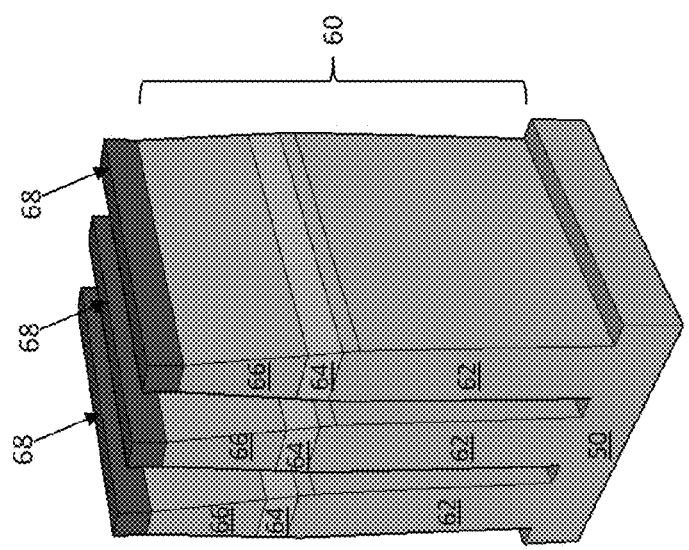

FIGS. 4A and 4B illustrate the formation of semiconductor strips 60 (step 206). In some embodiments, the semiconductor strips 60 may be formed by etching trenches in the hard mask 68, the semiconductor layer 66, the SiGe layer 64, and the substrate 50. The patterned portions of the substrate 50 are referred to as patterned substrate 62 as illustrated in FIGS. 4A and 4B. The patterned portions of the semiconductor layer 66, the SiGe layer 64, and the patterned substrate 62 collectively make up the semiconductor strips 60. The semiconductor strips 60 may also be referred to as semiconductor fins 60. The etching may be any acceptable etch process, such as a reactive ion etch (RIE), neutral beam etch (NBE), the like, or a combination thereof. The etch may be anisotropic.

Figure 5B:
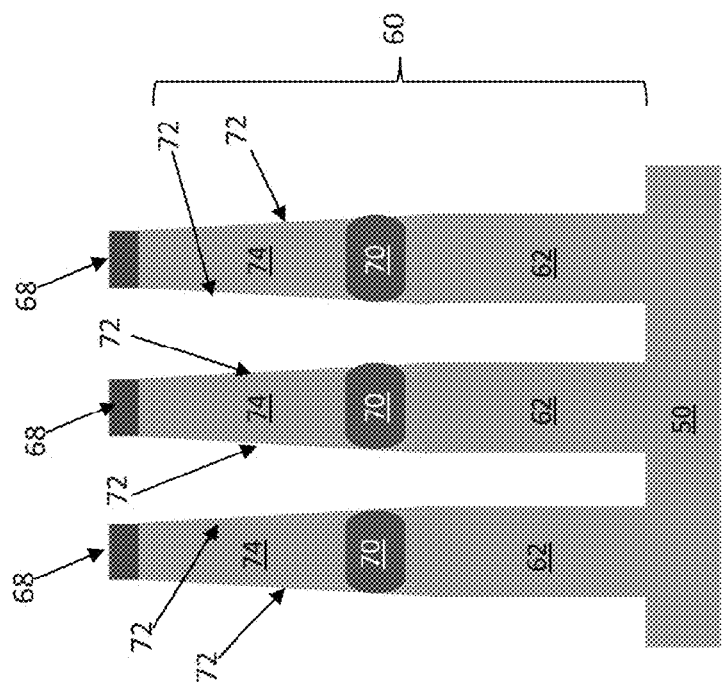
Figure 5A:
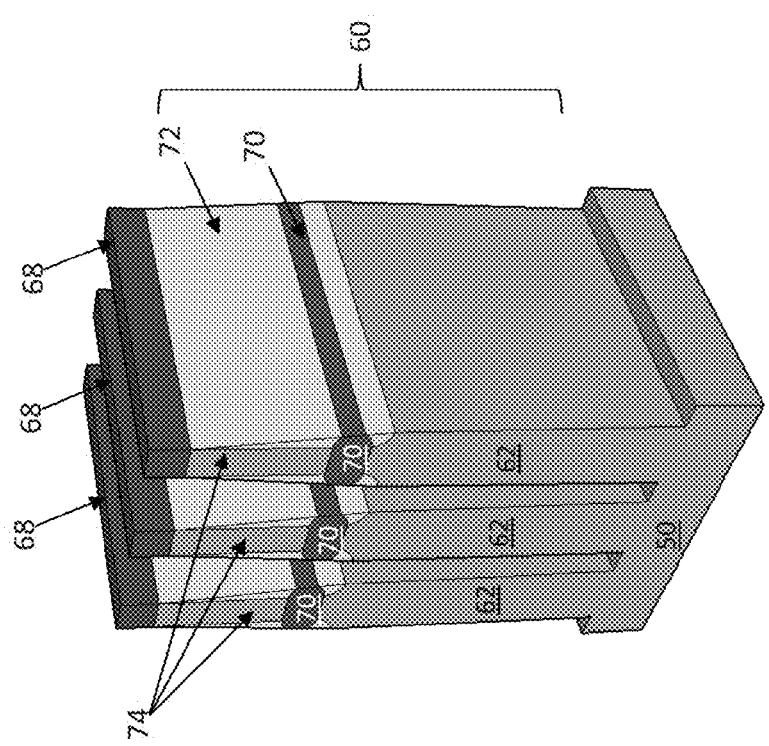
Figure 6A:
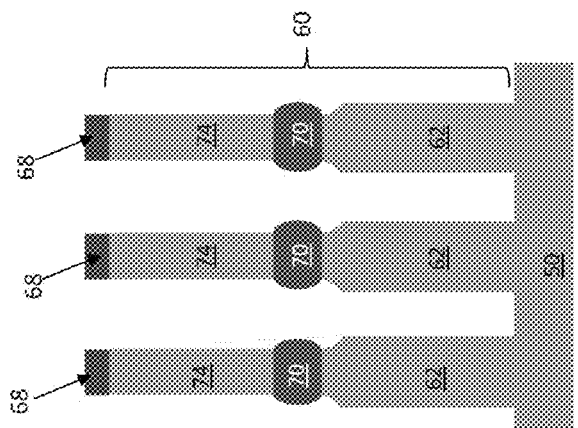
Figure 6A:
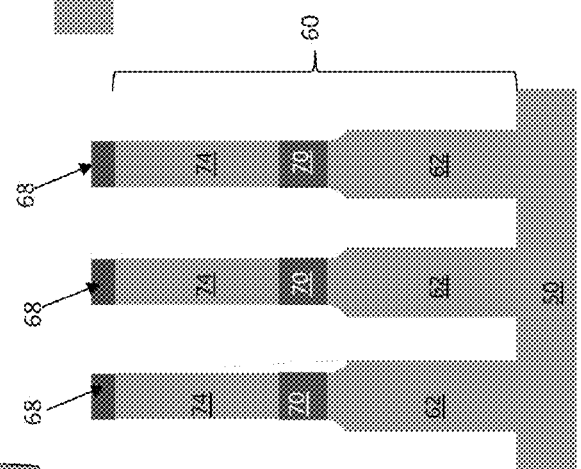
Figure 6A:
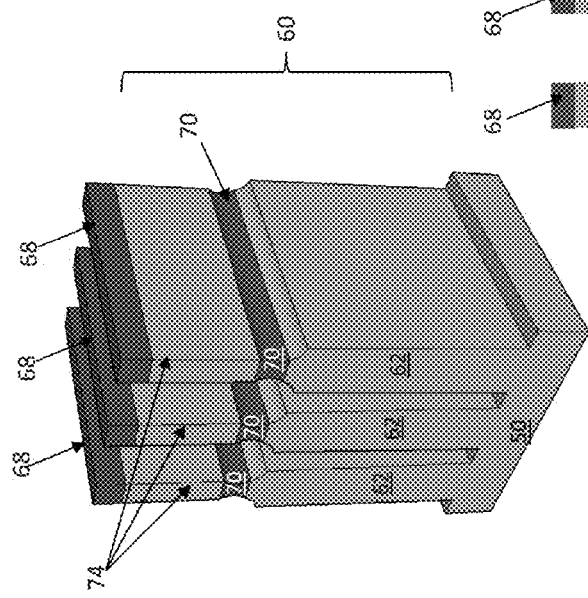

In FIGS. 5A and 5B, portions of the semiconductor strips 60 are converted to a dielectric material (step 208). In some embodiments, the conversion process is an oxidation process. The oxidation process may use a steam furnace. For example, the substrate 50 including the semiconductor strips 60 may be placed in a furnace such that the substrate 50 is exposed to a steam environment. The steam environment may be generated at a temperature in a range from about 400° C. to about 600° C., such as about 500° C. Water ($H_2O$) steam may be provided flowing at a flow rate in a range from about 100 sccm to about 1000 sccm. The substrate 50 may be exposed to the steam environment in the furnace for a duration in a range from about 0.5 hour to about 3 hour, such as about 1 hour. As illustrated in FIGS. 5A and 5B, outer portions of the semiconductor layer 66 may be converted into dielectric material regions 72 leaving the remaining semiconductor layer 74. In addition, the SiGe layer 64 may be fully converted into SiGe dielectric regions 70. In some embodiments, the SiGe dielectric regions 70 may be formed of SiGeO. Other conversion processes may be used.

The oxidation of silicon in silicon germanium is easier than the oxidation of germanium in the same silicon germanium region. Accordingly, the silicon atoms in SiGe dielectric regions 70 are oxidized, and the germanium atoms in the SiGe dielectric regions 70 may diffuse inwardly toward the centers of the SiGe dielectric regions 70, and hence the germanium percentage in the centers of the SiGe dielectric regions 70 is increased as compared to before the oxidation.

In some embodiments, the dielectric material regions 72 increase in thickness moving from the top of the semiconductor strips 60 (near the hard mask 68) towards the bottom of the semiconductor strips 60 (see FIGS. 5A and 5B). In these embodiments, the conversion process may be a directional conversion process such as a directional oxidation process using the hard mask 68 as an oxidation mask. An example of a directional oxidation process is gas cluster ion beam oxidation.

In FIGS. 6A, 6B1, and 6B2, the dielectric material regions 72 and optionally portions of the SiGe dielectric regions 70 are removed (step 210). The removal of the dielectric material regions 72 makes the sidewalls of the semiconductor layer 74 more perpendicular to a major surface of the substrate 50 and may enhance the performance and control of the FinFET devices. The dielectric material regions 72 may be removed by an etch process. The etching may be any acceptable etch process, such as a wet etch process, a dry etch process, the like, or a combination thereof. The etch may be isotropic or anisotropic. In the embodiment illustrated in FIG. 6B1, the etch process is selective to the SiGe dielectric regions 70, the semiconductor layer 74, and the patterned substrate 62 such that the SiGe dielectric regions 70 are not substantially etched. In the embodiment illustrated in FIG. 6B2, the SiGe dielectric regions 70 are also etched to have sidewalls that are coterminous with the sidewalls of the semiconductor layers 74.

Figure 7B:
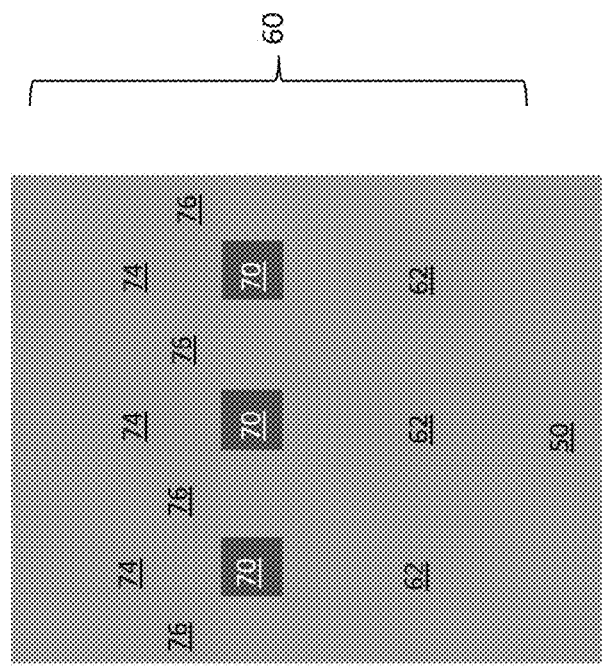
Figure 7A:
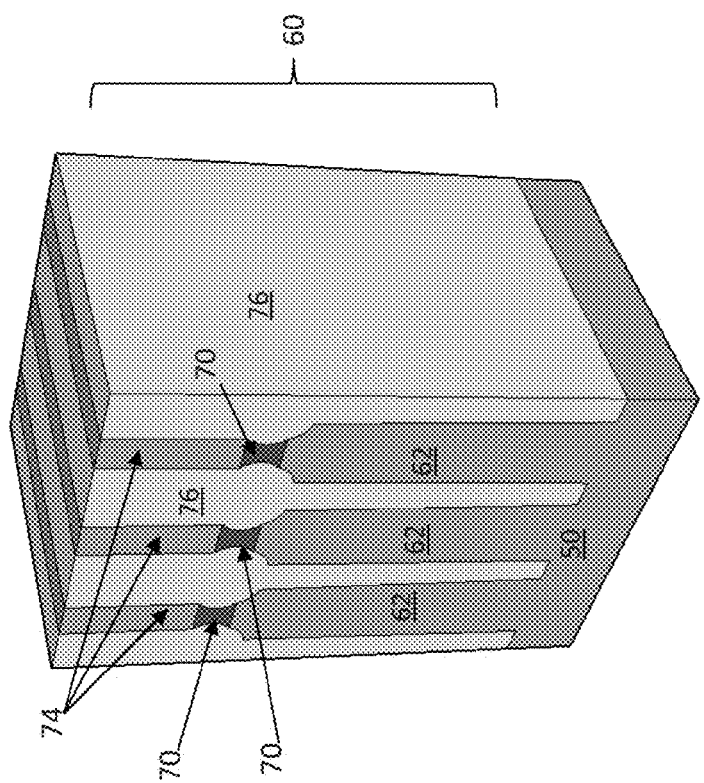

FIGS. 7A and 7B illustrated the formation of an insulation material between neighboring semiconductor strips 60 to form isolation regions 76 (step 212). The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. Further in FIGS. 7A and 7B, a planarization process, such as a chemical mechanical polish (CMP), may remove any excess insulation material and form top surfaces of the isolation regions 76 and top surfaces of the semiconductor strips 60 that are coplanar (step 214).

Figure 8B:
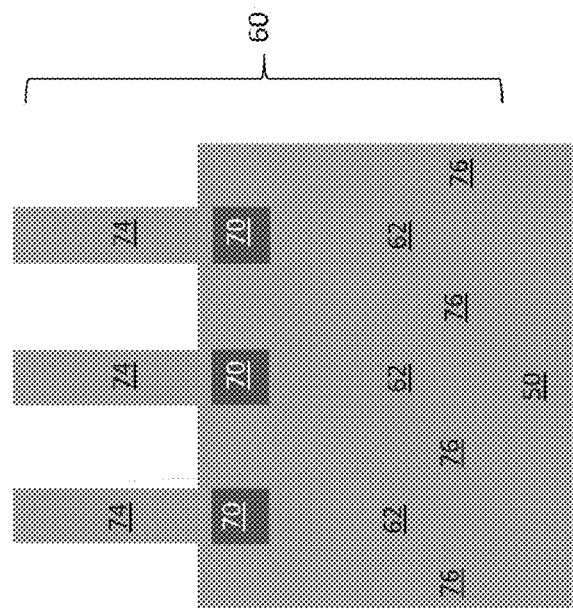
Figure 8A:
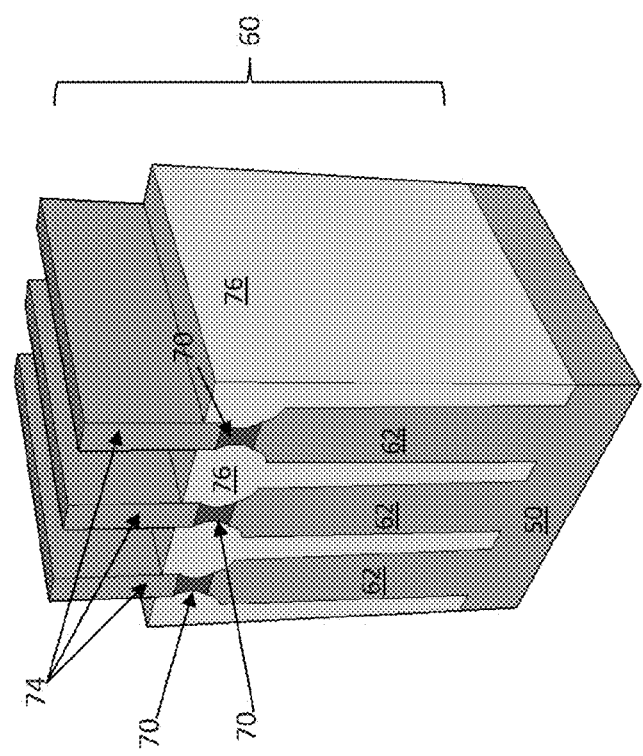

FIGS. 8A and 8B illustrate the recessing of the isolation regions 76 (step 216), such as to form shallow trench isolation (STI) regions. The isolation regions 76 are recessed such that the semiconductor layers 74 of the semiconductor strips 60 protrude from between neighboring isolation regions 76 and form semiconductor fins. The semiconductor layers 74 may be referred to as semiconductor fins 74 hereinafter. As illustrated, the top surfaces of the isolation regions 76 are above top surfaces of the SiGe dielectric regions 70. In other embodiments, the top surfaces of the isolation regions 76 may be below top surfaces and above bottom surfaces of the SiGe dielectric regions 70, or the top surfaces of the isolation regions 76 may be below bottom surfaces of the SiGe dielectric regions 70. Further, the top surfaces of the isolation regions 76 may have a flat surface as illustrated, a convex surface, a concave surface (such as dishing), or a combination thereof. The top surfaces of the isolation regions 76 may be formed flat, convex, and/or concave by an appropriate etch. The isolation regions 76 may be recessed using an acceptable etching process, such as one that is selective to the material of the isolation regions 76. For example, a chemical oxide removal using a CERTAS® etch or an Applied Materials SICONI tool or dilute hydrofluoric (dHF) acid may be used.

Figure 9B:
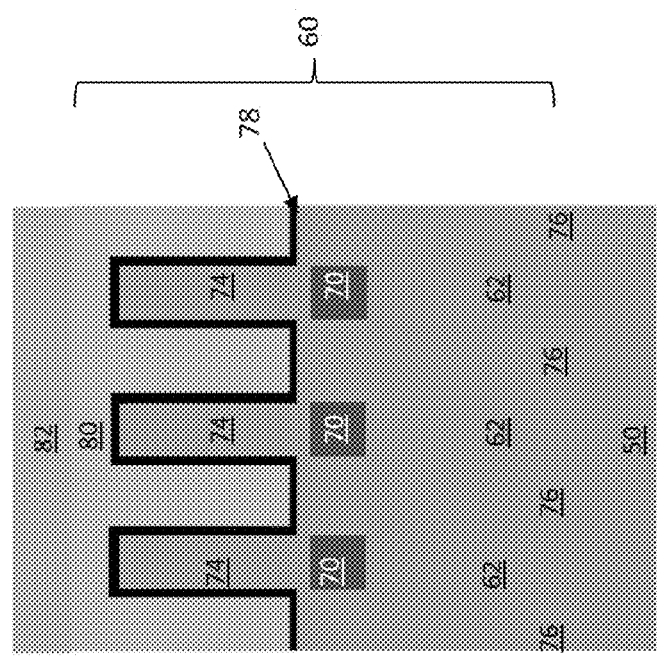
Figure 9A:
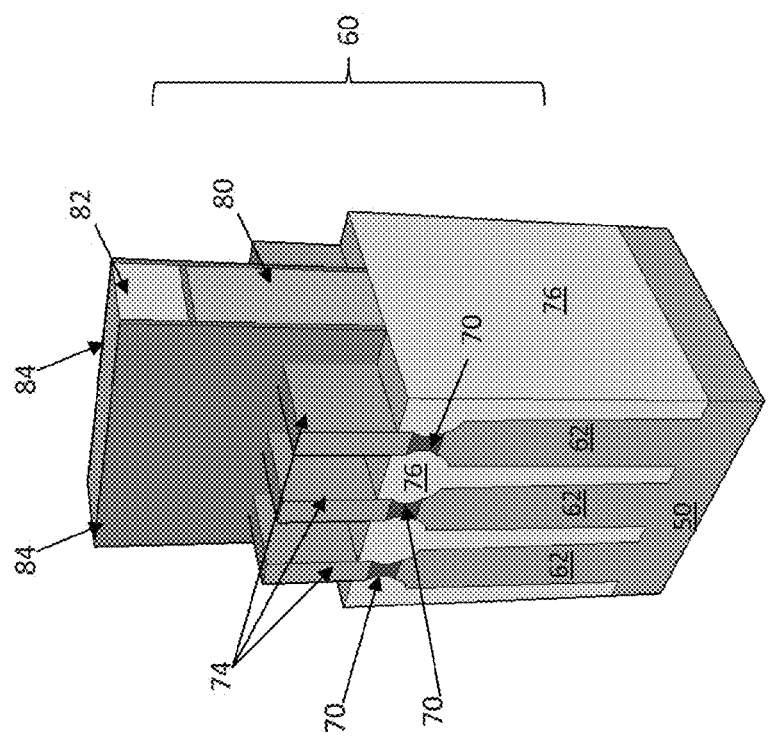

FIGS. 9A and 9B illustrate the formation of a gate structure over the semiconductor fins 74 (step 218). A dielectric layer (not shown) is formed on the semiconductor fins 74 and the isolation regions 76. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), plasma-enhanced CVD (PECVD), and the like.

A gate layer (not shown) is formed over the dielectric layer, and a mask layer (not shown) is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers are formed, the mask layer may be patterned using acceptable photolithography and etching techniques to form mask 82. The pattern of the mask 82 then may be transferred to the gate layer and dielectric layer by an acceptable etching technique to form gate 80 and gate dielectric 78. The gate 80 and gate dielectric 78 cover respective channel regions of the semiconductor fins 74. The gate 80 may also have a lengthwise direction substantially perpendicular to the lengthwise direction of respective semiconductor fins 74.

After the gate 80 and the gate dielectric 78 are formed, gate seal spacers 84 can be formed on exposed surfaces of gate 80 and mask 82. A thermal oxidation or a deposition followed by an anisotropic etch may form the gate seal spacers 84.

Figure 10A:
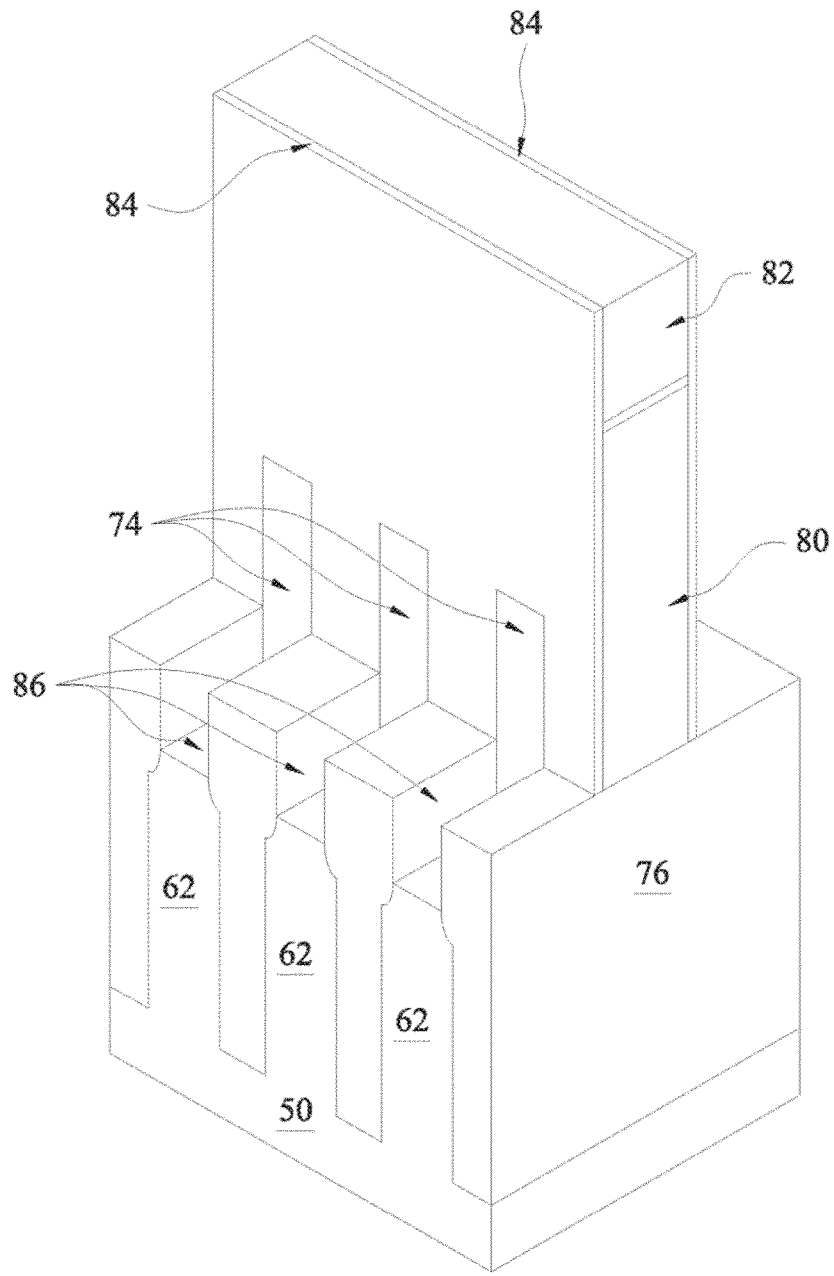
Figure 10B:
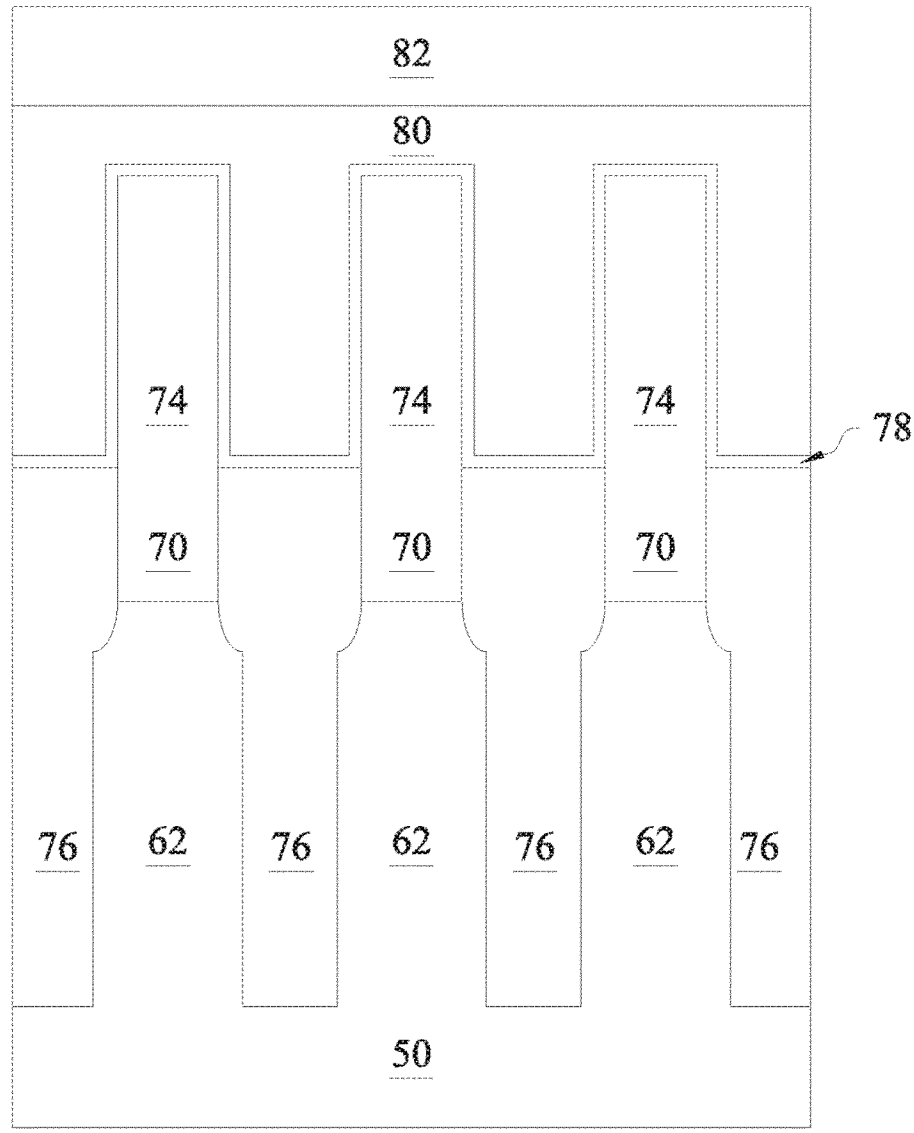
Figure 10C:
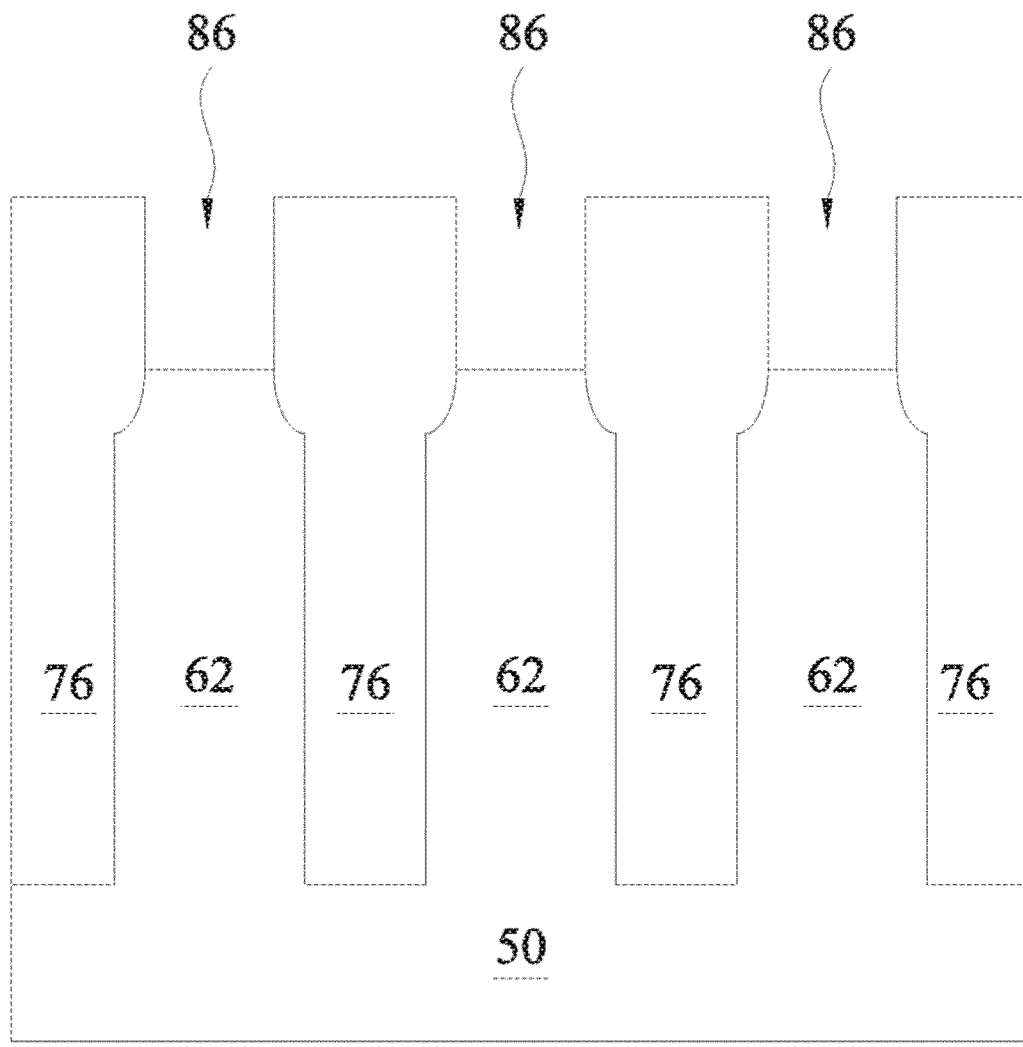
Figure 11A:
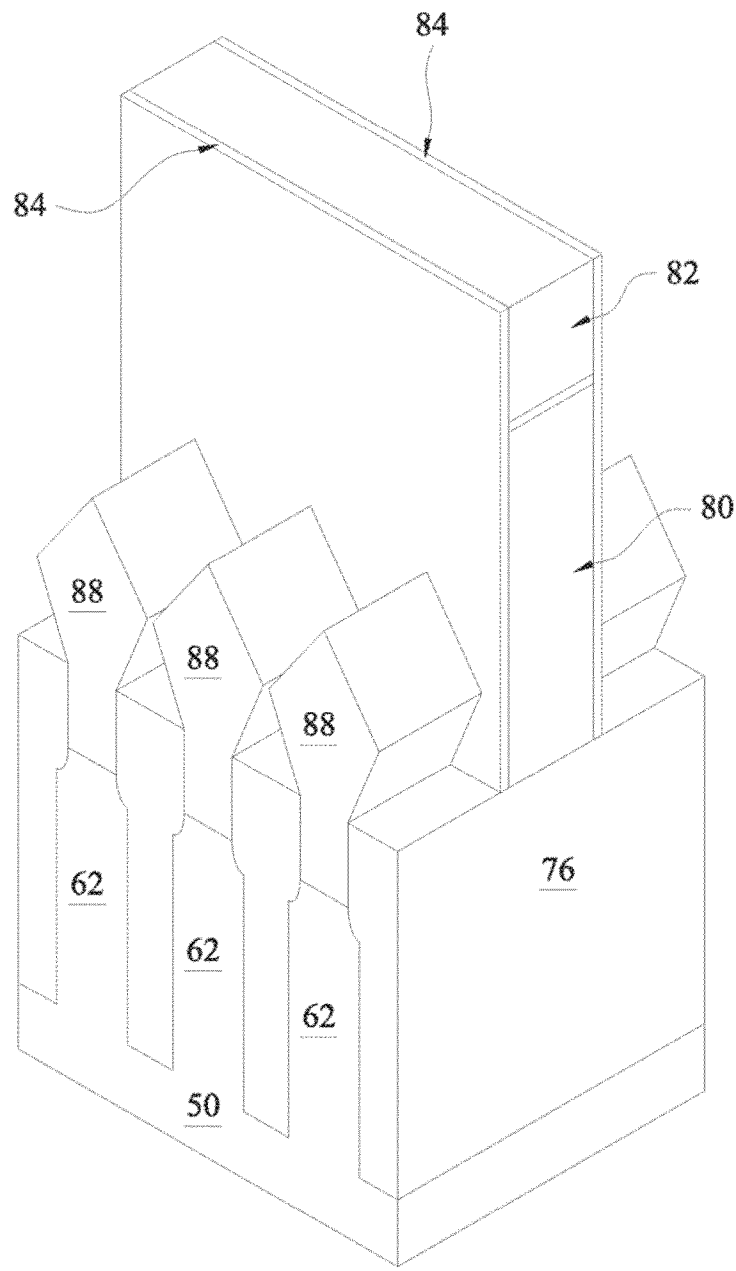
Figure 11B:
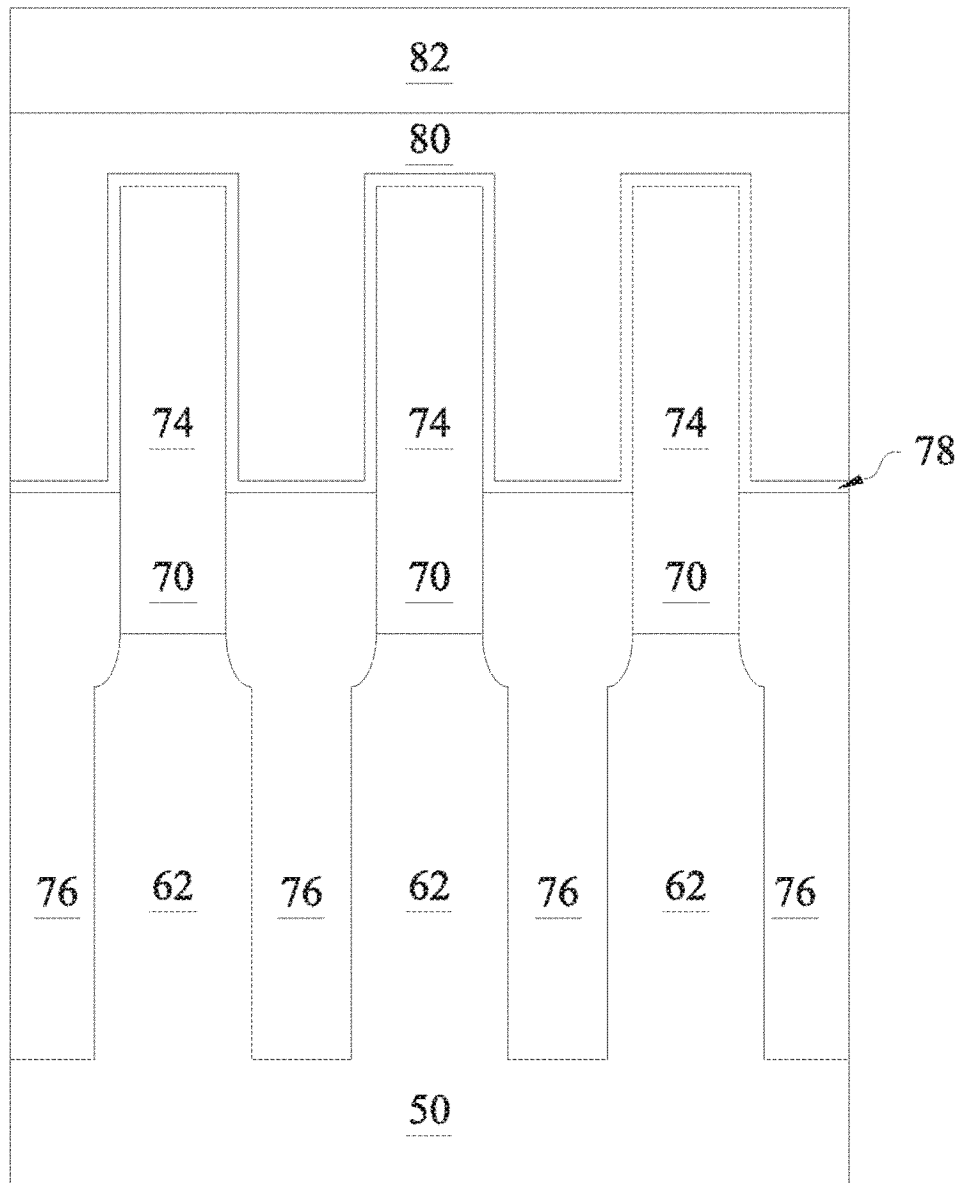
Figure 11C:
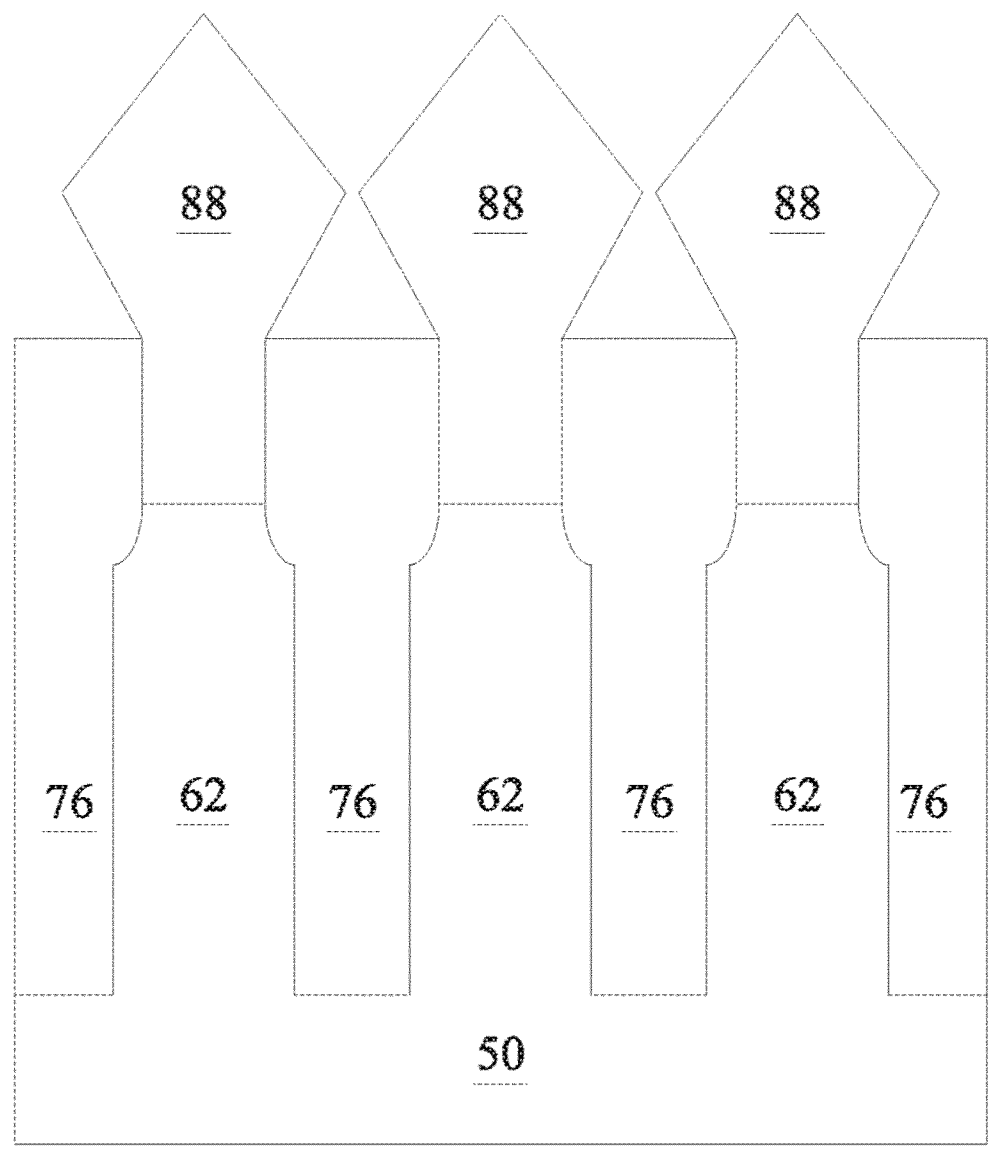
Figure 12:
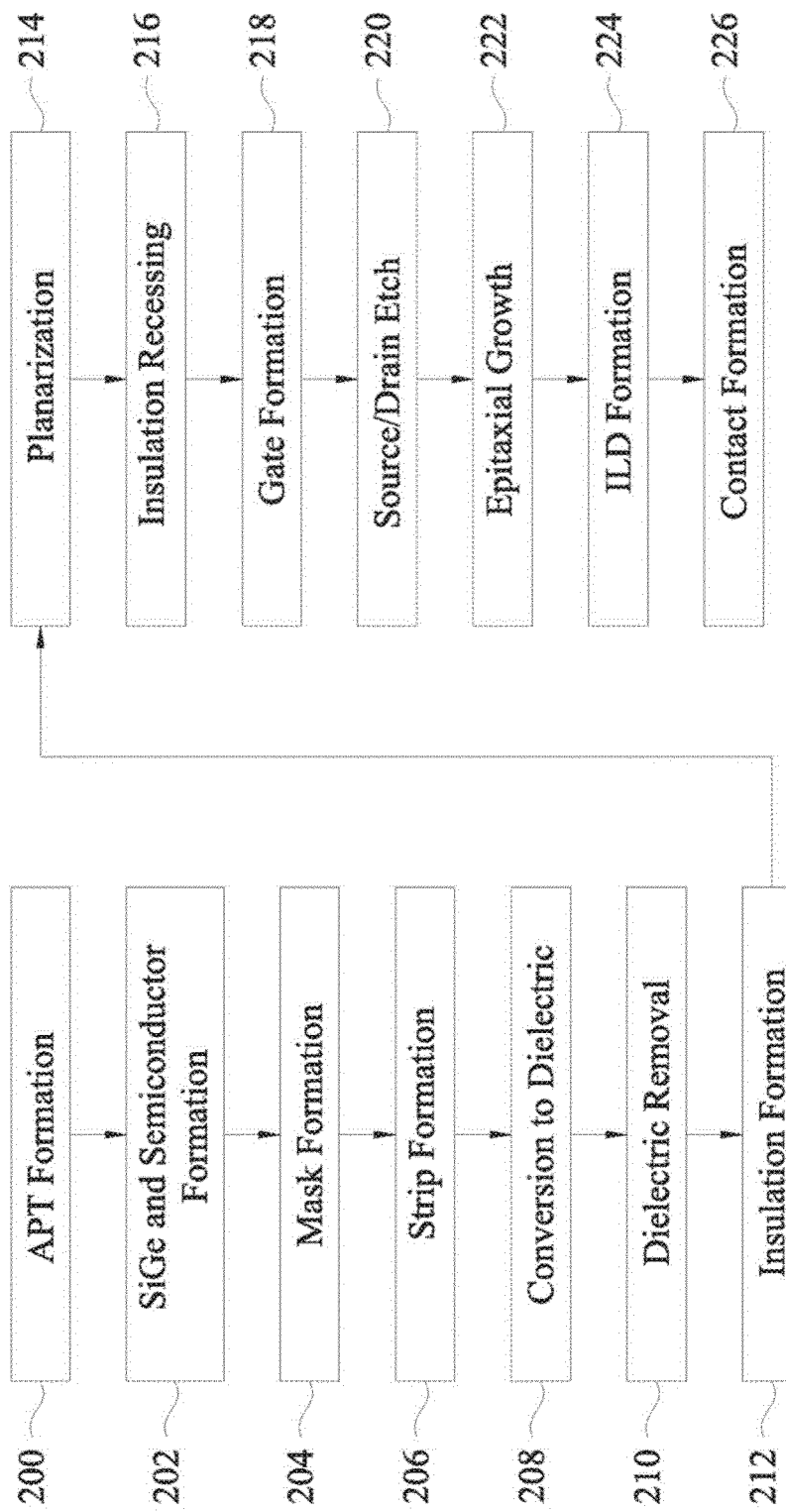
Figure 13A:
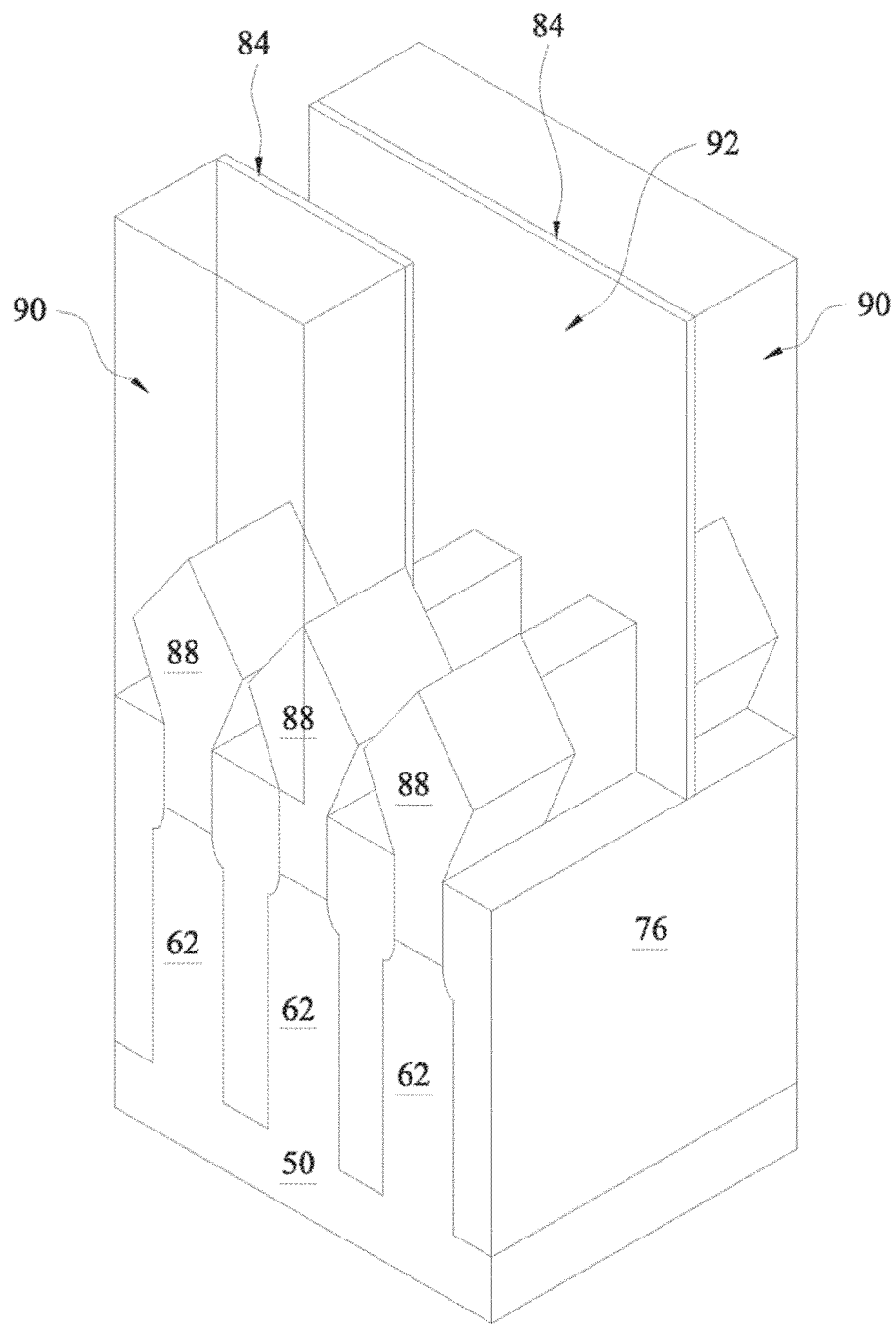
Figure 13B:
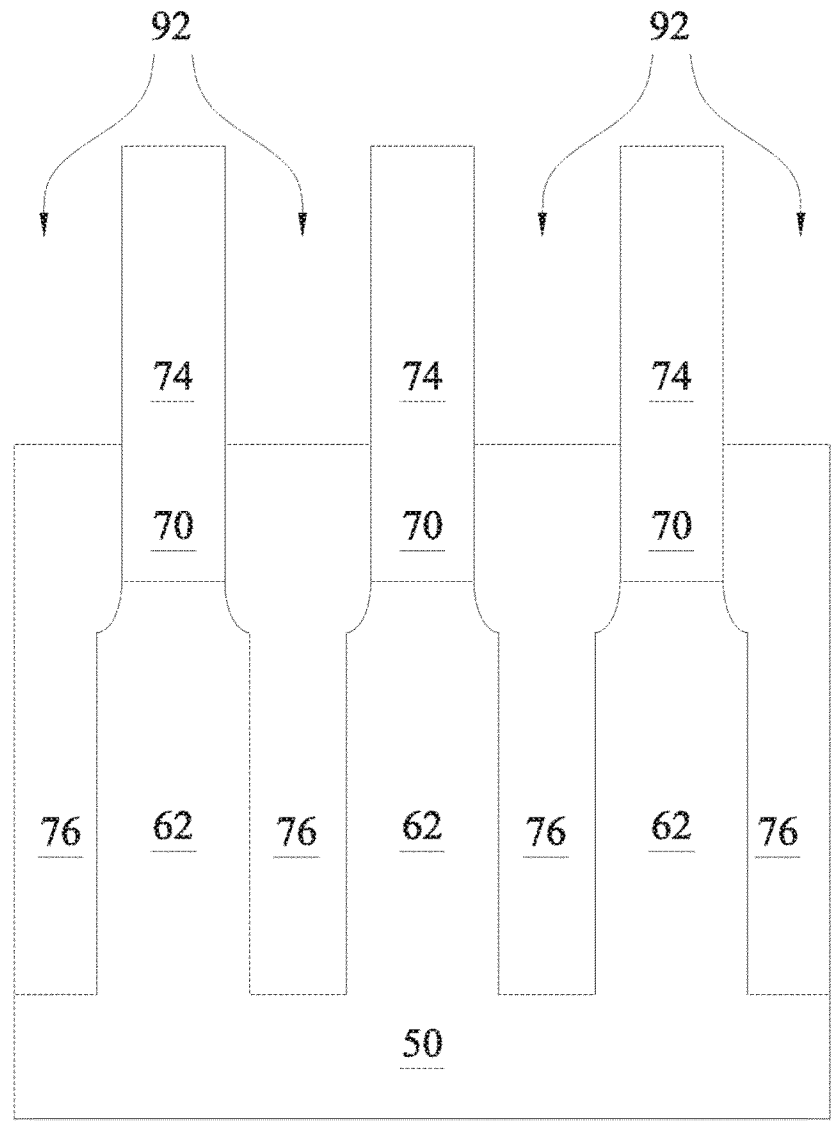
Figure 13C:
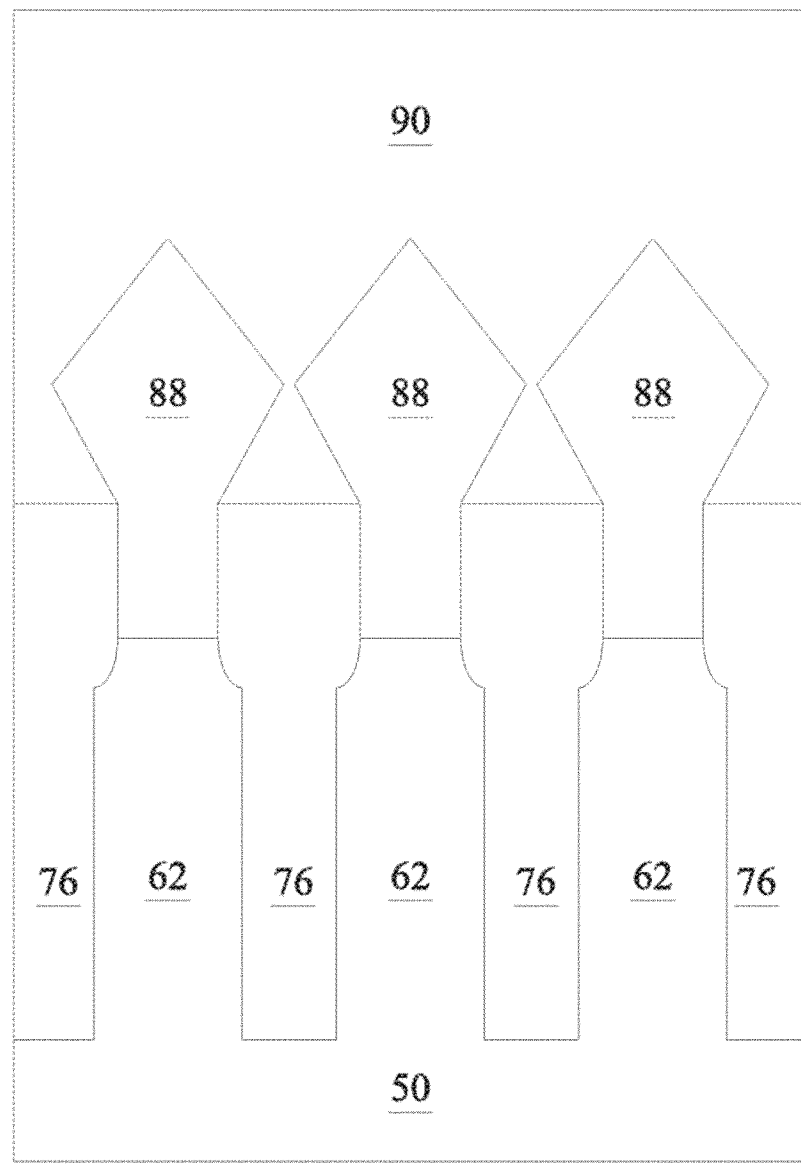
Figure 14A:
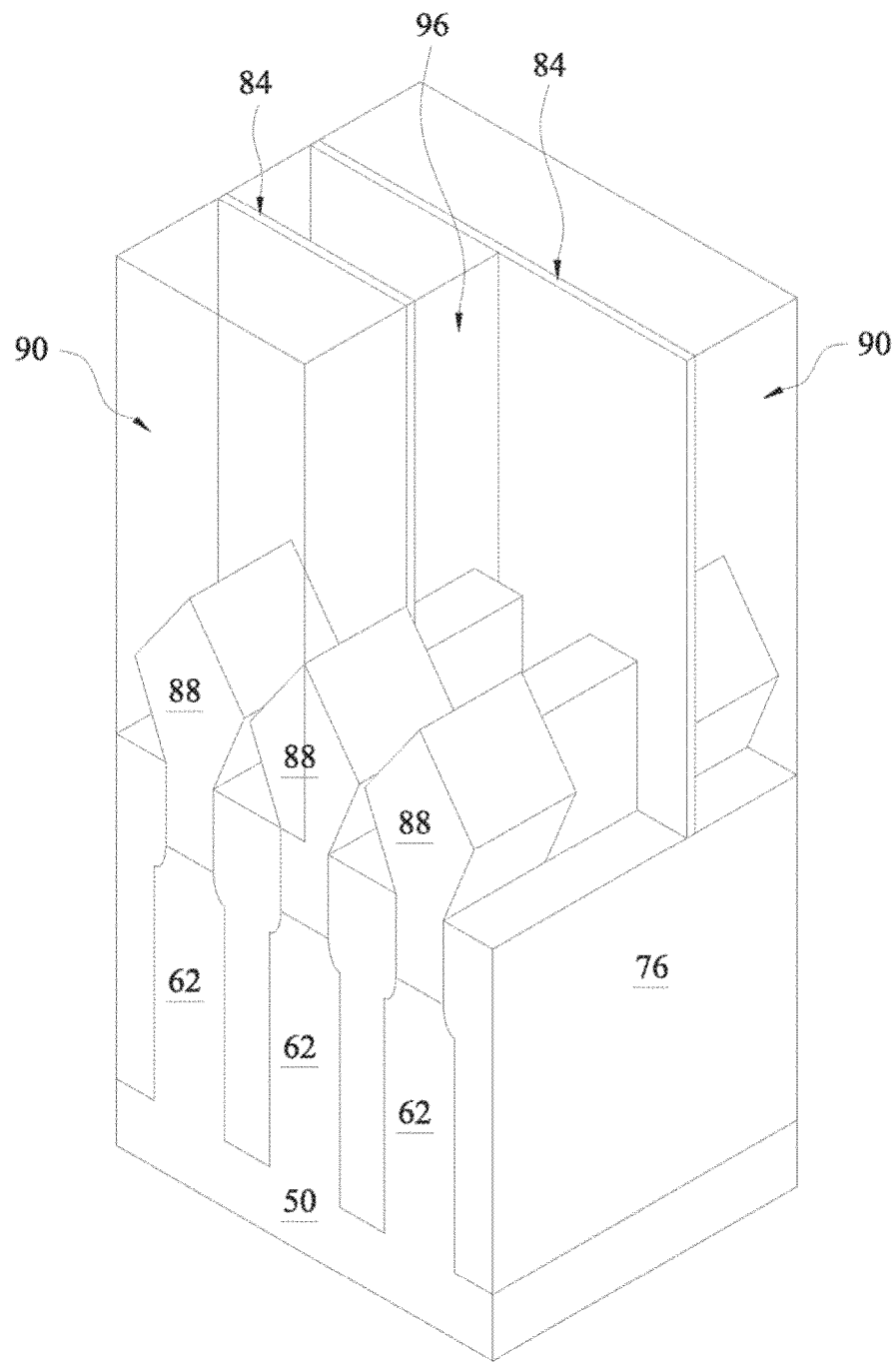
Figure 14B:
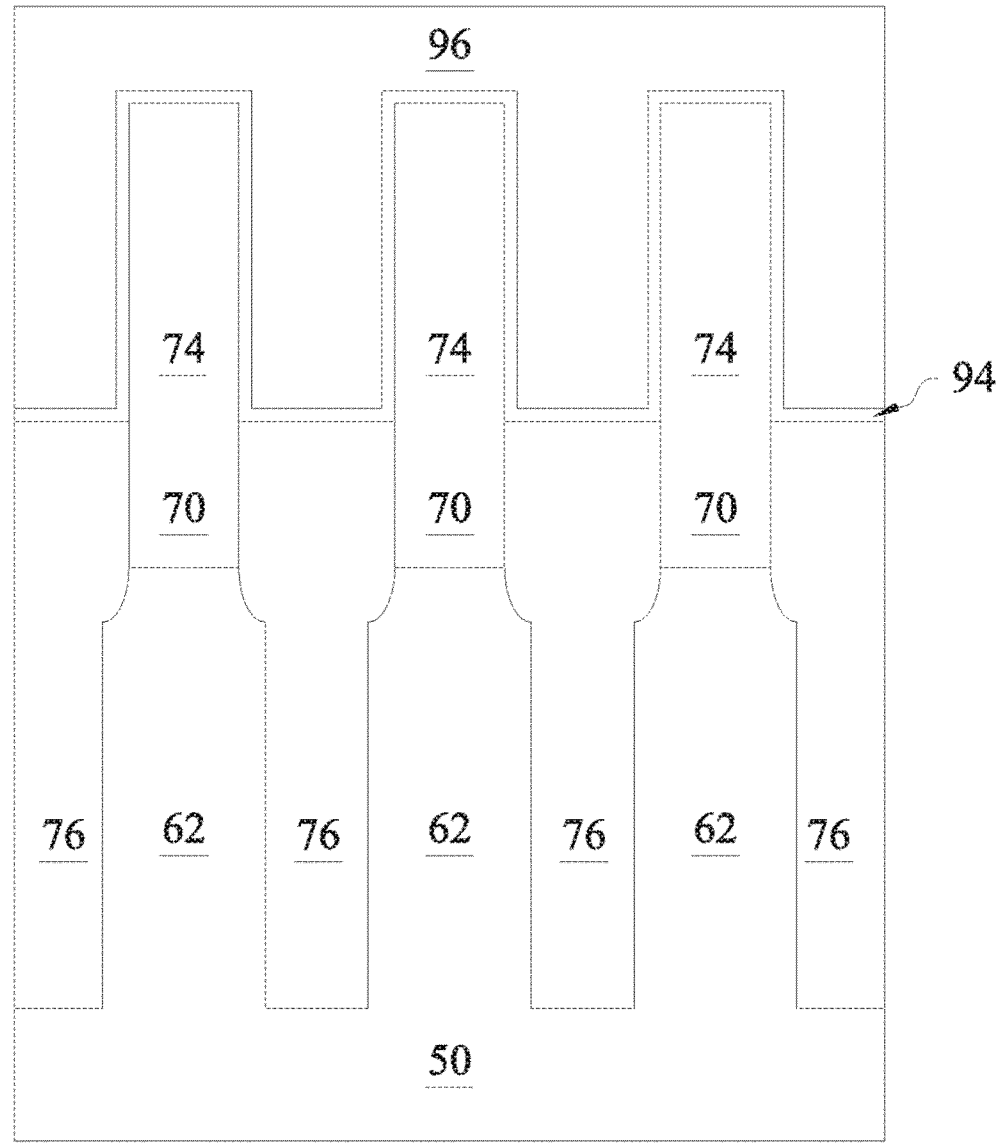
Figure 14C:
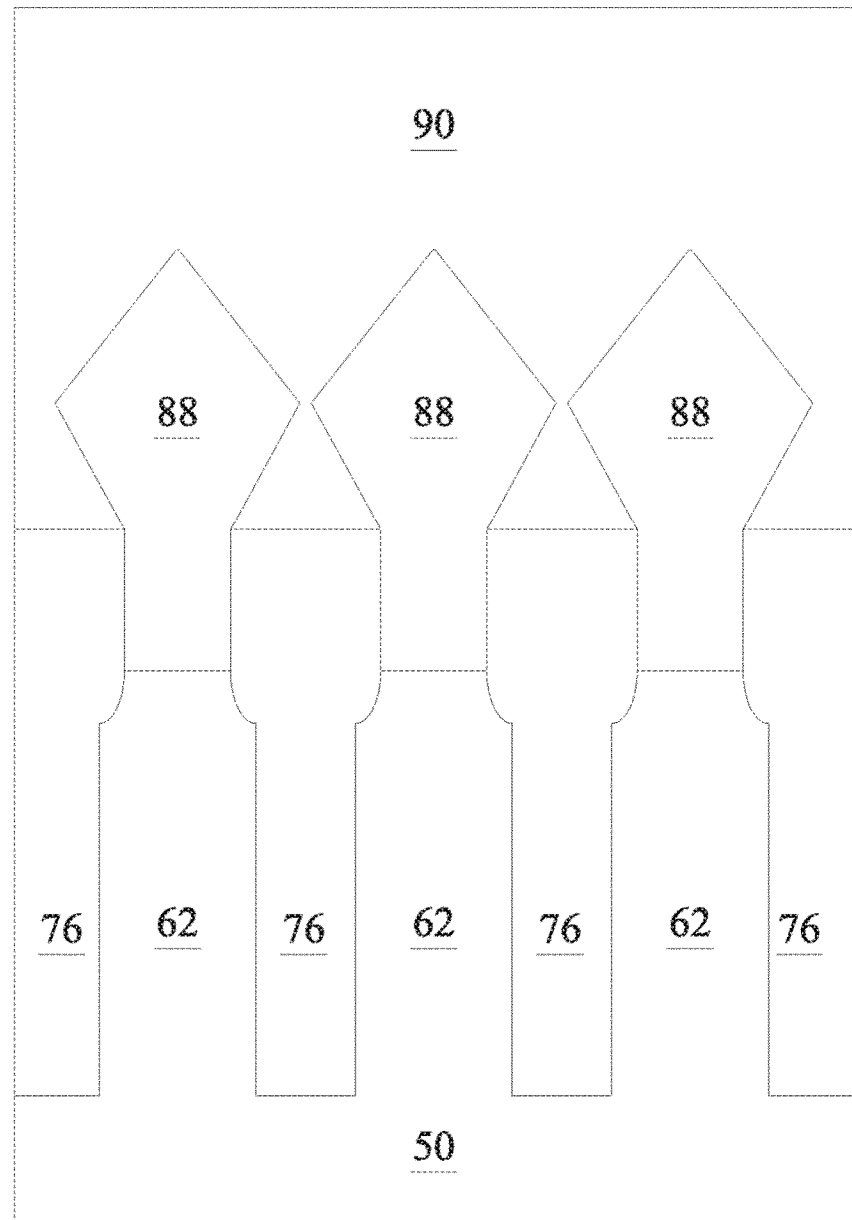
Figure 15:
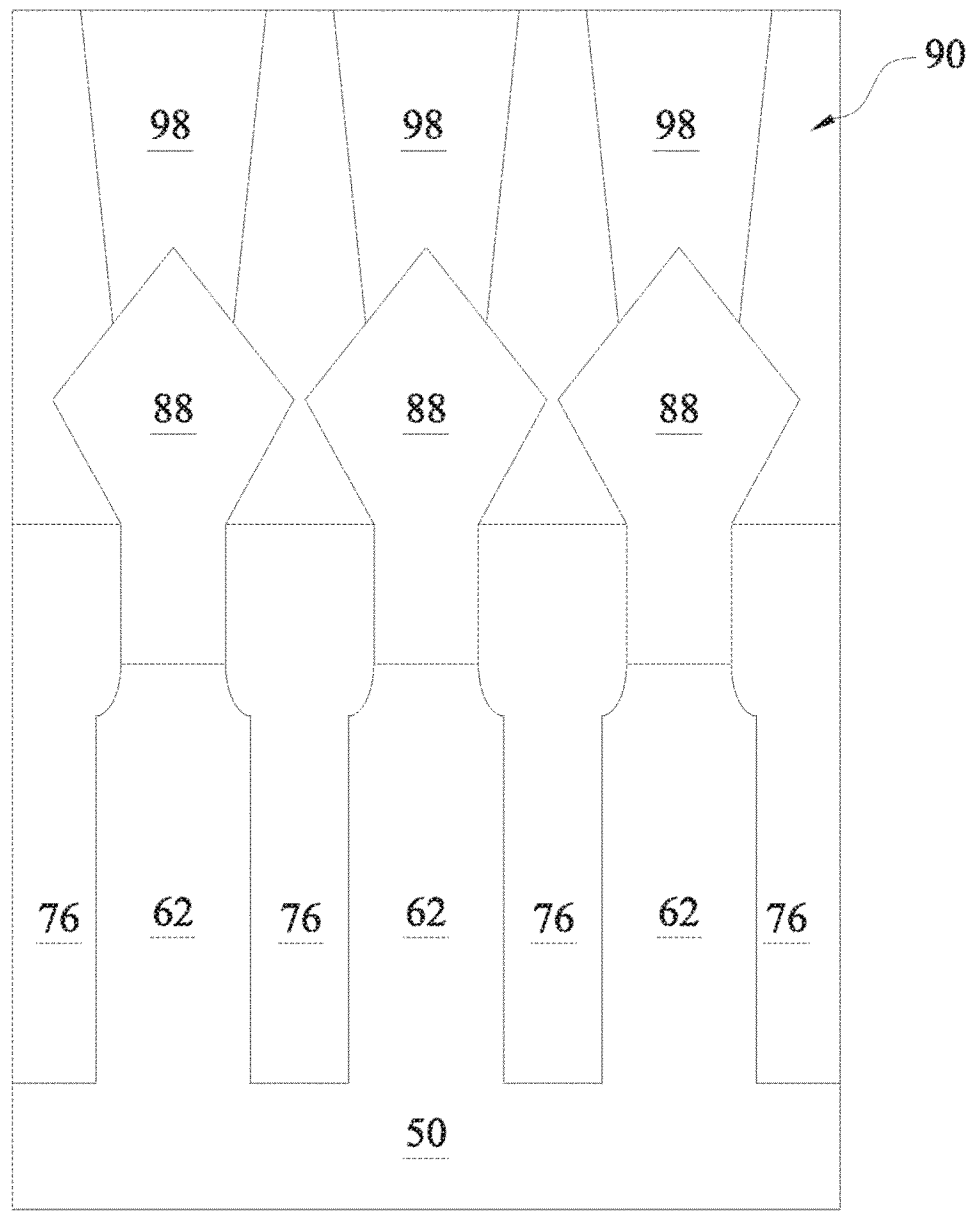
Figure 16:
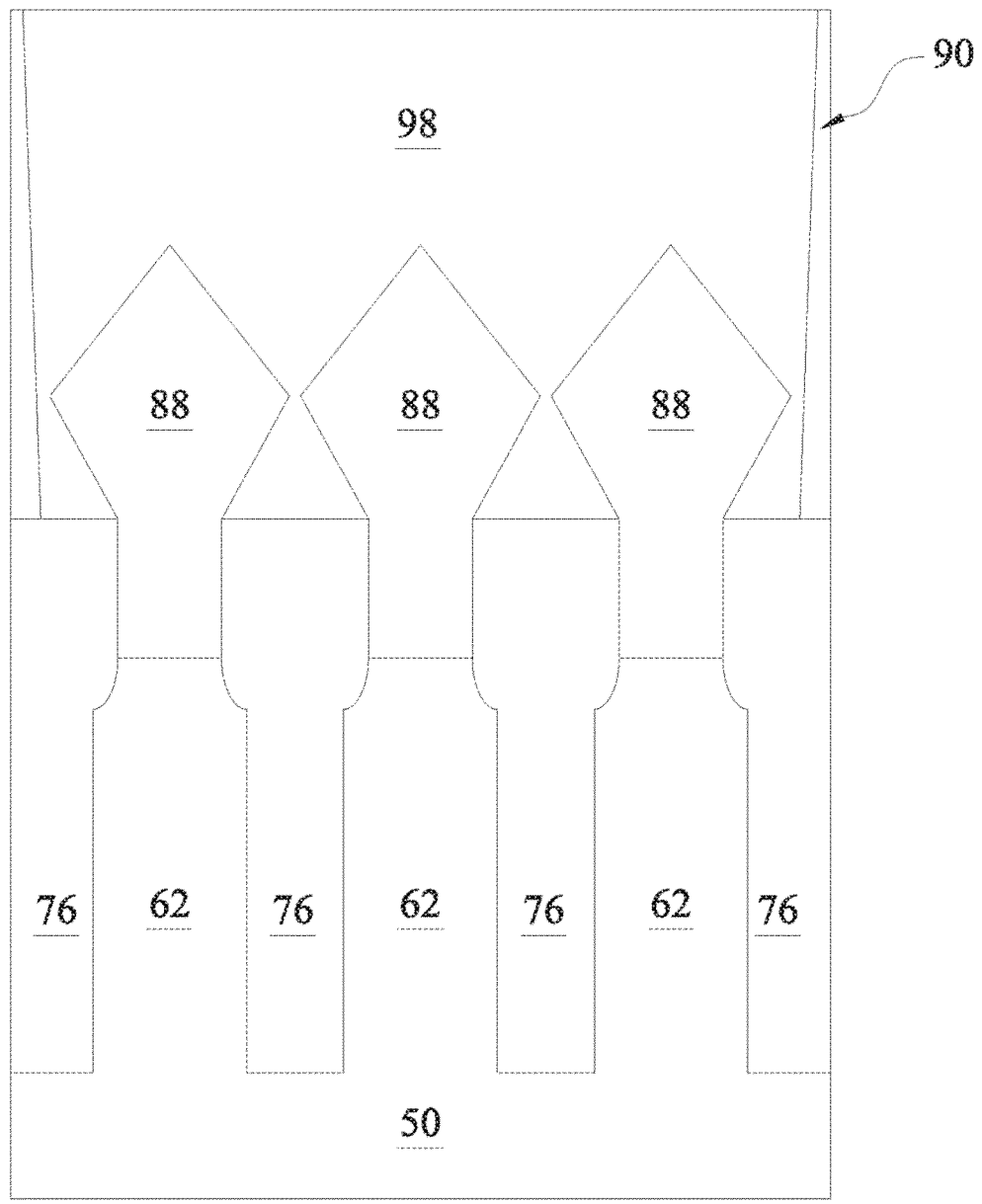
Figure 17:
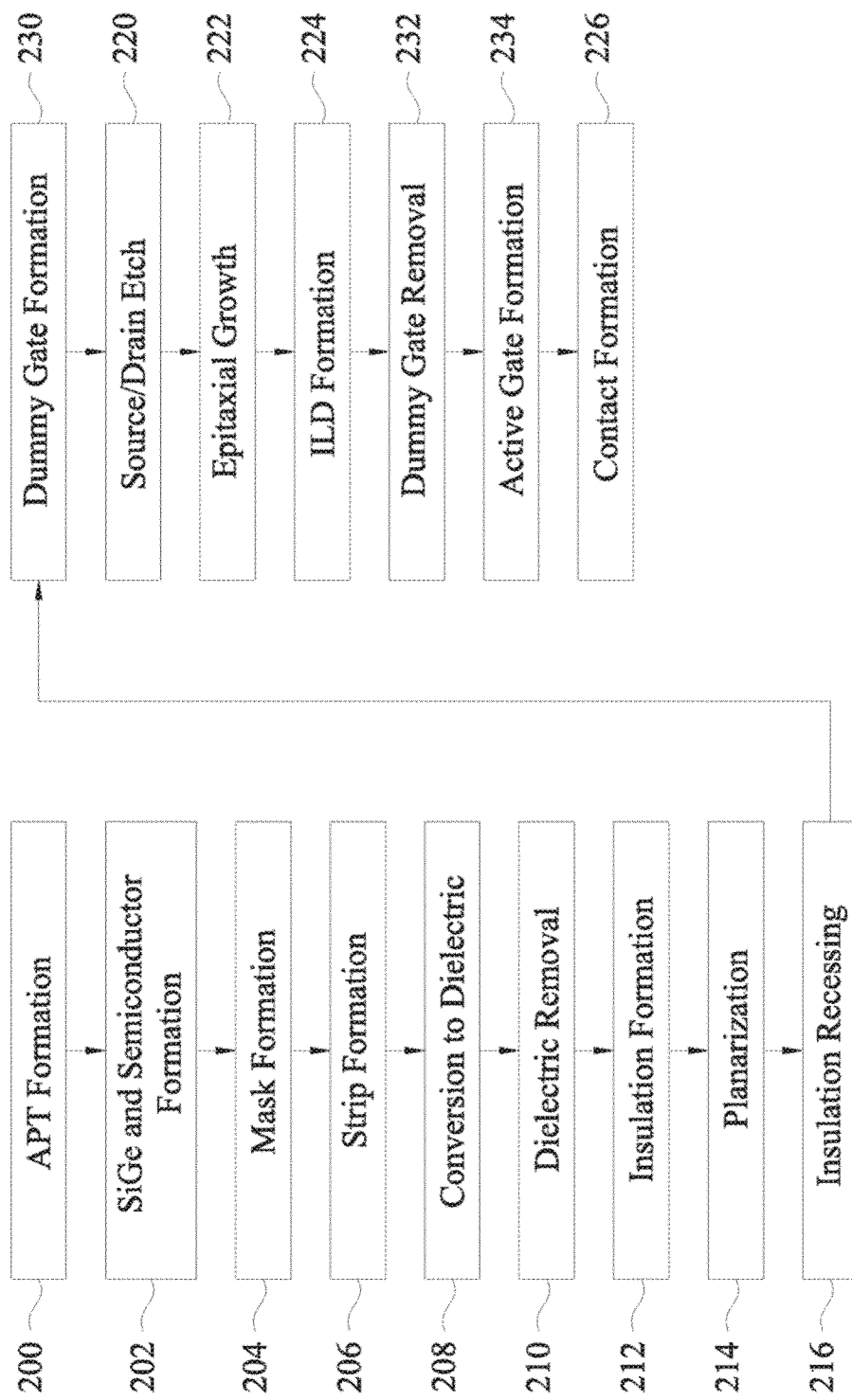
Figure 18:
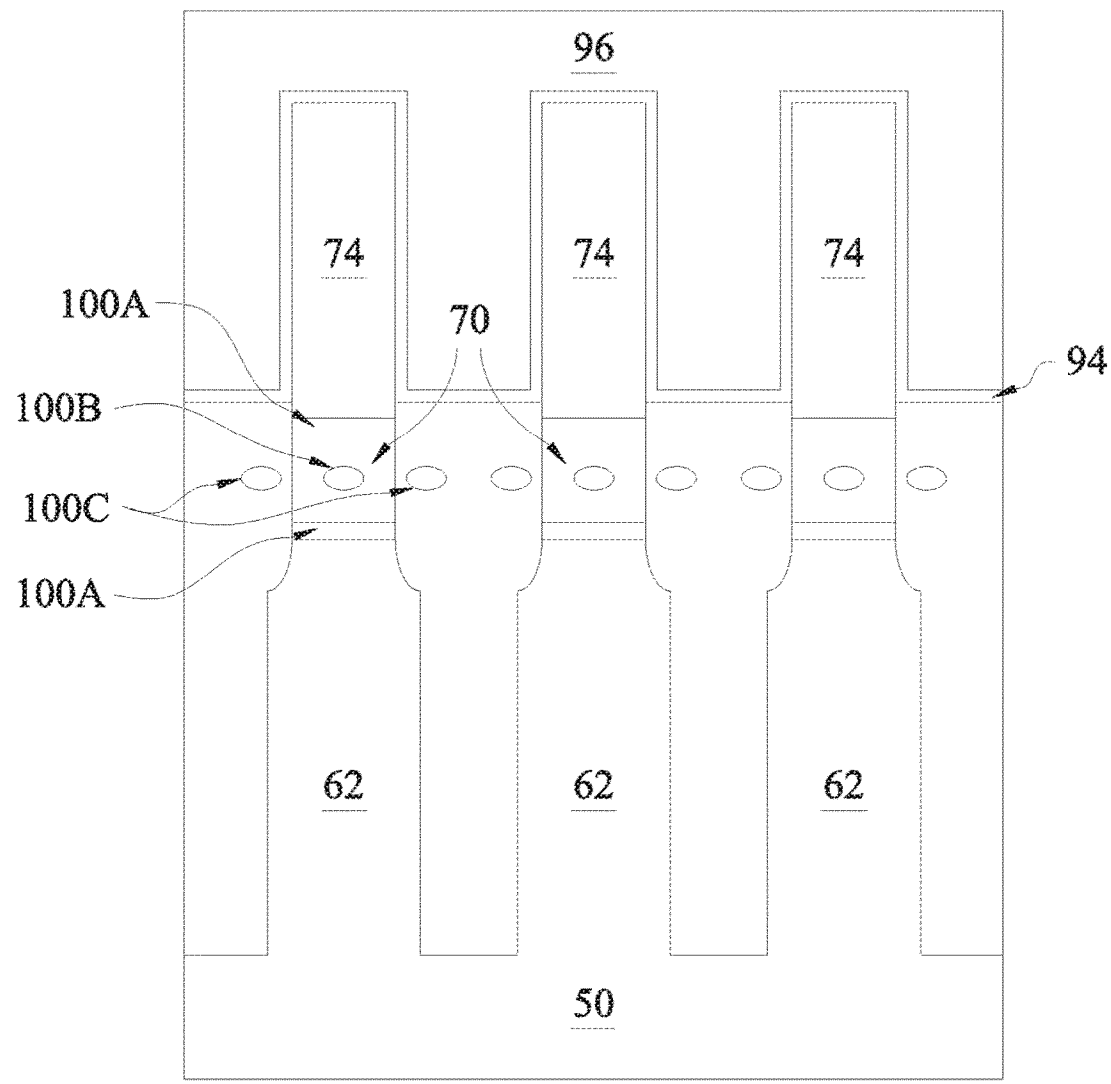
Figure 19:
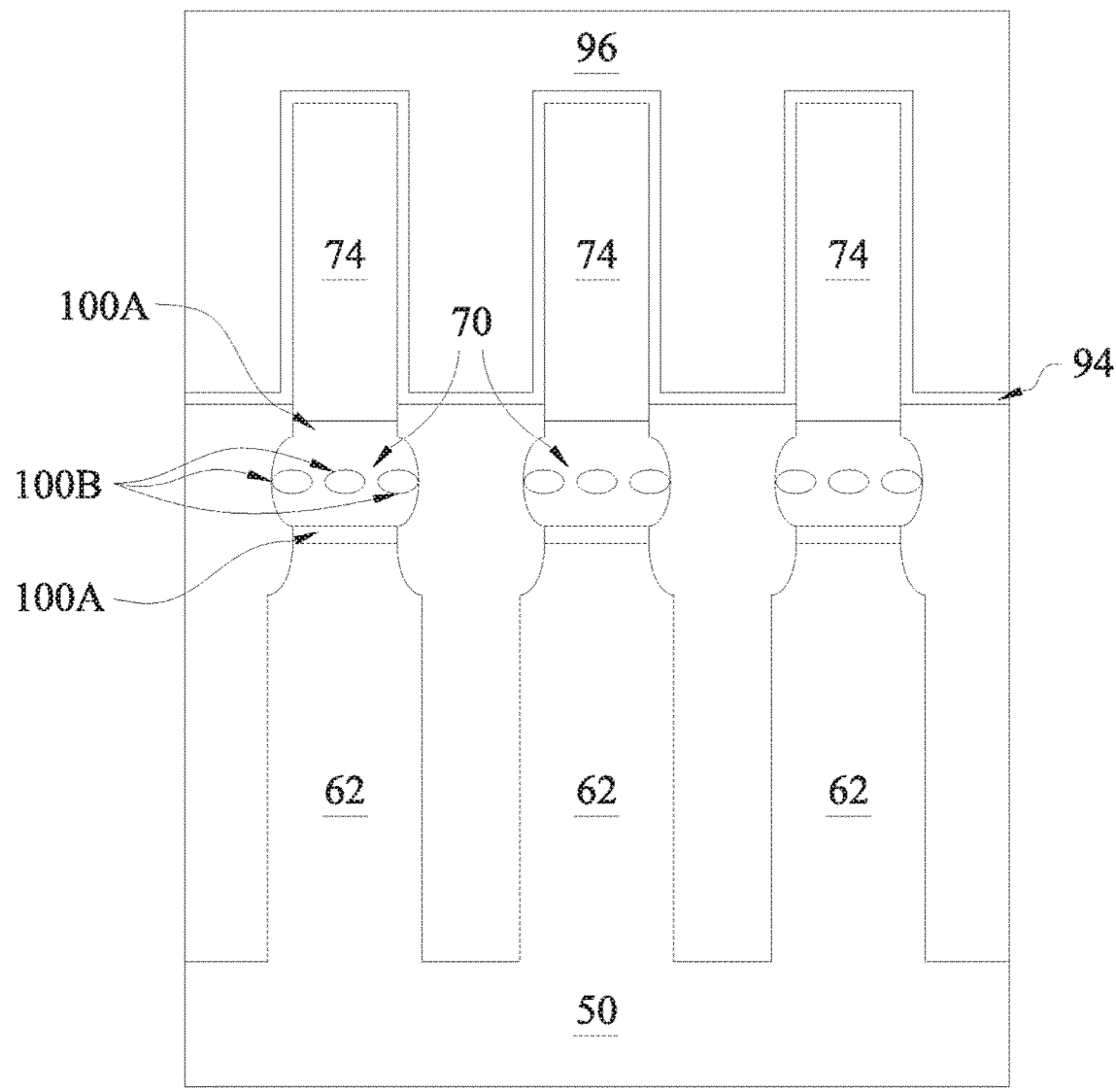
Figure 20:
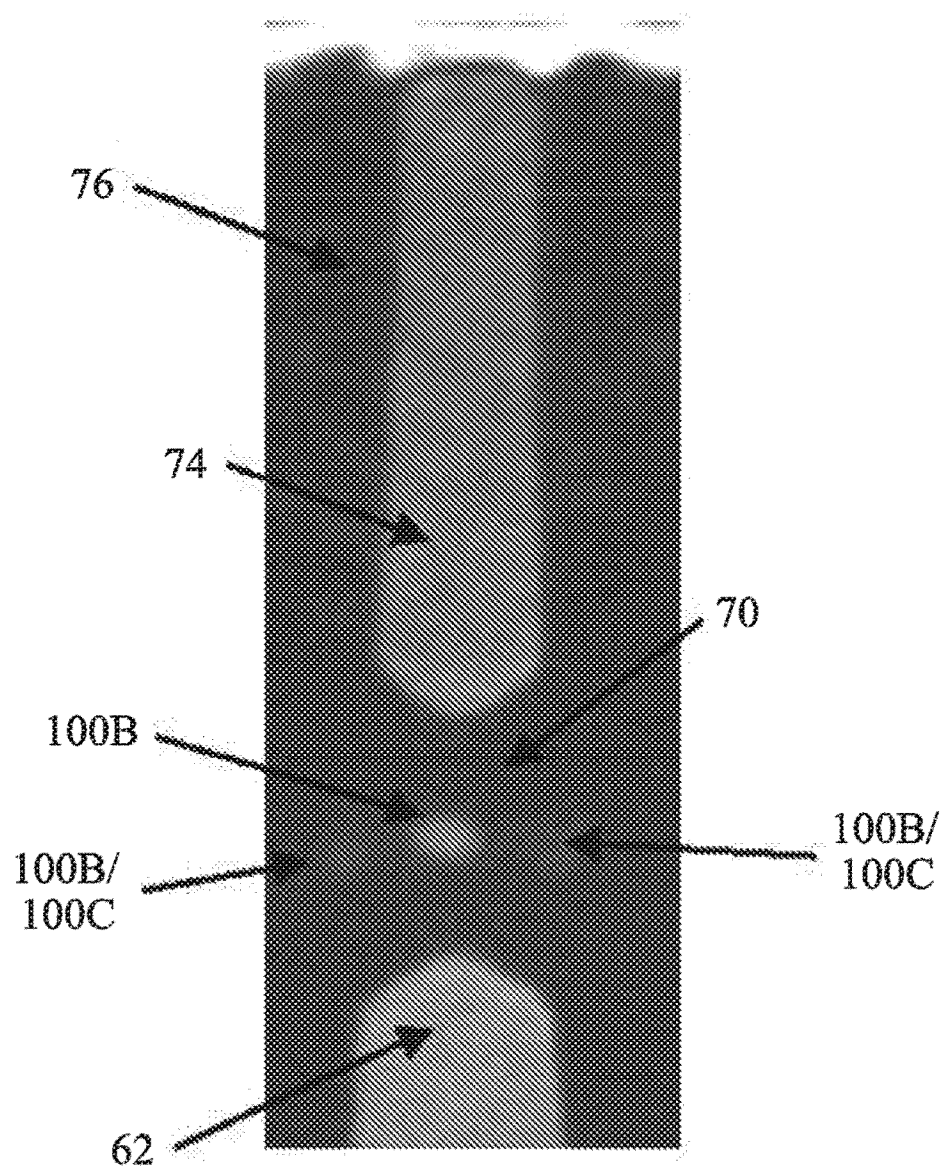
Figure 21:
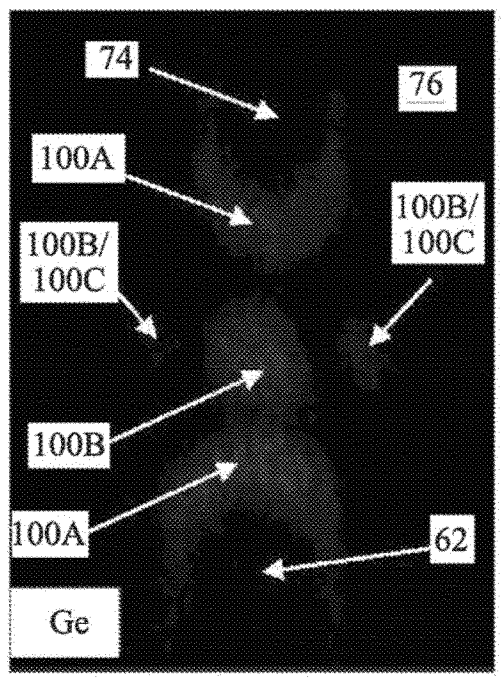
Figure 22:
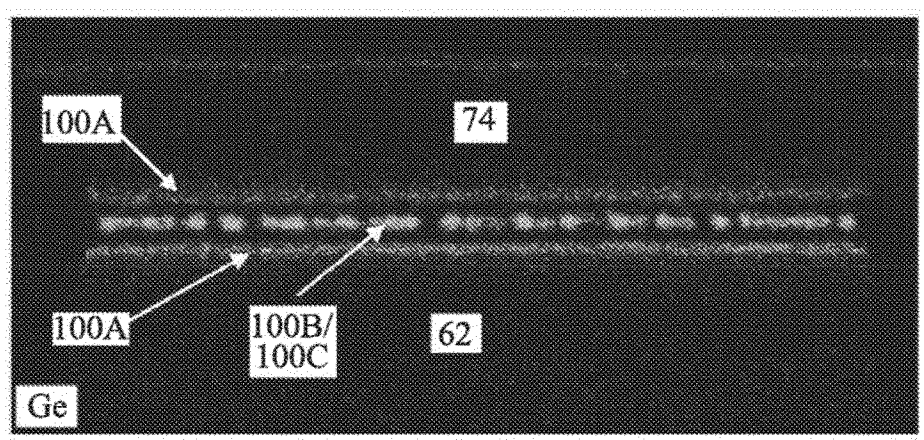
Figure 23:
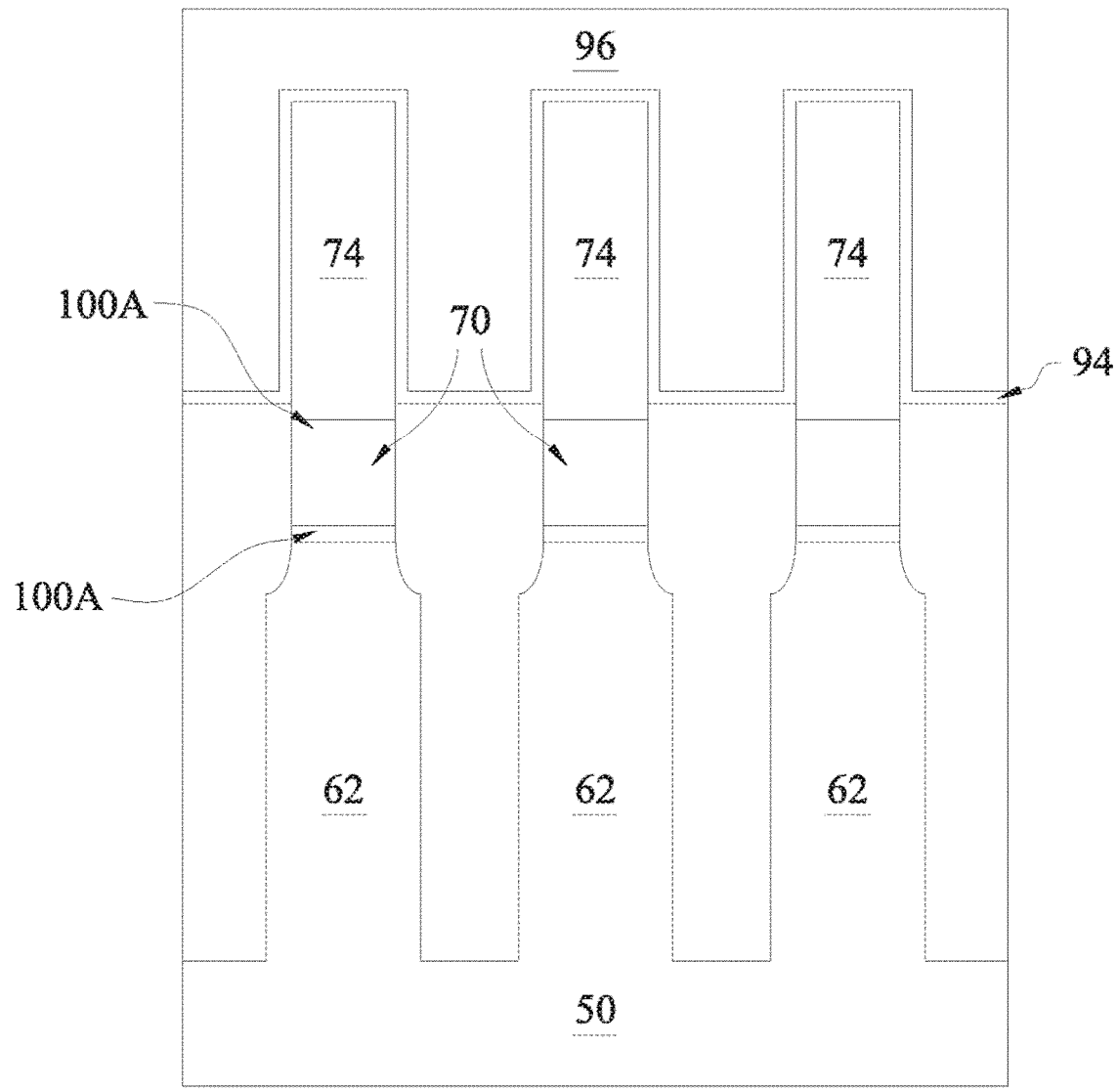
Figure 24:
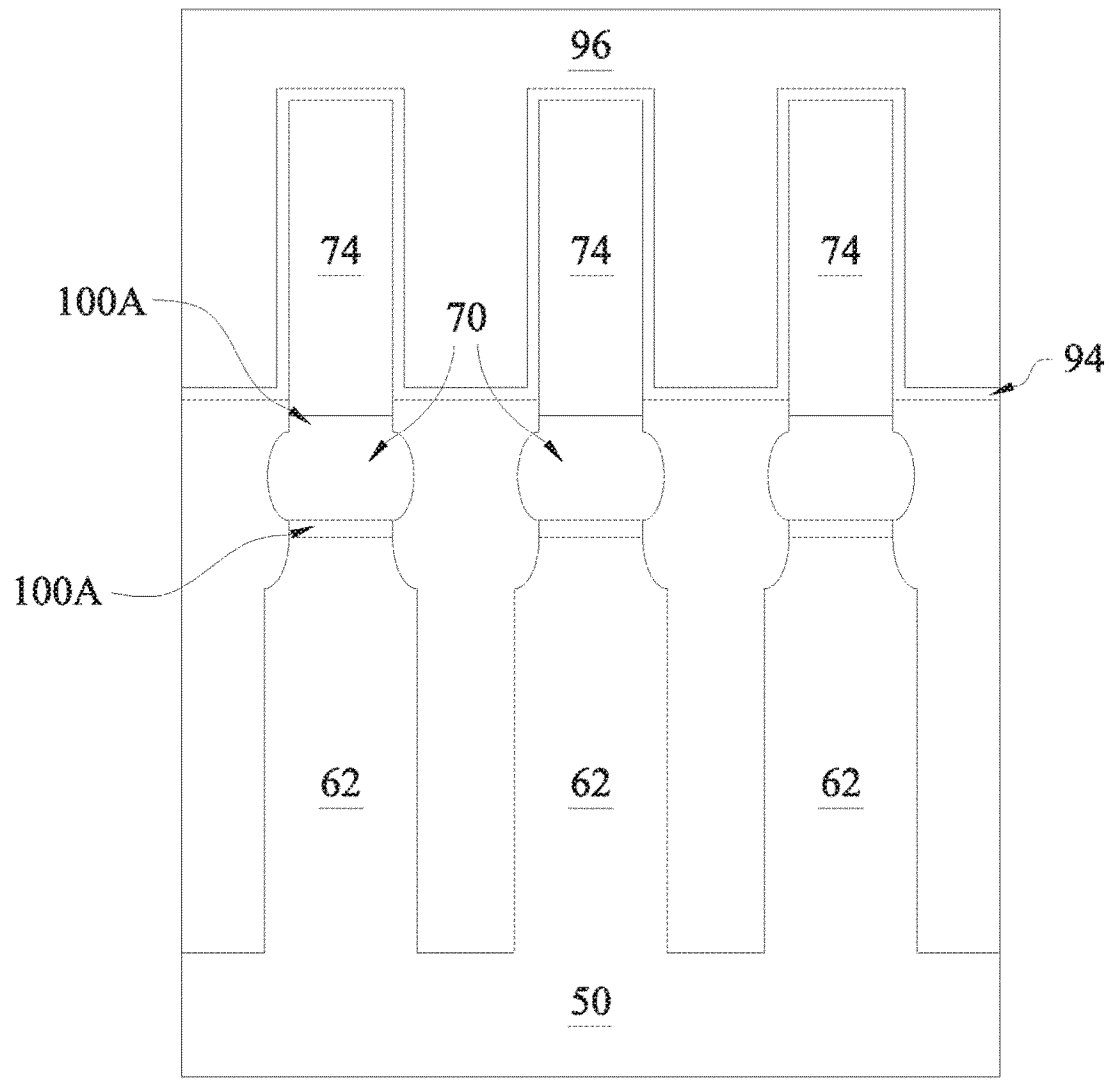
Figure 25:
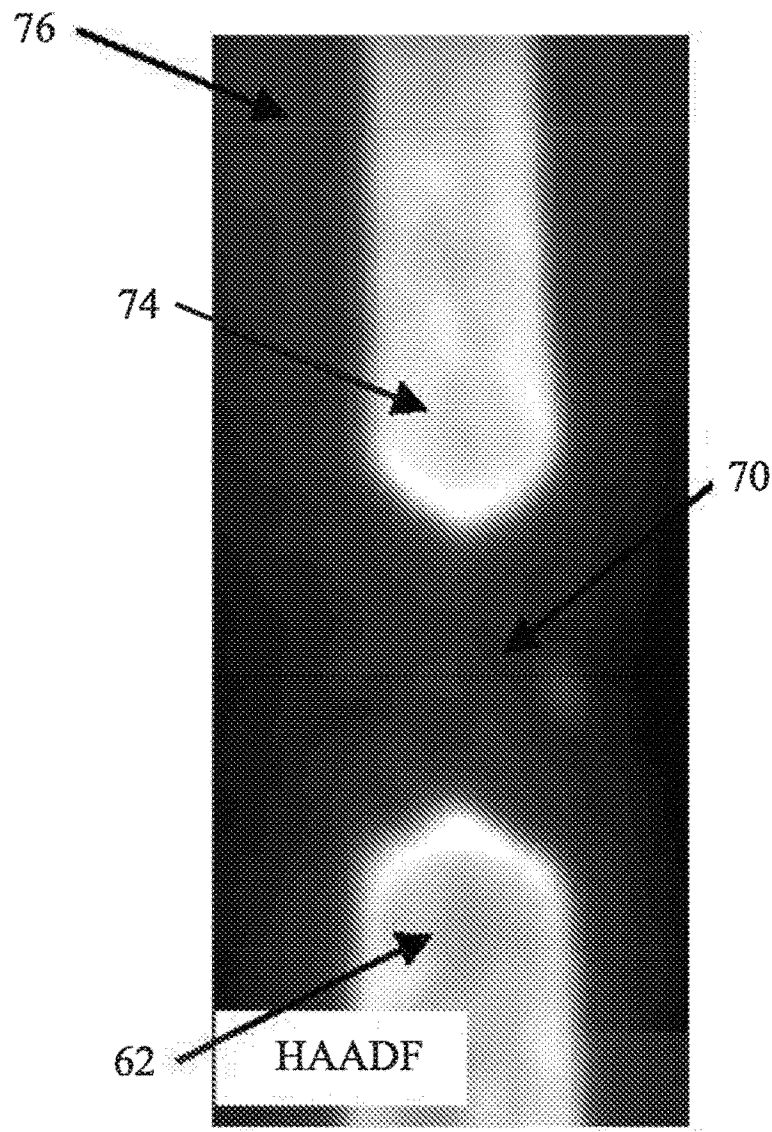
Figure 26:
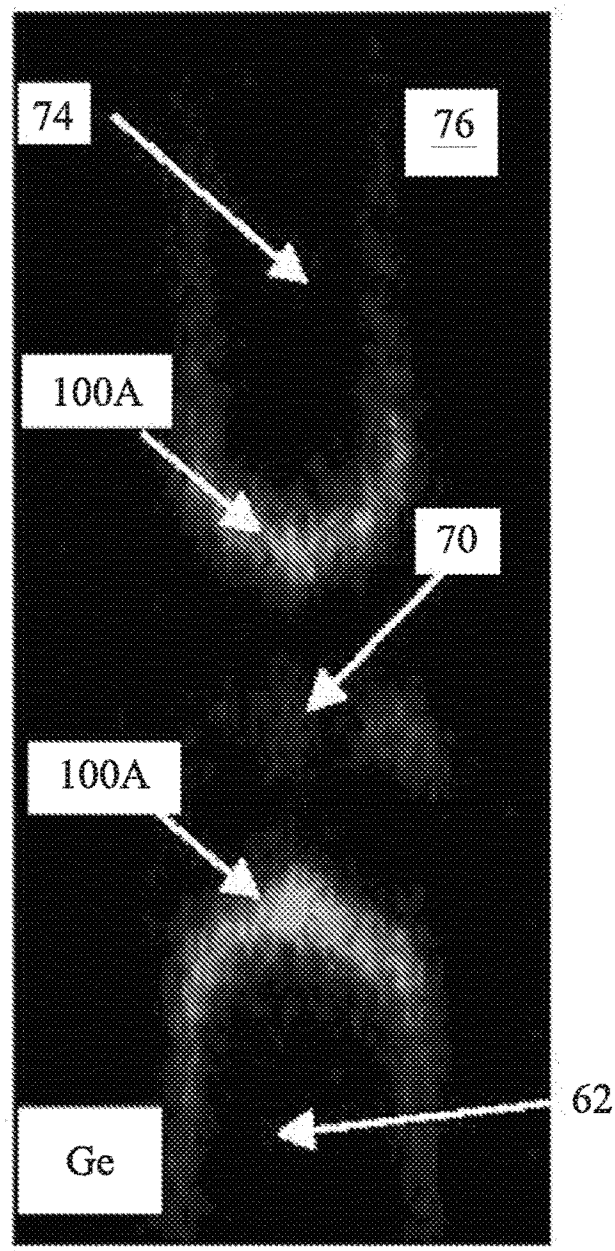
Figure 27:
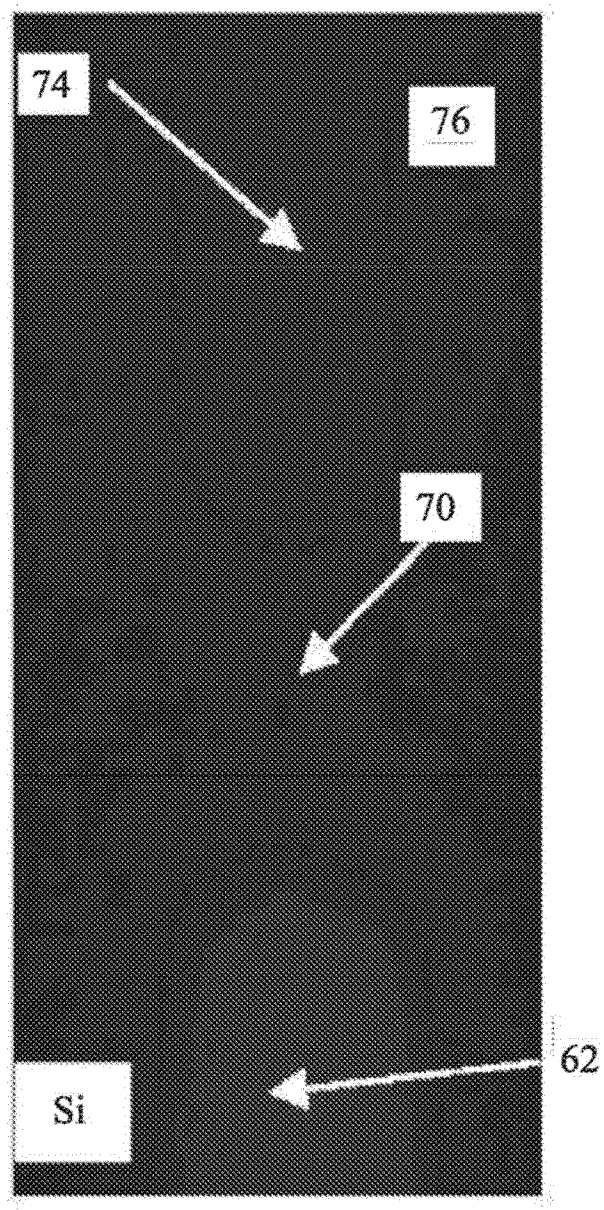

FIGS. 10A, 10B, and 10C illustrate the removal the semiconductor fins 74 and the SiGe dielectric regions 70 outside of the gate structure (step 220). The gate structure may be used as a mask during the removal of the semiconductor fins 74 and the SiGe dielectric regions 70 such that recesses 86 are formed in the semiconductor layers 62/semiconductor fins 74 and/or isolation regions 76. In some embodiments, all portions of the SiGe dielectric regions 70 not directly under the gate structure are removed. In other embodiments, some portions of the SiGe dielectric regions 70 not under the gate structure remain. The recesses 86 may be formed by etching using any acceptable etch process, such as a RIE, NBE, tetramethyalammonium hydroxide (TMAH), ammonium hydroxide ($NH_4OH$), a wet etchant capable of etching silicon with good etch selectivity between silicon and a material of the isolation regions 76, the like, or a combination thereof. The etch may be anisotropic. The etching of the semiconductor fins 74 and the SiGe dielectric regions 70 may be performed in a single etch process or multiple etch processes, such as a first etch process for the semiconductor fins 74 and a second etch process for the SiGe dielectric regions 70. Surfaces of the patterned substrate 62 are exposed as at least portions of the bottom surfaces of the recesses 86. As illustrated, the bottom surfaces of the recesses 86 include all of top surfaces of the patterned substrate 62 after an etching process. In the illustrated embodiment, the top surfaces of the patterned substrate 62 are each planar. In other embodiments, the top surfaces of the semiconductor layers 62 may have different configurations.

FIGS. 11A, 11B, and 11C illustrate the formation of the source/drain regions 88 (step 222). The source/drain regions 88 are formed in the recesses 86 by epitaxially growing a material in the recesses 86, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 11A, 11B, and 11C, due to the blocking of the isolation regions 76, source/drain regions 88 are first grown vertically in recesses 86, during which time the source/drain regions 88 do not grow horizontally. After recesses 86 are fully filled, source/drain regions 88 are grown both vertically and horizontally to form facets.

In some exemplary embodiments in which the resulting FinFET is an n-type FinFET, source/drain regions 88 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 88 comprise SiGe, and a p-type impurity such as boron or indium.

The epitaxial source/drain regions 88 and/or may be implanted with dopants to form source/drain regions followed by an anneal. The implanting process may include forming and patterning masks such as a photoresist to cover the regions of the FinFET that are to be protected from the implanting process. The source/drain regions 88 may have an impurity concentration in a range from about $10^{19}$ cm$^{-3}$ to about $10^{21}$ cm$^{-3}$. In some embodiments, the epitaxial source/drain regions 88 may be in situ doped during growth.

Subsequent processing of the FinFET device may be performed, such as the formation of one or more interlayer dielectrics and formation of contacts. These processes will be discussed below in reference to FIGS. 13A-16.

Figure 13B:
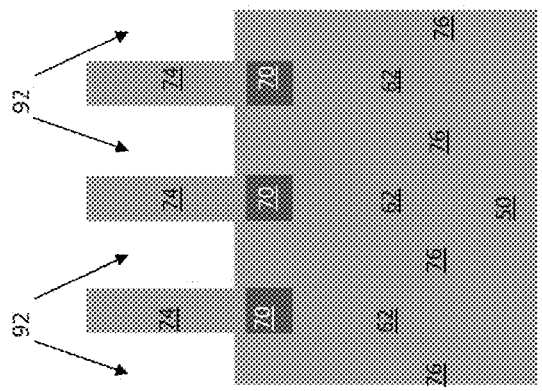
FIGS. 13A-C, 14A-C, 15, and 16 are cross-sectional views of intermediate stages in the manufacturing of FinFETs in accordance with some embodiments.
Figure 13C:
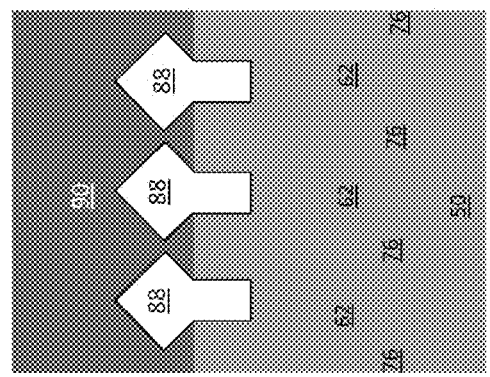
Figure 13A:
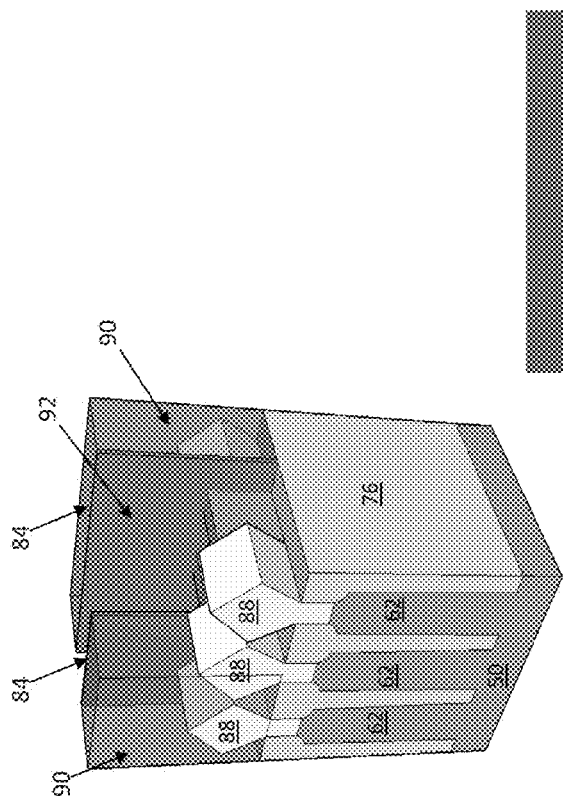
Figure 14B:
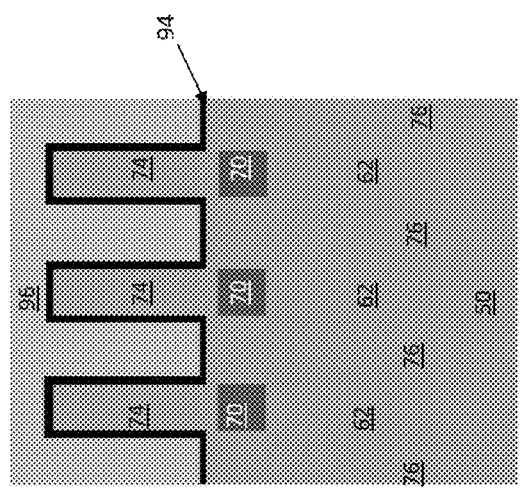
Figure 14C:
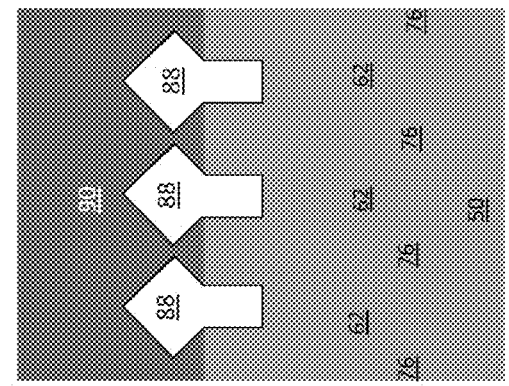
Figure 14A:
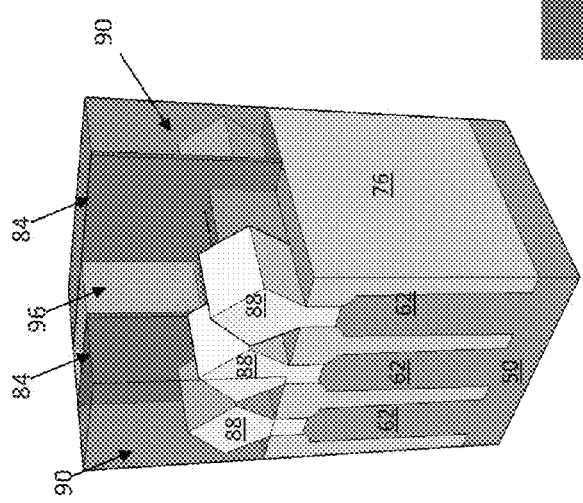
Figure 16:
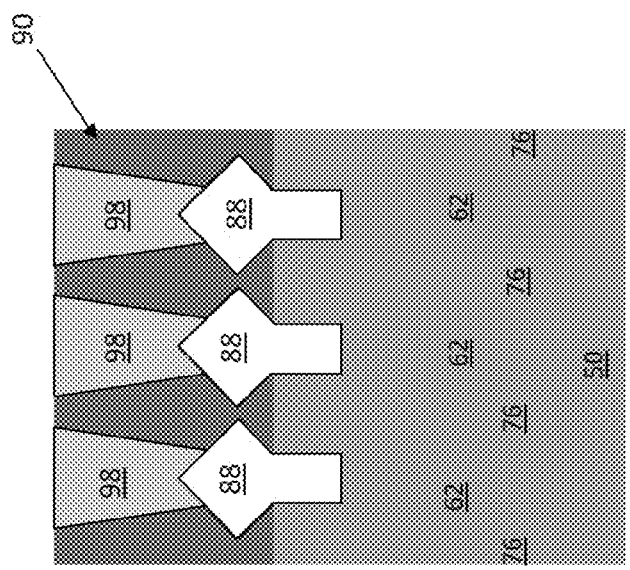
Figure 15:
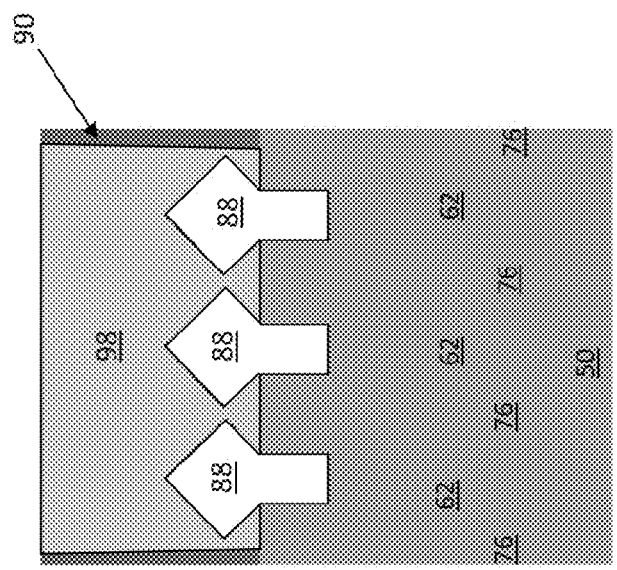
Figure 17:
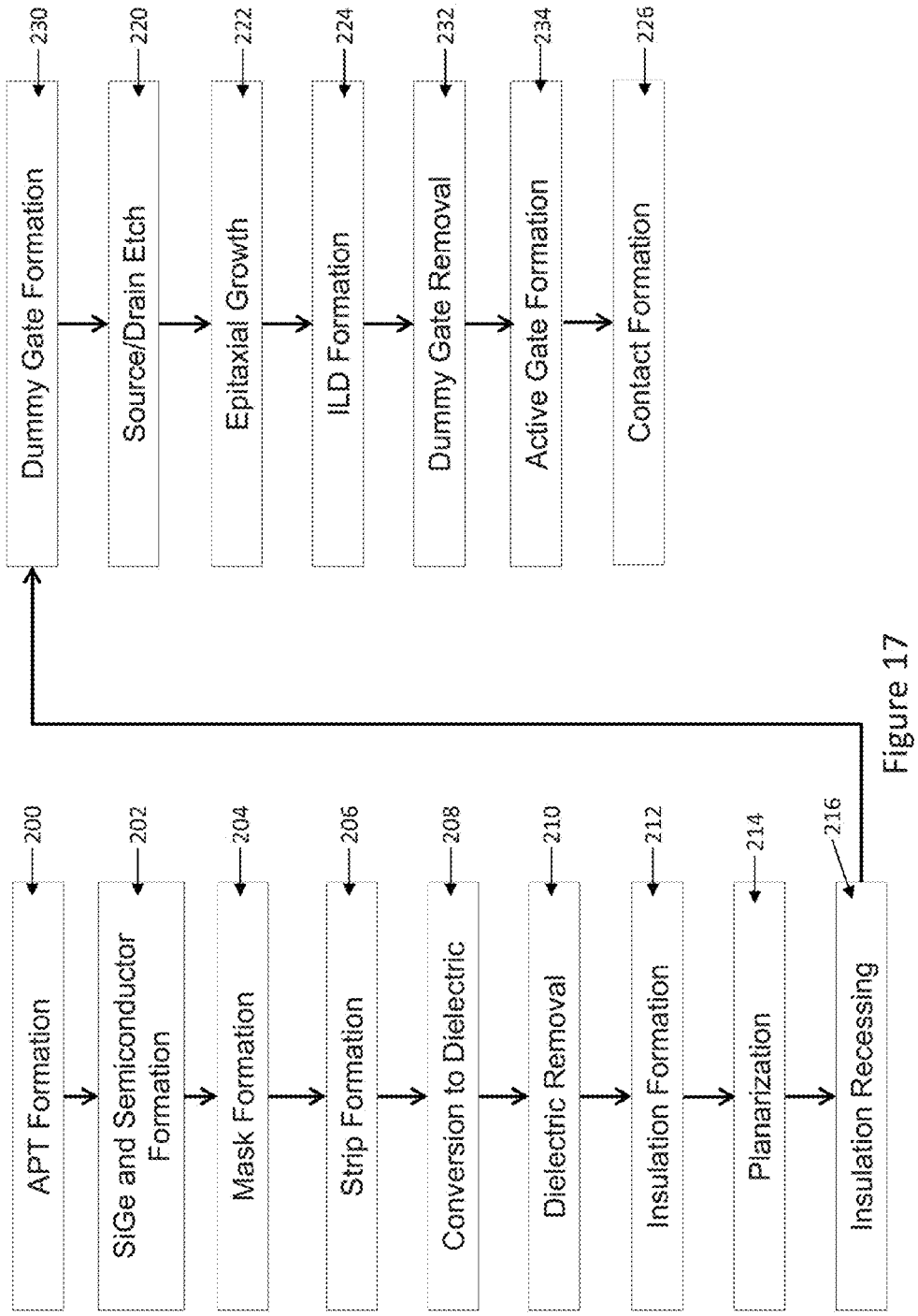
FIG. 17 is a process flow of a process in accordance with some embodiments.

FIGS. 13A-C, 14A-C, 15, and 16 are cross-sectional views of intermediate stages in the manufacturing of FinFETs in accordance with another exemplary embodiment, and FIG. 17 is a process flow of the process shown in FIGS. 13A-C, 14A-C, 15, and 16. FIGS. 13A through 16 illustrate a FinFET similar to FinFET 30 in FIG. 1, except for multiple FinFETs. FIGS. 13A through 14C, figures ending with an "A" designation are three-dimensional views; figures ending with a "B" designation illustrate cross-section B-B; and figures ending with a "C" designation illustrate cross-section C-C. FIGS. 15 and 16 illustrate cross-section C-C.

This embodiment is similar to the embodiment described above in FIGS. 2 through 11C except that this embodiment describes a gate-last process (sometimes referred to as a replacement-gate process) whereas the previous embodiment described a gate-first process. Details regarding this embodiment that are similar to those for the previously described embodiment will not be repeated herein.

Processing first proceeds as discussed with respect to FIGS. 2 through 11C and steps 200 through 222, except that gate 80 is a dummy gate and gate dielectric 78 is a dummy gate dielectric (step 230 in FIG. 17). In FIGS. 13A, 13B, and 13C, an interlayer dielectric (ILD) 90 is deposited over the structure illustrated in FIGS. 11A, 11B, and 11C (step 224). The ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

As further illustrated in FIGS. 13A, 13B, and 13C, a planarization process, such as a CMP, may be performed to level the top surface of ILD 90 with the top surfaces of the dummy gate 80. The CMP may also remove the mask 82 on the dummy gate 80. Accordingly, top surfaces of the dummy gate 80 are exposed through the ILD 90.

As further illustrated in FIGS. 13A, 13B, and 13C, the dummy gate 80, optionally gate seal spacers 84, and portions of the dummy gate dielectric 78 directly underlying the dummy gate 80 are removed in an etching step(s), so that recess(es) 92 are formed (step 232). The recess(es) 92 expose channel regions of the semiconductor fins 74. The channel regions are disposed between neighboring pairs of epitaxial source/drain regions 88. During the removal, the dummy gate dielectric 78 may be used as an etch stop layer when the dummy gate 80 is etched. The dummy gate dielectric 78 and gate seal spacers 84 may then be removed after the removal of the dummy gate 80.

In FIGS. 14A, 14B, and 14C, gate dielectric 94 and gate electrode 96 are formed for replacement gates (step 234). The gate dielectric 94 is deposited conformally in recess 92, such as on the top surfaces and the sidewalls of the semiconductor fins 74 and on sidewalls of the gate seal spacers 84 (if present), on sidewalls of ILD 90 if gate seal spacers 84 are not present, and on a top surface of the ILD 90. In accordance with some embodiments, the gate dielectric 94 may be formed of silicon oxide, silicon nitride, or multilayers thereof. In other embodiments, the gate dielectric 94 may be formed of a high-k dielectric material, and in these embodiments, the gate dielectric 94 may have a k value greater than about 7.0, and may include a metal oxide or a silicate of Hf, Al, Zr, La, Mg, Ba, Ti, Pb, and combinations thereof. The formation methods of gate dielectric 94 may include MBD, ALD, PECVD, and the like.

Next, the gate electrode 96 is deposited over the gate dielectric 94 and fill the remaining portions of the recess(es) 92. The gate electrode 96 may be formed of a metal-containing material such as TiN, TaN, TaC, Co, Ru, Al, combinations thereof, or multi-layers thereof. After the filling of gate electrode 96, a planarization process, such as a CMP, may be performed to remove the excess portions the gate dielectric 94 and the material of gate electrode 96, which excess portions are over the top surface of ILD 90. The resulting remaining portions of material of the gate electrode 96 and the gate dielectric 94 thus form replacement gates of the resulting FinFETs.

In FIGS. 15 and 16, contacts 98 are formed through ILD 90 (step 226). FIG. 15 illustrates an embodiment where separate contacts 98 to each of the source/drain regions 88 and FIG. 16 illustrates an embodiment where a single contact 98 contacts multiple (if not all) source/drain regions 88 in the FinFET. Openings for contacts 98 are formed through the ILD 90. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 90. The remaining liner and conductive material form contacts 98 in the openings. An anneal process may be performed to form a silicide at the interface between the source/drain regions 88 and the contacts 98. The contacts 98 are physically and electrically coupled to the source/drain regions 88.

Although not explicitly shown, a person having ordinary skill in the art will readily understand that further processing steps may be performed on the structure in FIGS. 14A, 14B, 14C, 15, and 16. For example, various inter-metal dielectrics (IMD) and their corresponding metallizations may be formed over ILD 90. Further, contacts to the gate electrode 96 may be formed through overlying dielectric layers.

Figure 19:
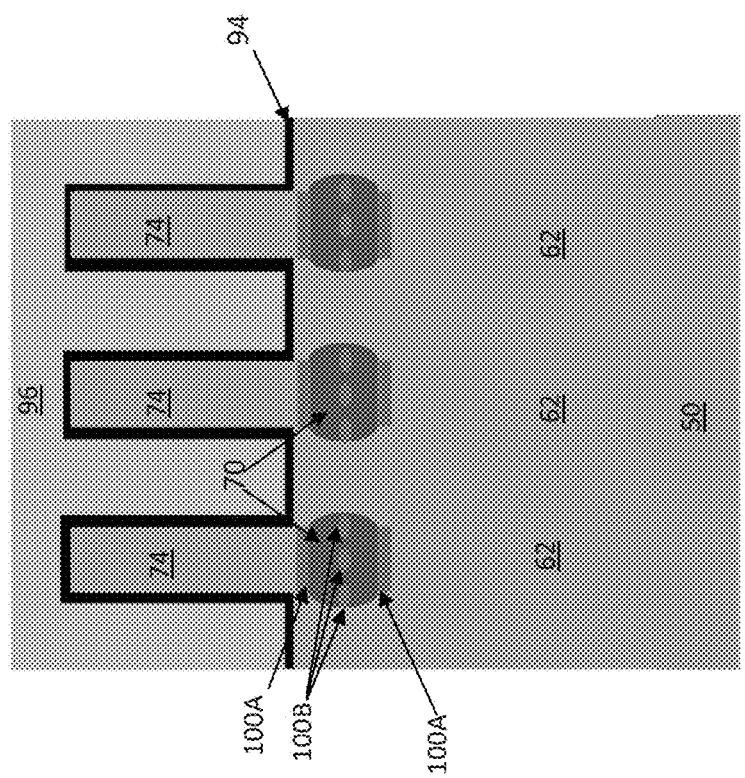
FIGS. 18 and 19 are cross-sectional views of structures in accordance with some embodiments.
Figure 18:
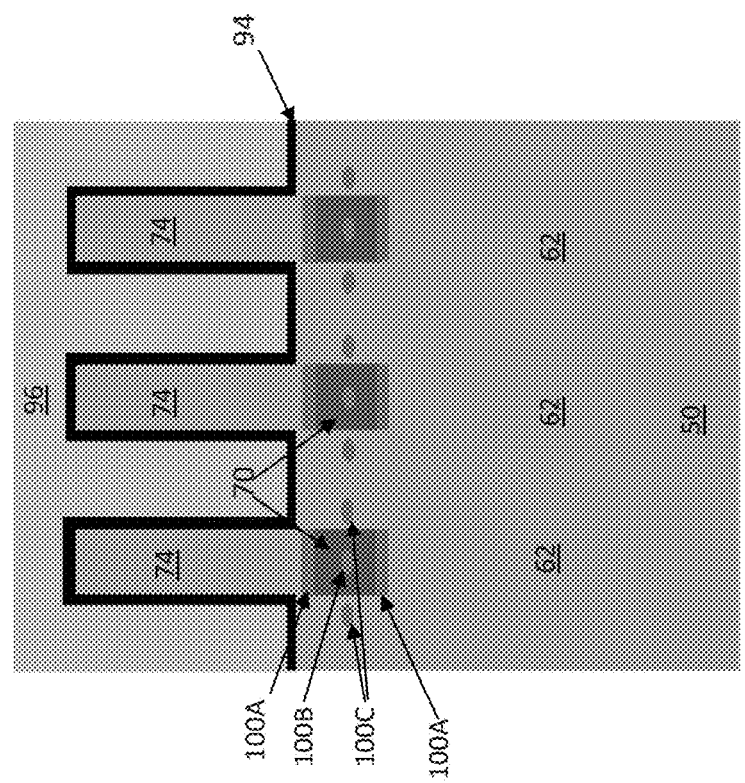

FIGS. 18 and 19 are cross-sectional views of aspects of structures in accordance with some embodiments. FIGS. 18 and 19 illustrate germanium (Ge) residue configurations that remain in the SiGe dielectric regions 70, the semiconductor fins 74, the patterned substrate 62, and isolation regions 76 with FIG. 18 illustrating the SiGe dielectric regions 70 of FIG. 6B2 and FIG. 19 illustrating the SiGe dielectric regions 70 of FIG. 6B1. Although FIGS. 18 and 19 illustrate gate-last configuration with gate dielectric 94 and gate electrode 96, the Ge residue regions 100A, 100B, and 100C are also present in the gate-first configuration of FIGS. 11A, 11B, and 11C. Further, even though the Ge residue regions 100A, 100B, and 100C were omitted from previous figures for simplicity, the Ge residue regions 100A, 100B, and 100C may be present starting at the conversion to dielectric step 208 in the embodiments discussed above.

FIG. 18 includes Ge residue regions 100A in the semiconductor fins 74 and the patterned substrate 62, Ge residue regions 100B in the SiGe dielectric regions 70, and Ge residue regions 100C in the isolation regions 76. The Ge residue regions 100A are at the interfaces of SiGe dielectric regions 70 and the semiconductor fins 74 and the patterned substrate 62. The Ge residue regions 100B and 100C are within and surrounded by the SiGe dielectric regions 70 and the isolation regions 76, respectively. In some embodiments, the Ge percentage of the Ge residue in the Ge residue regions 100A is in the range from about 1 percent to about 20 percent. In some embodiments, the Ge percentage of the Ge residue in the Ge residue regions 100B is in the range from about 1 percent to about 20 percent. In some embodiments, the Ge percentage of the Ge residue in the Ge residue regions 100C is in the range from about 1 percent to about 20 percent. Controlling the Ge residue regions to have the disclosed lower values of Ge percentage is important as higher Ge percentage values can cause issues because the Ge can diffuse into the gate structure and degrade the performance and reliability of the FinFET device.

FIG. 19 includes Ge residue regions 100A in the semiconductor fins 74 and the patterned substrate 62 and Ge residue regions 100B in the SiGe dielectric regions 70. In some embodiments, the Ge percentage of the Ge residue in the Ge residue regions 100A is in the range from about 1 percent to about 20 percent. In some embodiments, the Ge percentage of the Ge residue in the Ge residue regions 100B is in the range from about 1 percent to about 20 percent.

Figure 21:
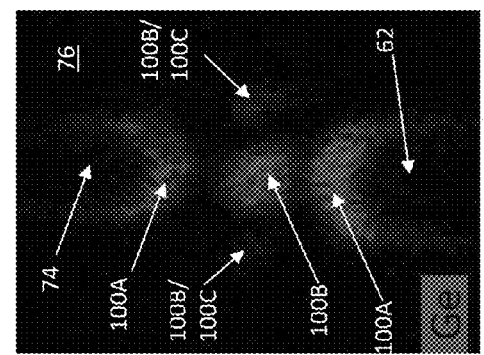
FIGS. 20 through 22 are transmission electron microscopy (TEM) images of samples in accordance with embodiments.
Figure 20:
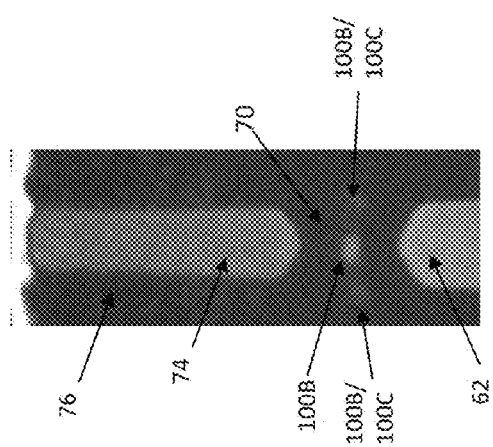
Figure 22:
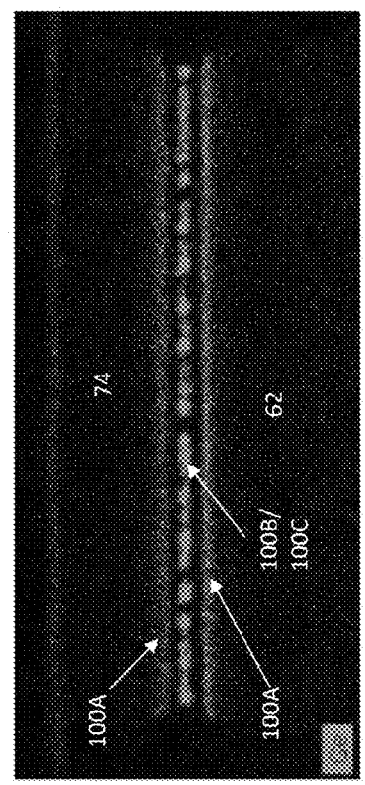

FIGS. 20 through 22 are transmission electron microscopy (TEM) images of samples in accordance with the embodiments of FIGS. 18 and 19. FIGS. 20 and 21 are along a similar cross-section B-B in FIG. 1 and FIG. 22 is a cross-section along the length of the semiconductor fin 74.

FIG. 20 illustrates a patterned substrate portion 62, a SiGe dielectric region 70, a semiconductor fin 74, an isolation region 76, and Ge residue regions 100A and 100B/100C.

Similarly, FIGS. 21 and 22 are TEM images of samples that highlight the location of the concentrations of the Ge residue. FIGS. 21 and 22 illustrate a patterned substrate portion 62, a SiGe dielectric region 70, a semiconductor fin 74, an isolation region 76, and Ge residue regions 100A and 100B/100C. In FIGS. 20 through 22, the Ge residue regions labeled 100B/100C can either be a Ge residue region 100B or a Ge residue region 100C depending on the configuration of the SiGe dielectric region 70 (see FIGS. 18 and 19)

Figure 24:
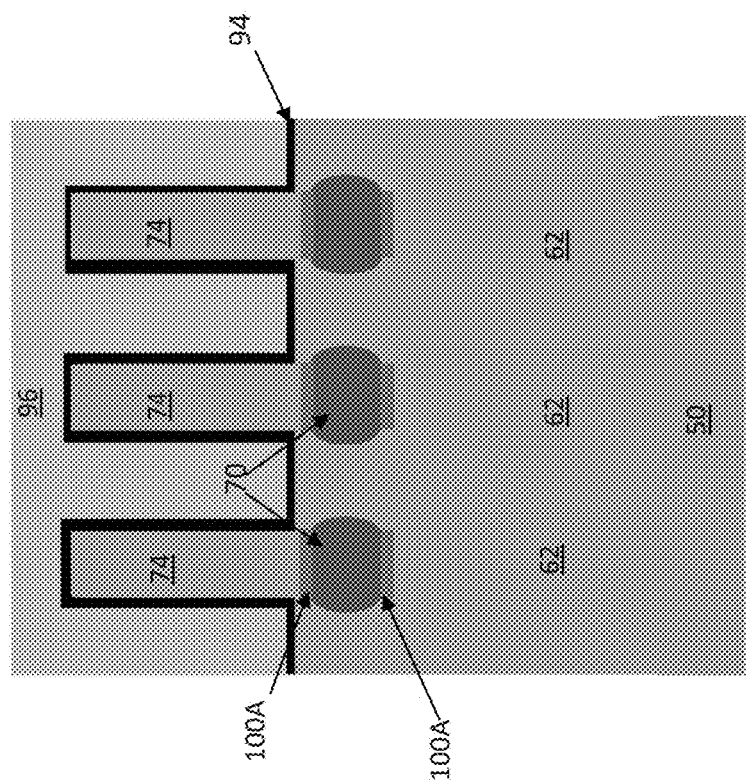
FIGS. 23 and 24 are cross-sectional views of aspects of structures in accordance with some embodiments.
Figure 23:
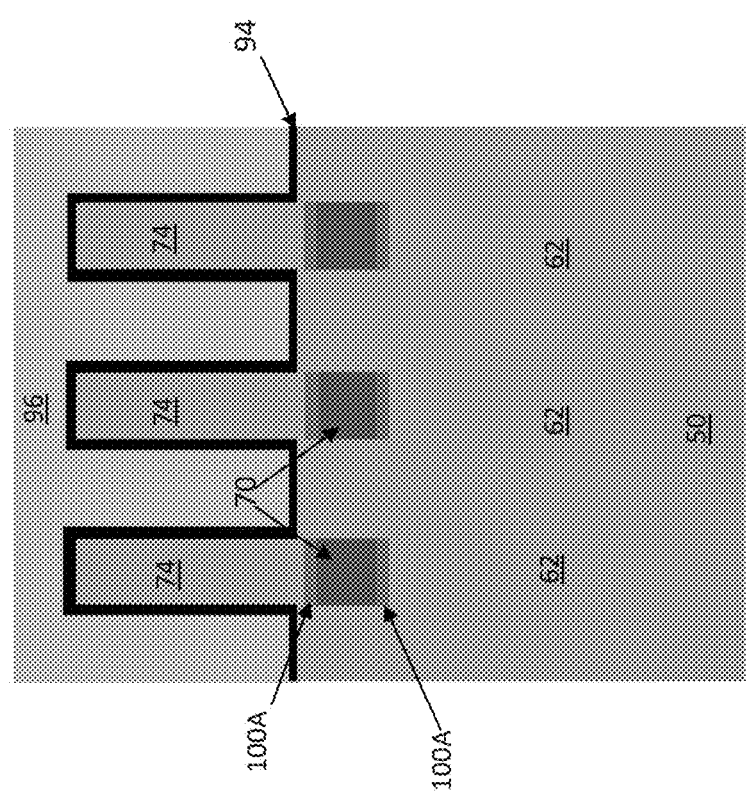

FIGS. 23 and 24 are cross-sectional views of aspects of structures in accordance with some embodiments. The embodiments in FIGS. 23 and 24 are similar to the embodiment sin FIGS. 18 and 19, respectively, except that they have undergone a Ge residue scavenging process to reduce/remove the Ge residue in the SiGe dielectric regions 70. In some embodiments, the Ge residue scavenging process is performed at the intermediate stage illustrated in FIGS. 8A and 8B or in FIGS. 13A, 13B, and 13C. In other embodiments, the Ge residue scavenging process is performed at other stages of the manufacturing process.

The Ge scavenging process may include a low pressure and high temperature anneal process. In some embodiments, the Ge scavenging process may be performed at a pressure in a range from about $10^{-3}$ atmosphere (atm) to about $10^{-7}$ atm, such as about $10^{-5}$ atm and at a temperature in a range from about 700° C. to about 1100° C., such as about 900° C. After the Ge scavenging process, the SiGe dielectric regions 70 may be substantially free from Ge residue, and thus, the Ge residue regions 100B are not present in the embodiments of FIGS. 23 and 24. Hence, the embodiments of FIGS. 23 and 24 only have the Ge residue regions 100A in the semiconductor fins 74 and the patterned substrate 62. In some embodiments, the Ge percentage of the Ge residue in the Ge residue regions 100A is in the range from about 1 percent to about 20 percent. In an embodiment, the Ge percentage of the Ge residue in the Ge residue regions 100A is less than 10 percent. Controlling the Ge residue regions to have the disclosed lower values of Ge percentage is important as higher Ge percentage values can cause issues because the Ge can diffuse into the gate structure and degrade the performance and reliability of the FinFET device.

Figure 27:
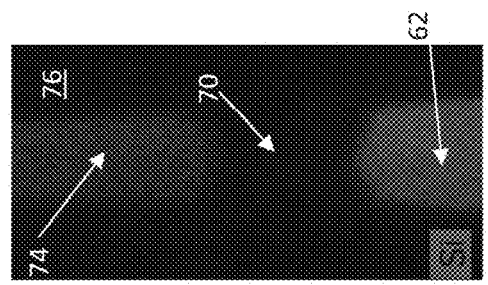
FIGS. 25 through 27 are TEM images of samples in accordance with embodiments.
Figure 26:
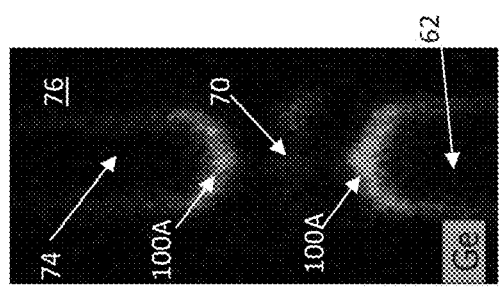
Figure 25:
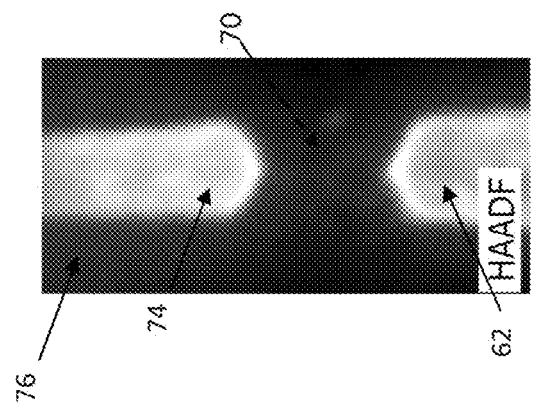
Figure 1:
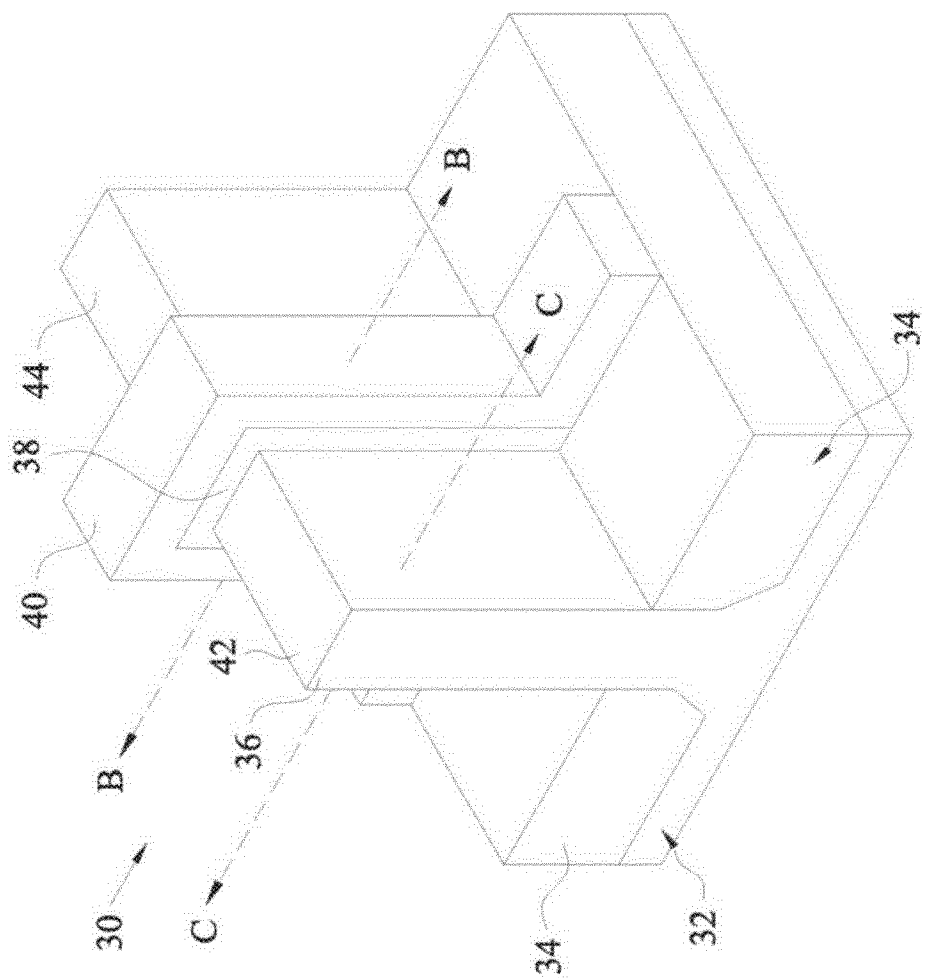
Figure 2:
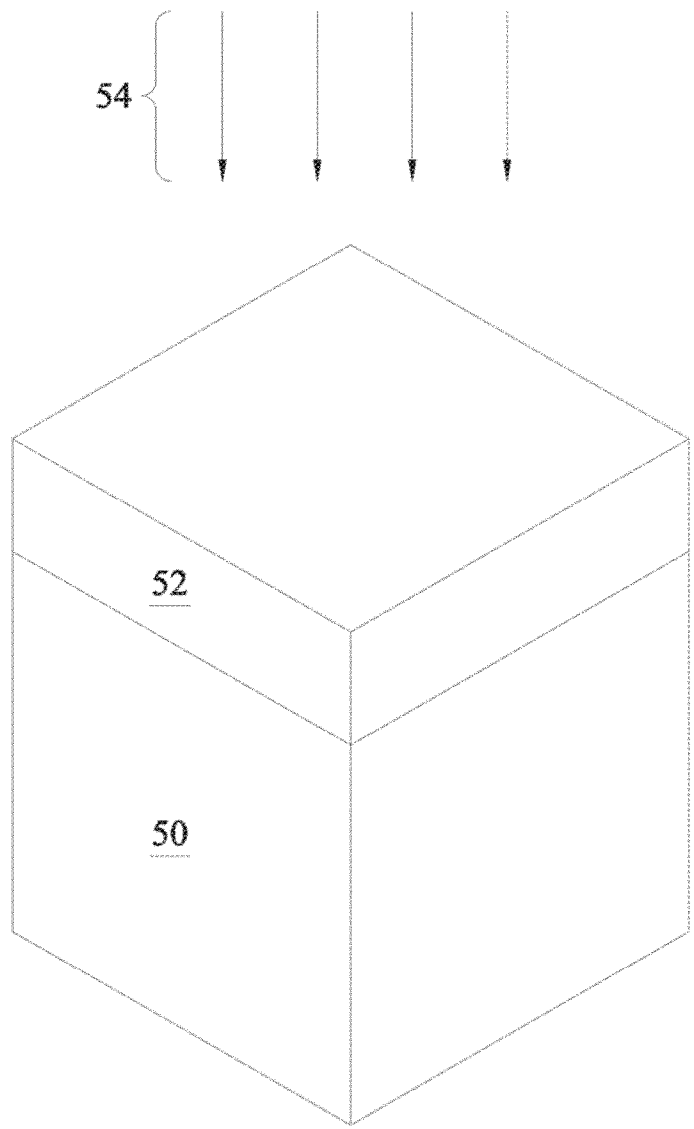
Figure 3:
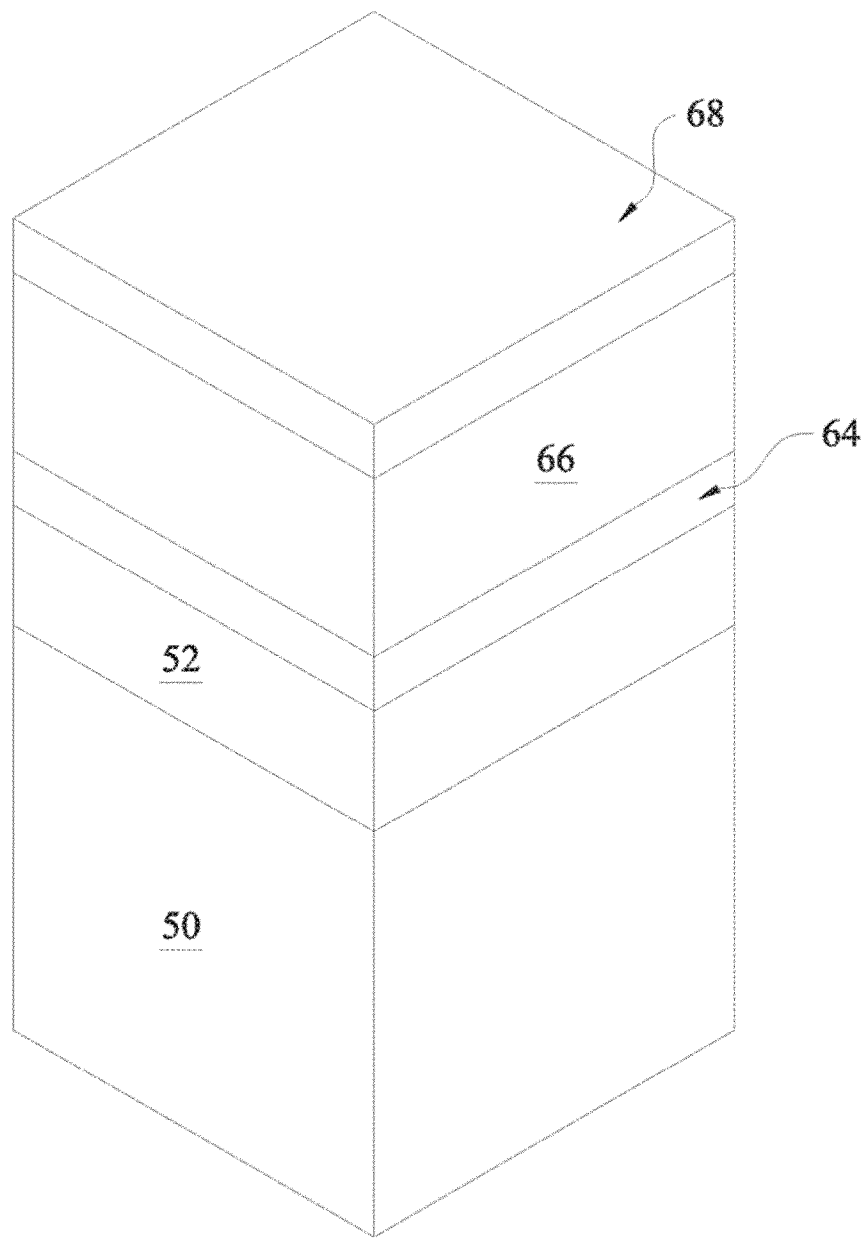
Figure 4A:
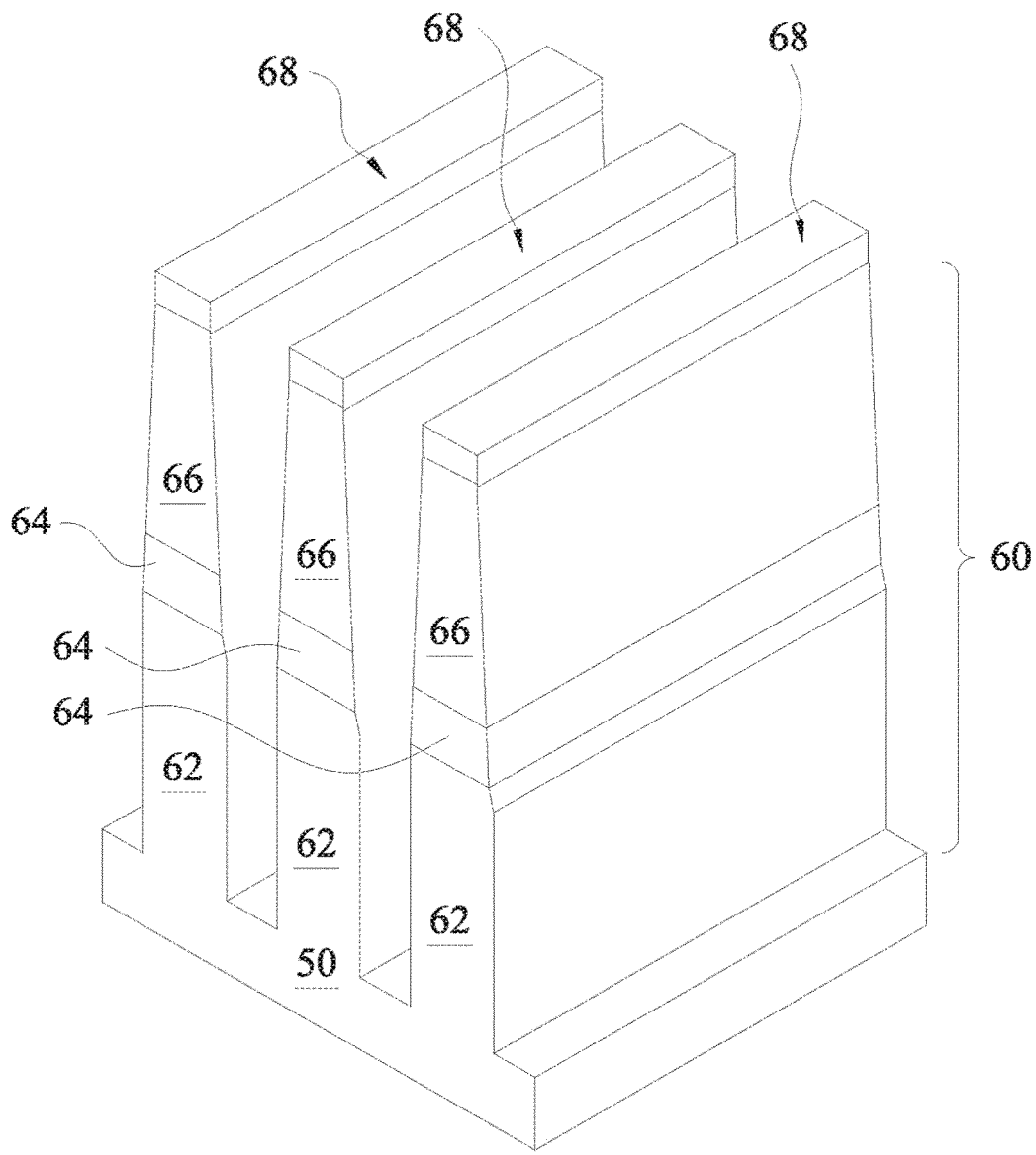
Figure 4B:
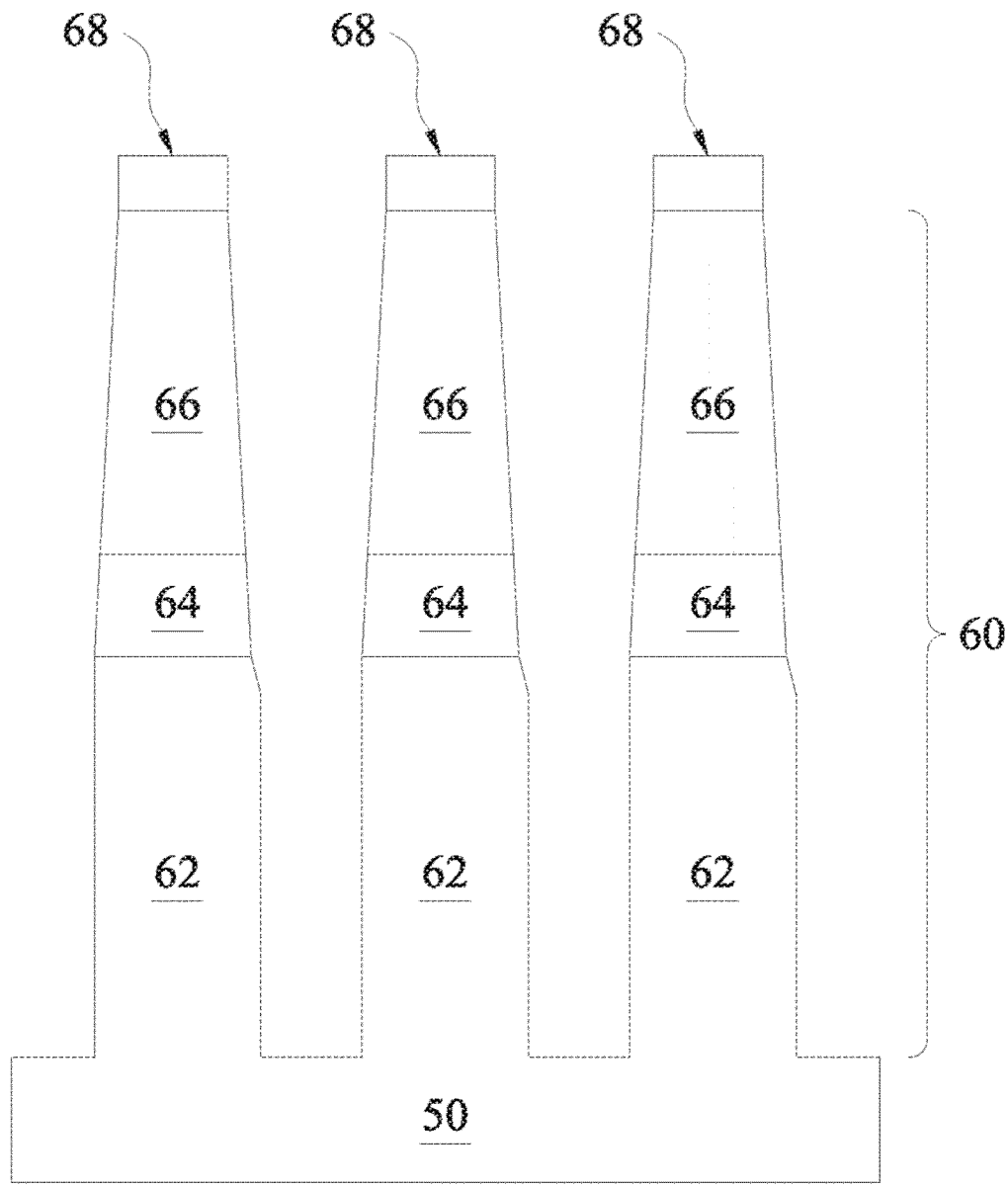
Figure 5A:
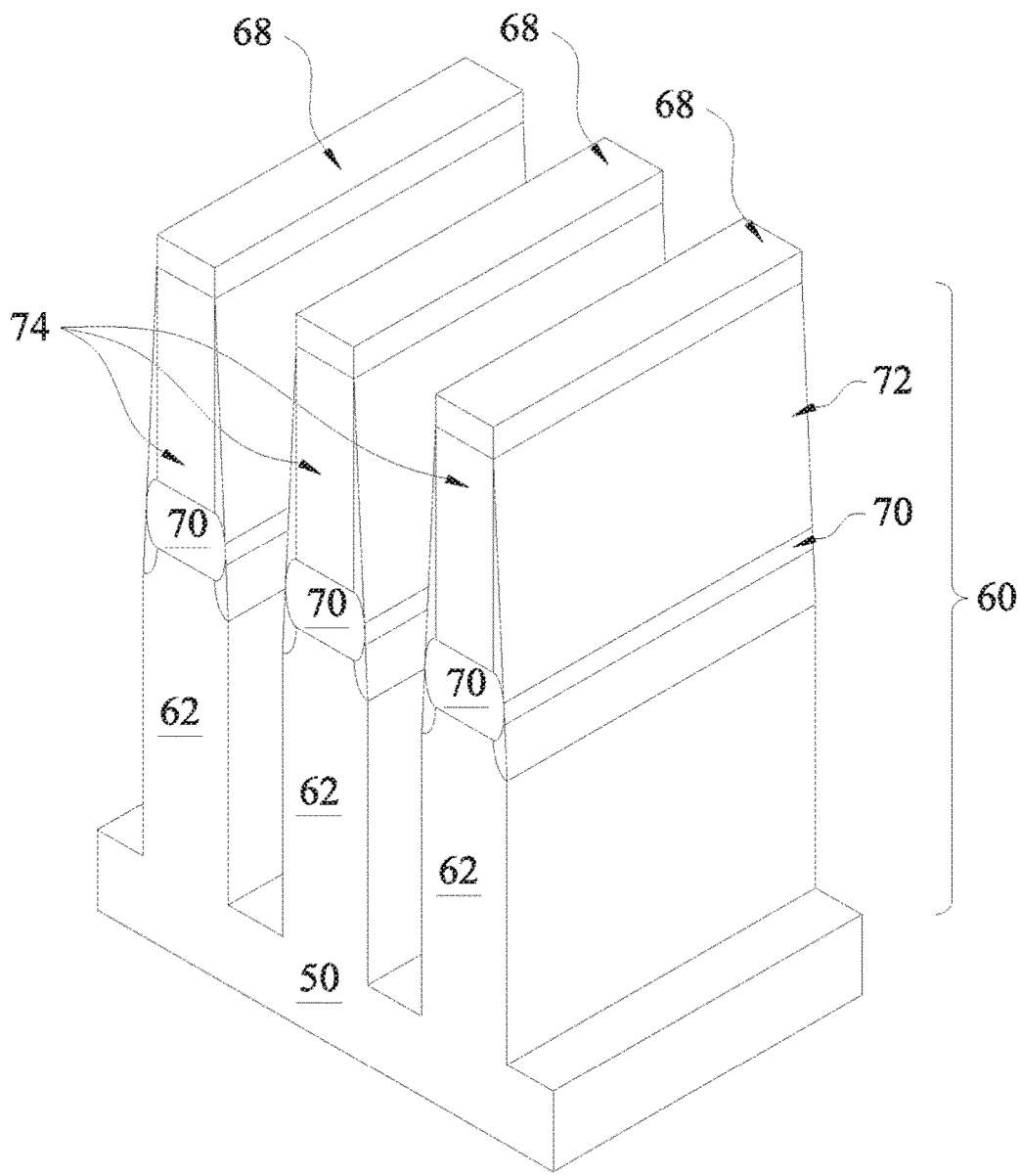
Figure 5B:
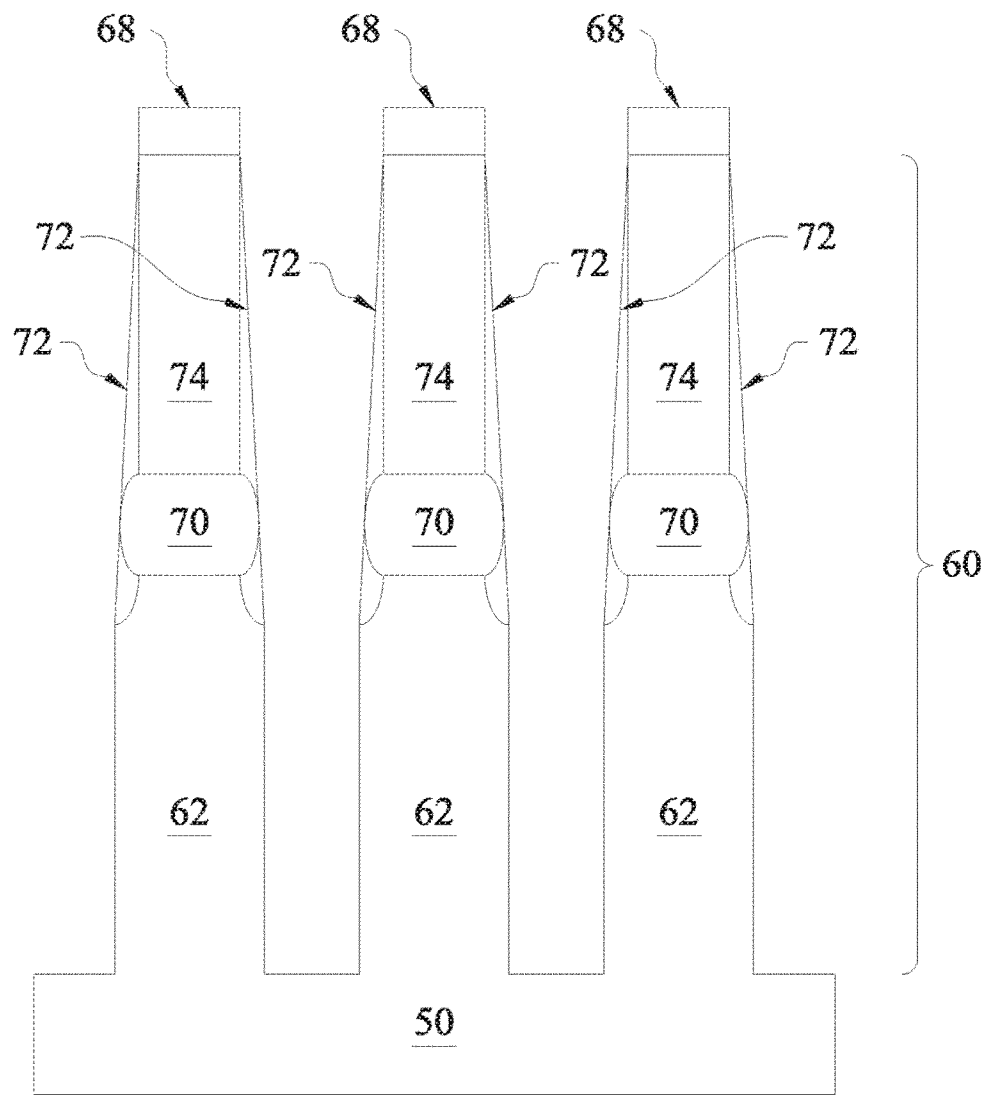
Figure 6A:
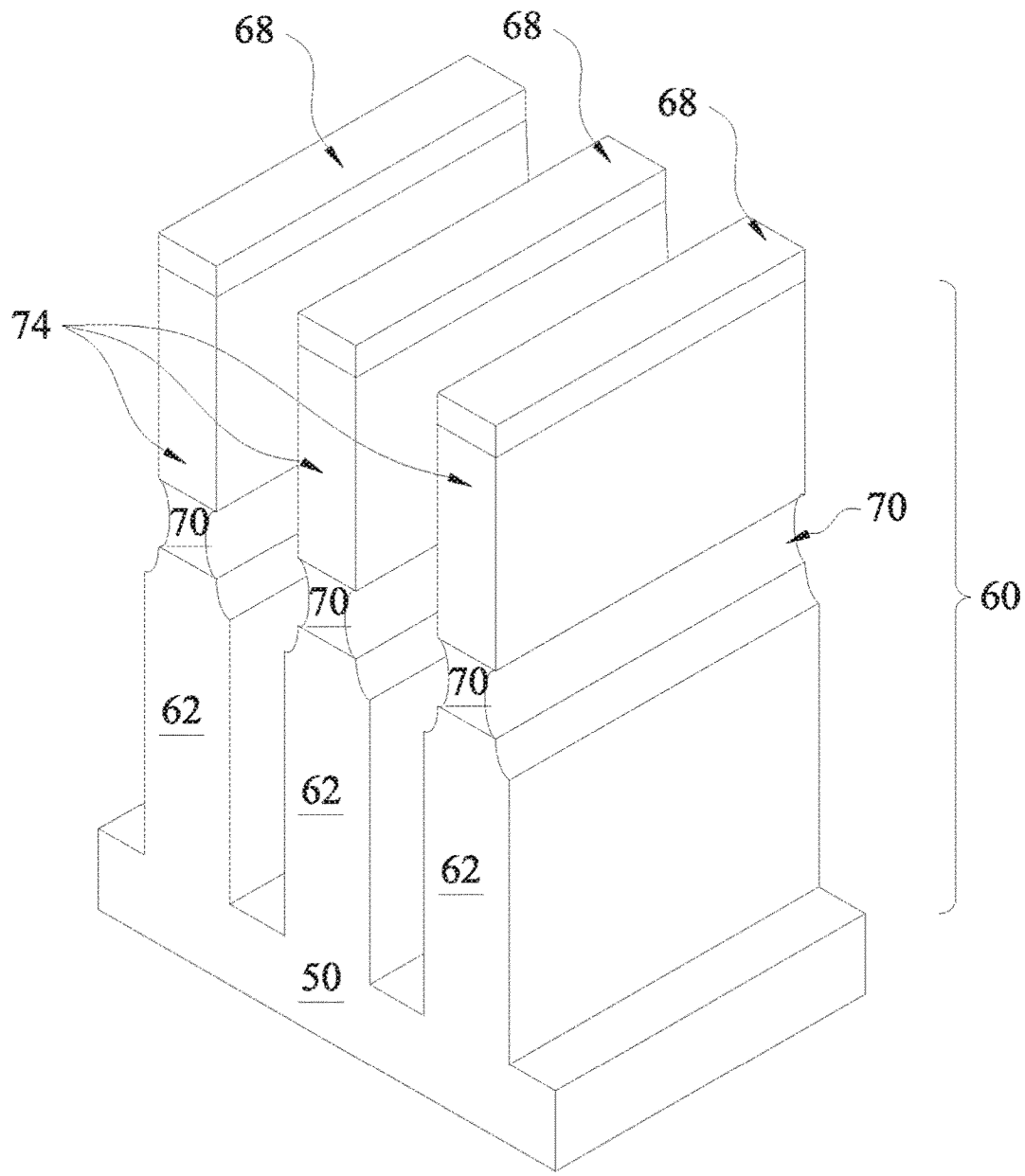
Figure 7A:
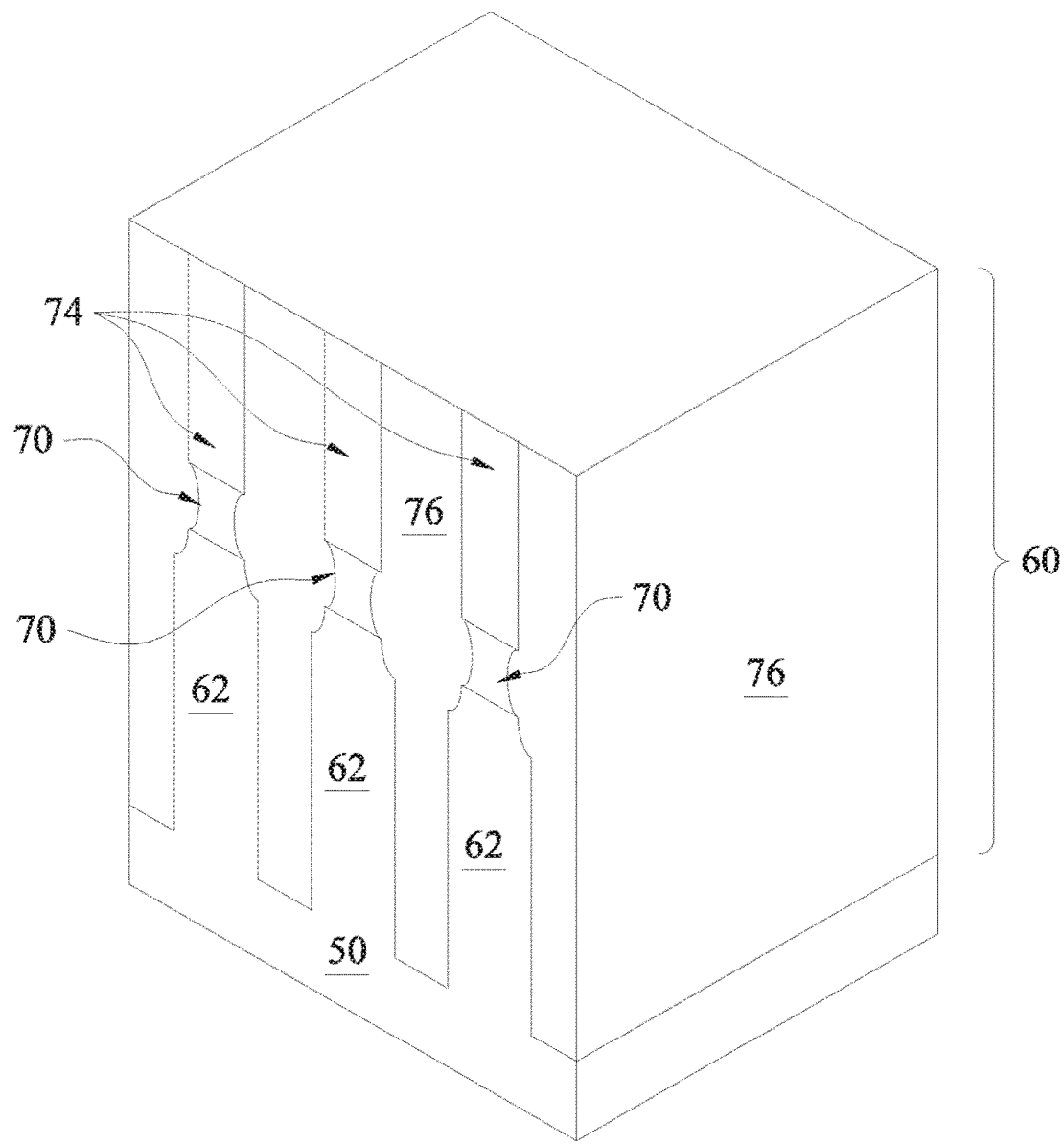
Figure 7B:
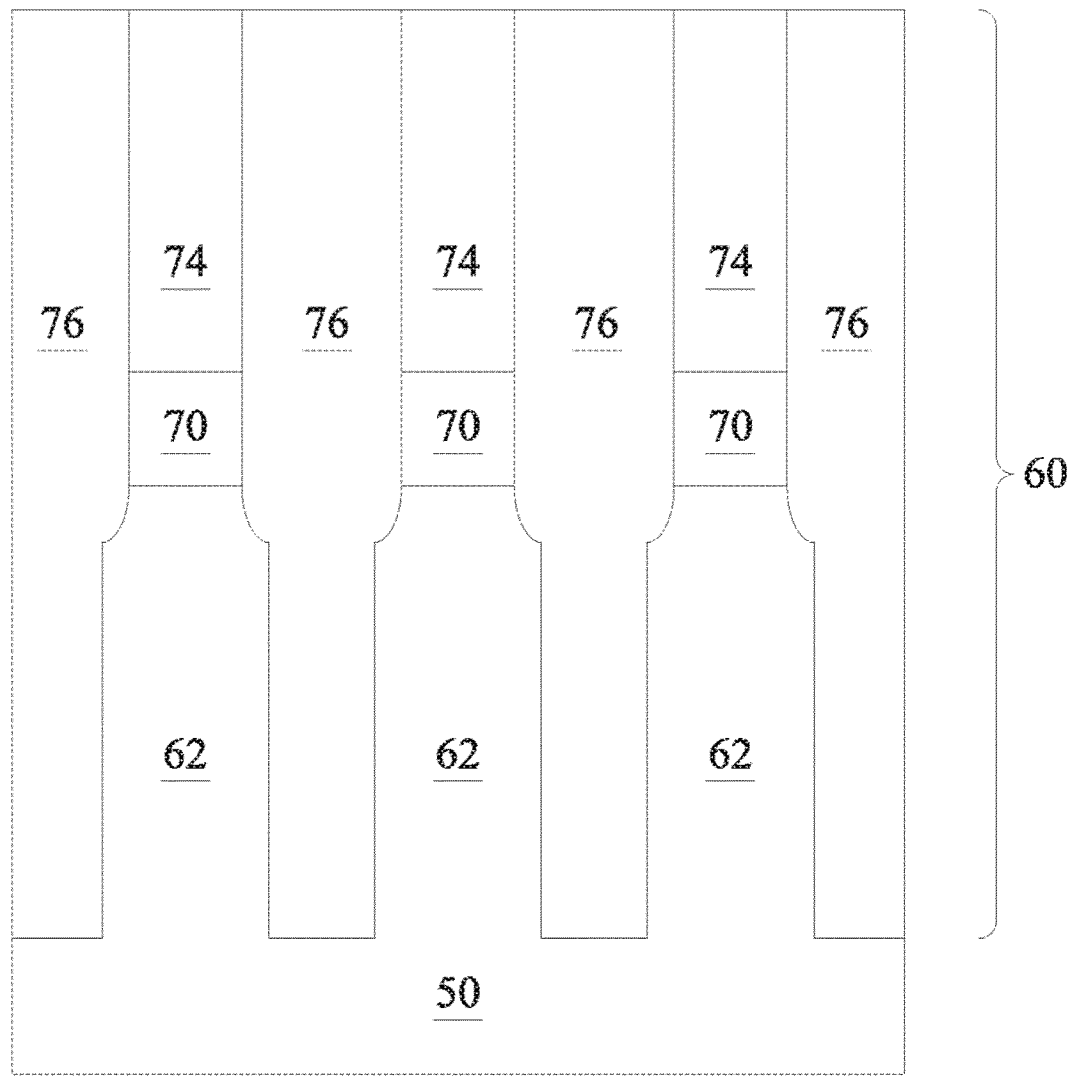
Figure 8A:
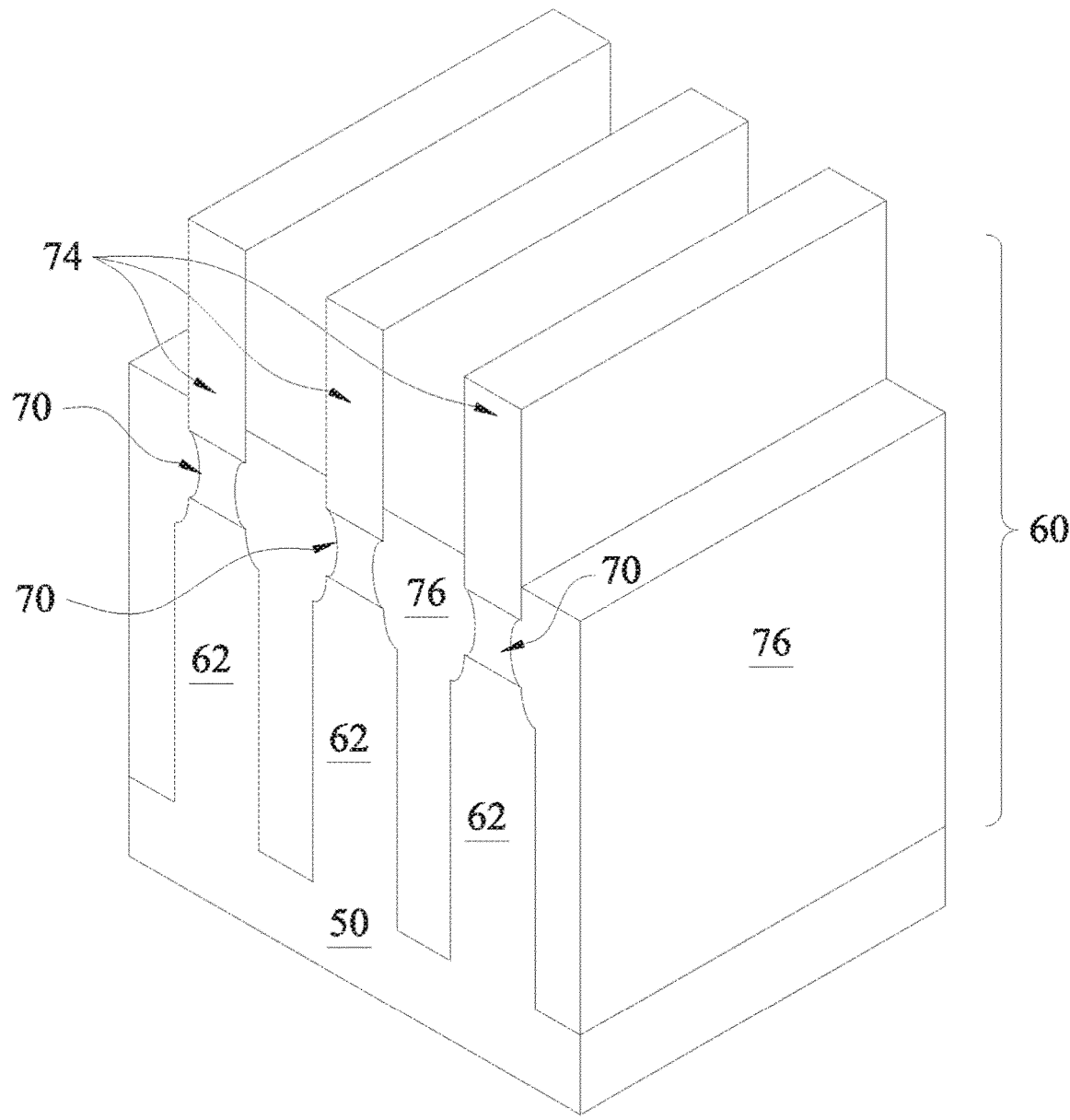
Figure 8B:
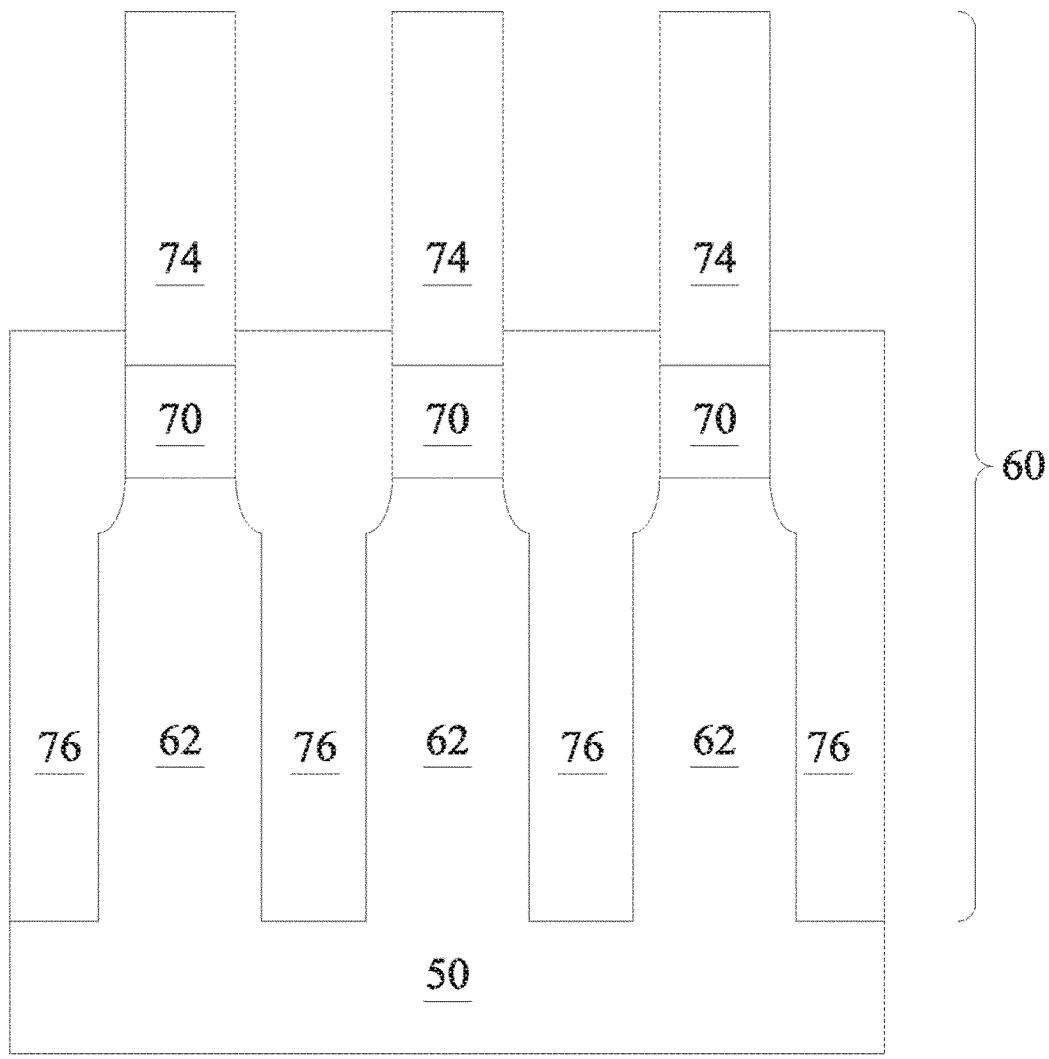
Figure 9A:
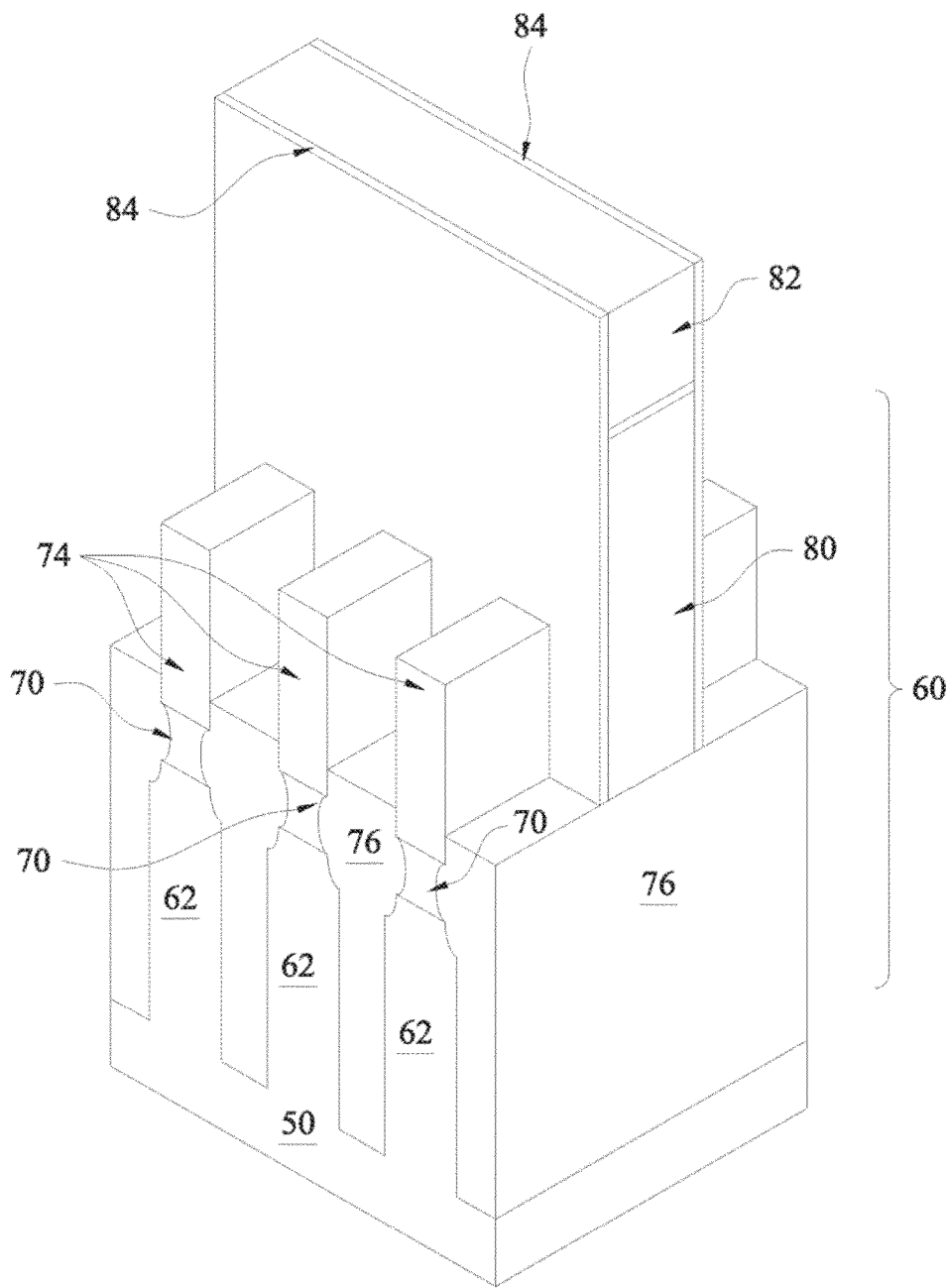
Figure 9B:
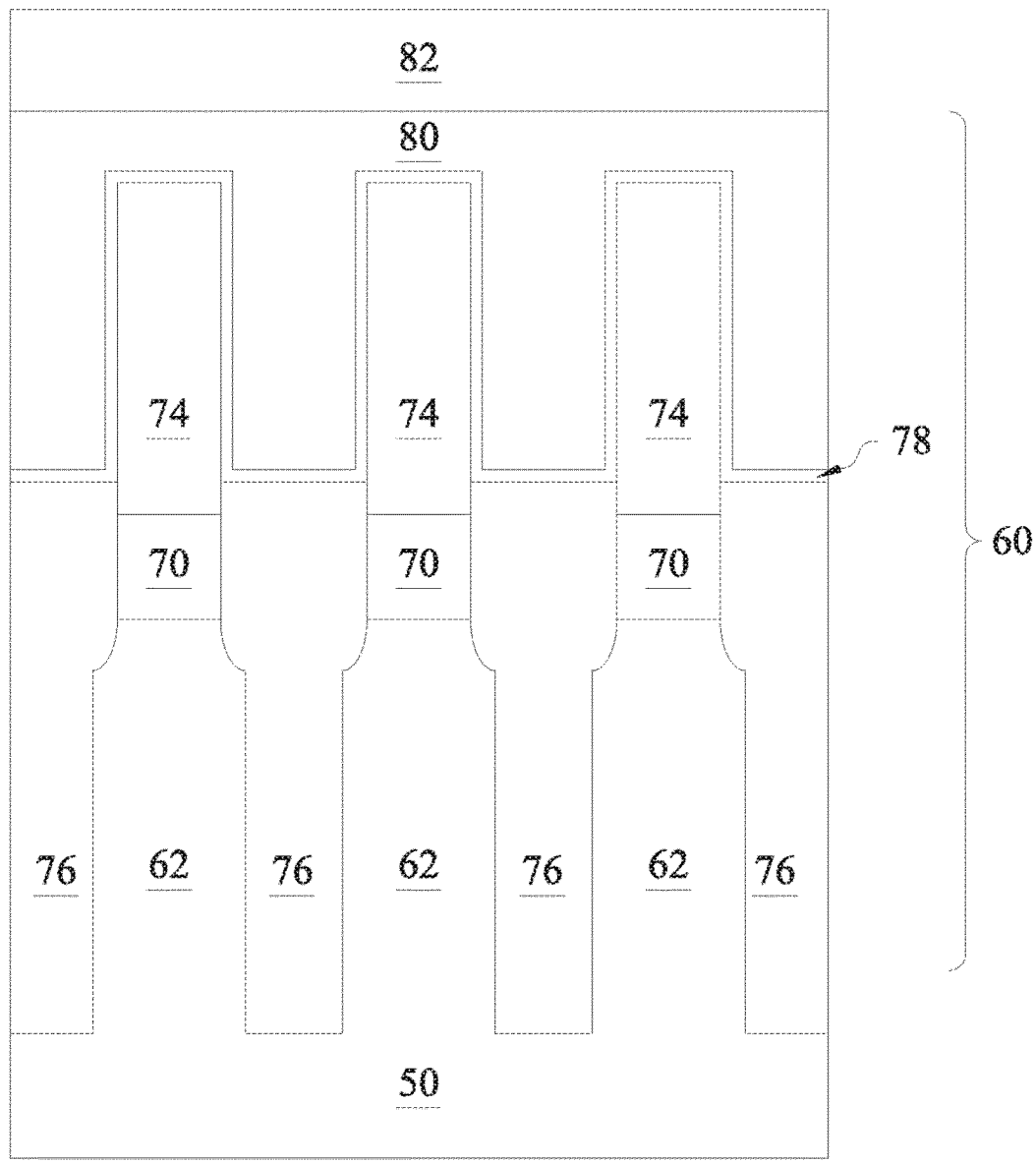

FIGS. 25 through 27 are TEM images of samples in accordance with embodiments of FIGS. 23 and 24. FIGS. 25 through 27 are along a similar cross-section B-B in FIG. 1. FIG. 25 illustrates a patterned substrate portion 62, a SiGe dielectric region 70, a semiconductor fin 74, and an isolation region 76

Similarly, FIGS. 26 and 27 are TEM images of samples that highlight the location of the concentrations of the Ge residue and Si, respectively. FIGS. 26 and 27 illustrate a patterned substrate portion 62, a SiGe dielectric region 70, a semiconductor fin 74, an isolation region 76, and Ge residue regions 100A.

Embodiments may achieve advantages. For example, the present disclosure is a semiconductor device and method of forming the same to provide a simple and cost-effective process flow to achieve an undoped channel in a FinFET for device enhancement. In addition, this simple and cost-effective process flow may achieve a channel on insulator scheme (sometimes referred to as a channel on oxide). In particular, embodiments such as those disclosed below include a directional oxidation step of the fins to allow the fins to have sidewalls that are more perpendicular to the major surface of the substrate to achieve device performance and control enhancement. In addition, the present disclosure controls the amount of germanium residue in the insulating layer below the channel. This control of the germanium residue may increase the reliability of the FinFET device as the residual germanium can diffuse into the gate structure which may reduce the reliability of the FinFET device. Further, the epitaxial portions of the fins are epitaxially grown as blanket layers which have fewer defects and are generally a higher quality semiconductor structure than structures epitaxially grown in trenches/recesses.

An embodiment is a method including forming a fin on a substrate. The fin includes a first crystalline semiconductor material on a substrate and a second crystalline semiconductor material above the first crystalline semiconductor material. The method further includes converting at least a portion of the first crystalline semiconductor material and second crystalline semiconductor material in the fin to a dielectric material and removing at least a portion of the dielectric material. The method further includes forming a gate structure over the fin and forming source/drain regions on opposing sides of the gate structure.

Another embodiment is a method including epitaxially growing a first crystalline semiconductor material on a substrate, epitaxially growing a second crystalline semiconductor material above the first crystalline semiconductor material, and patterning the first crystalline semiconductor material and the second crystalline semiconductor material to form a fin on the substrate. The method further includes forming isolation regions on the substrate and surrounding at least lower portions of the fin and oxidizing at least a portion of the first crystalline semiconductor material and second crystalline semiconductor material in the fin to form an oxide material. The method further includes removing at least a portion of the oxide material, forming a gate structure over the fin and the isolation regions, and forming source/drain regions on opposing sides of the gate structure.

A further embodiment is a structure including a fin on a substrate, the fin comprising a first epitaxial portion. The first epitaxial portion including a first concentrated region of a first material. The structure further includes isolation regions in the substrate and on opposing sides of the fin, at least the first epitaxial portion of the fin protruding from between the isolation regions. A dielectric region is directly underlying the first epitaxial portion, the dielectric region having a different material composition than the isolation regions. The first concentrated region of the first material is at an interface of the first epitaxial portion and the dielectric region. A gate structure is along sidewalls and over an upper surface of the fin, the gate structure defining a channel region in the first epitaxial portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin on a substrate comprising a first crystalline semiconductor material on a substrate and a second crystalline semiconductor material above the first crystalline semiconductor material;
   converting at least a portion of the first crystalline semiconductor material and second crystalline semiconductor material in the fin to a dielectric material;
   removing at least a portion of the dielectric material;
   forming a gate structure over the fin; and
   forming source/drain regions on opposing sides of the gate structure.

2. The method of claim 1, wherein the converting comprises using an oxidation process.

3. The method of claim 1, wherein first crystalline semiconductor material is silicon, the second crystalline semiconductor material is silicon germanium, and dielectric material is silicon germanium oxide.

4. The method of claim 1, wherein the converting step forms concentrated regions of a first semiconductor material, at least some of the concentrated regions of the first semiconductor material being within the second crystalline semiconductor material.

5. The method of claim 1, wherein the forming source/drain regions on opposing sides of the gate structure further comprises:
   etching the second crystalline semiconductor material and the first crystalline semiconductor material outside of the gate structure; and
   epitaxially growing a third crystalline semiconductor material on the substrate.

6. The method of claim 2, wherein the oxidation process is a directional oxidation process.

7. The method of claim 2, wherein the portion of the second crystalline semiconductor material converted to dielectric material increases in thickness moving from a top surface of the second crystalline semiconductor material towards a bottom surface of the second crystalline semiconductor material.

8. The method of claim 4, wherein at least some of the concentrated regions of the first semiconductor material are surrounded by the dielectric material.

9. The method of claim 4, wherein the first semiconductor material is germanium.

10. The method of claim 8 further comprising:
    performing a low pressure anneal process to remove the concentrated regions of the first semiconductor material that are surrounded by the dielectric material.

11. A method comprising:
    epitaxially growing a first crystalline semiconductor material on a substrate;
    epitaxially growing a second crystalline semiconductor material above the first crystalline semiconductor material;
    patterning the first crystalline semiconductor material and the second crystalline semiconductor material to form a fin on the substrate;
    oxidizing at least a portion of the first crystalline semiconductor material and second crystalline semiconductor material in the fin to form an oxide material;
    removing at least a portion of the oxide material;
    forming isolation regions on the substrate and surrounding at least lower portions of the fin;
    forming a gate structure over the fin and the isolation regions; and
    forming source/drain regions on opposing sides of the gate structure.

12. The method of claim 11, wherein the first crystalline semiconductor material is epitaxially grown as a first blanket layer on the substrate, and the second crystalline semiconductor material is epitaxially grown as a second blanket layer on the first blanket layer, the first blanket layer and the second blanket layer being etched to form the fin.

13. The method of claim 11, wherein oxide material is on sidewalls of the second crystalline semiconductor material, the oxide material on sidewalls of the second crystalline semiconductor material increases in thickness moving from a top surface of the second crystalline semiconductor material towards a bottom surface of the second crystalline semiconductor material.

14. The method of claim 11, wherein first crystalline semiconductor material is silicon, the second crystalline semiconductor material is silicon germanium, and oxide material in the first crystalline semiconductor material is silicon germanium oxide.

15. The method of claim 11 further comprising:
   after the forming source/drain regions, forming an interlayer dielectric over the source/drain regions;
   removing the gate structure forming a recess in the interlayer dielectric;
   forming an active gate structure in the recess of the interlayer dielectric; and
   forming contacts through the interlayer dielectric to contact the source/drain regions.

16. The method of claim 11, wherein the forming source/drain regions on opposing sides of the gate structure further comprises:
   recessing the second crystalline semiconductor material and the first crystalline semiconductor material of the fin outside of the gate structure to have a top surface below a top surface of the isolation regions;
   epitaxially growing a third crystalline semiconductor material on the recessed top surface of the fin; and
   doping the third crystalline semiconductor material with impurities.

17. The method of claim 11, wherein the oxidizing step forms concentrated regions of germanium in at least the second crystalline semiconductor material of the fin.

18. A structure comprising:
   a fin on a substrate, the fin comprising a first epitaxial portion, the first epitaxial portion comprising a first concentrated region of a first material;
   isolation regions in the substrate and on opposing sides of the fin, at least the first epitaxial portion of the fin protruding from between the isolation regions;
   a dielectric region directly underlying the first epitaxial portion, the dielectric region having a different material composition than the isolation regions, the first concentrated region of the first material being at an interface of the first epitaxial portion and the dielectric region;
   a gate structure along sidewalls and over an upper surface of the fin, the gate structure defining a channel region in the first epitaxial portion, the gate structure comprising a gate dielectric along sidewalls, over the upper surface of the fin, and over the dielectric region, and gate material over the gate dielectric; and
   source/drain regions extending laterally from the first epitaxial portion of the fin and extending vertically to above an upper surface of the isolation regions, wherein a lower surface of the source/drain regions is below the upper surface of the isolation regions.

19. The structure of claim 18 further comprising:
   a second concentrated region of the first material, the second concentrated region being surrounded by the dielectric region.

20. The structure of claim 19, wherein the first material is germanium.

* * * * *

UNITED STATES PATENT AND TRADEMARK OFFICE
CERTIFICATE OF CORRECTION

PATENT NO.        : 9,461,110 B1
APPLICATION NO.   : 14/700202
DATED             : October 4, 2016
INVENTOR(S)       : Chih-Hao Wang It is certified that error appears in the above-identified patent and that said Letters Patent is hereby corrected as shown below:

On the Title Page

Under Abstract please insert: --20 Claims, 41 Drawing Sheets--.

In the Drawings

Please replace sheet 1 through 19 with the attached sheets 1 through 41.

Signed and Sealed this
Thirty-first Day of July, 2018

Andrei Iancu
*Director of the United States Patent and Trademark Office*

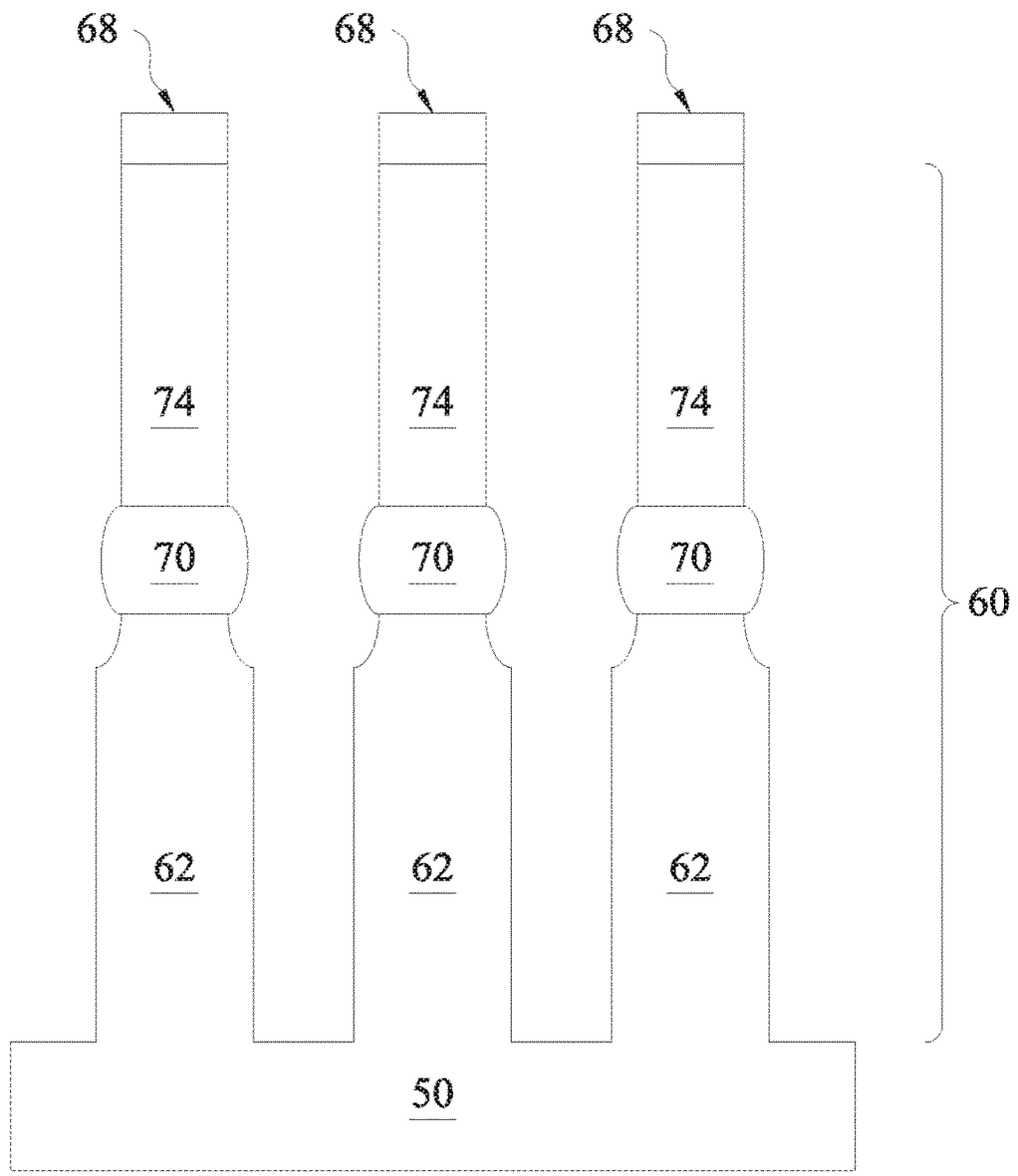
Figure 6B1

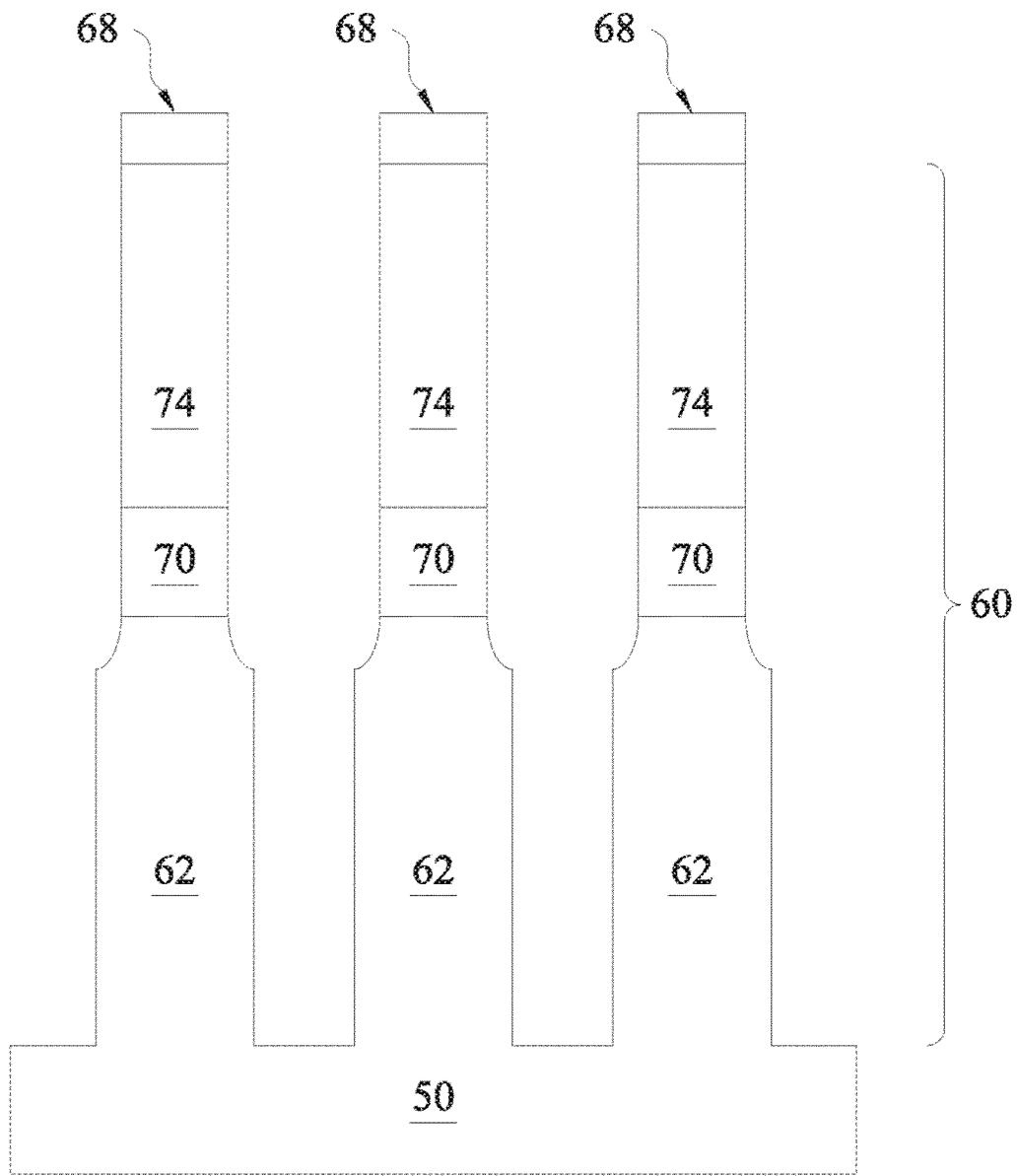
Figure 6B2